(12) United States Patent
Pflumm et al.

(10) Patent No.: US 8,679,647 B2
(45) Date of Patent: Mar. 25, 2014

(54) ORGANIC ELECTROLUMINESCENT DEVICE COMPRISING TRIAZINE DERIVATIVES

(75) Inventors: Christof Pflumm, Frankfurt (DE); Simone Leu, Dittelsheim-Hessloch (DE); Joachim Kaiser, Darmstadt (DE); Amir Hossain Parham, Frankfurt (DE); Frank Voges, Bad Duerkheim (DE); Jonas Valentin Kroeber, Frankfurt (DE); Arne Buesing, Frankfurt (DE)

(73) Assignee: Merck Patent GmbH (DE)

( * ) Notice: Subject to any disclaimer, the term of this patent is extended or adjusted under 35 U.S.C. 154(b) by 514 days.

(21) Appl. No.: 13/001,266

(22) PCT Filed: Nov. 26, 2009

(86) PCT No.: PCT/EP2009/008441
§ 371 (c)(1),
(2), (4) Date: Dec. 23, 2010

(87) PCT Pub. No.: WO2010/072300
PCT Pub. Date: Jul. 1, 2010

(65) Prior Publication Data
US 2011/0095282 A1    Apr. 28, 2011

(30) Foreign Application Priority Data

Dec. 22, 2008    (DE) .......................... 10 2008 064 200

(51) Int. Cl.
*H01L 51/54*    (2006.01)

(52) U.S. Cl.
USPC ........... 428/690; 428/917; 313/504; 313/505; 313/506; 257/40; 257/E51.05; 257/E51.026; 257/E51.032; 546/18; 546/79; 546/81; 546/101; 544/234; 548/418; 548/440

(58) Field of Classification Search
USPC ................. 428/690, 917; 313/504, 505, 506; 257/40, E51.05, E51.026, E51.032; 546/18, 79, 81, 101; 544/234; 548/440, 548/418

See application file for complete search history.

(56) References Cited

U.S. PATENT DOCUMENTS

| 4,539,507 | A | 9/1985 | VanSlyke et al. |
| 5,151,629 | A | 9/1992 | VanSlyke |
| 5,840,217 | A | 11/1998 | Lupo et al. |
| 6,225,467 | B1 * | 5/2001 | Esteghamatian et al. ..... 544/180 |
| 6,229,012 | B1 | 5/2001 | Hu et al. |
| 6,458,909 | B1 | 10/2002 | Spreitzer et al. |
| 7,701,131 | B2 | 4/2010 | Gerhard et al. |
| 2006/0063027 | A1 | 3/2006 | Vestweber et al. |
| 2007/0051944 | A1 * | 3/2007 | Vestweber et al. .............. 257/40 |
| 2010/0187505 | A1 | 7/2010 | Stoessel et al. |

FOREIGN PATENT DOCUMENTS

| DE | 102008036982 A1 | 2/2010 |
| EP | 676461 A2 | 10/1995 |
| EP | 1144543 A1 | 10/2001 |
| WO | WO-98/27136 A1 | 6/1998 |
| WO | WO-03/060956 A2 | 7/2003 |
| WO | WO-2004/058911 A2 | 7/2004 |
| WO | WO-2005/011013 A1 | 2/2005 |
| WO | WO-2005/053055 A1 | 6/2005 |
| WO | WO-2007/050301 A2 | 5/2007 |
| WO | WO-2007/050334 A1 | 5/2007 |
| WO | WO-2008/145239 A2 | 12/2008 |
| WO | WO-2010/015306 A1 | 2/2010 |

OTHER PUBLICATIONS

Chen et al., 1,3,5 Triazine Derivatives as new electron transport-type host materials for highly efficient green phosphorescent OLEDs, 2009, Journal of Materials Chemistry, vol. 19, pp. 8112-8118.*

* cited by examiner

*Primary Examiner* — Gregory Clark
(74) *Attorney, Agent, or Firm* — Novak Druce Connolly Bove + Quigg LLP

(57) ABSTRACT

The invention relates to organic electroluminescent devices which comprise triazine derivatives as the electron transport material.

20 Claims, 1 Drawing Sheet a)
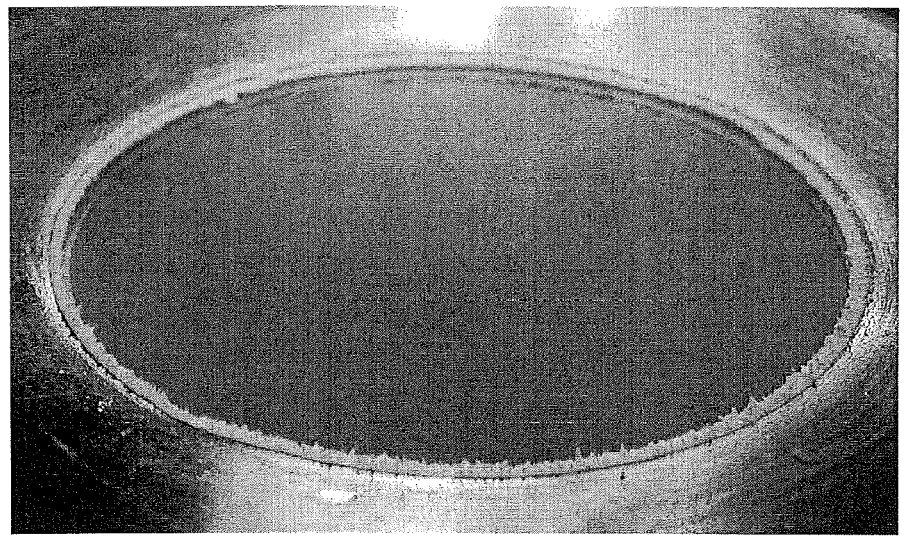
b)
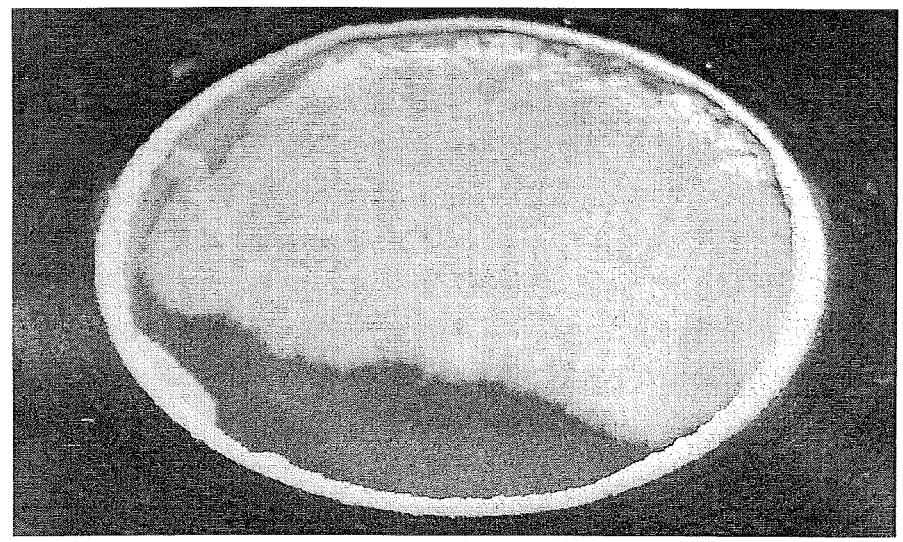

ORGANIC ELECTROLUMINESCENT DEVICE COMPRISING TRIAZINE DERIVATIVES

CROSS-REFERENCE TO RELATED APPLICATIONS

This application is a national stage application (under 35 U.S.C. §371) of PCT/EP2009/008441, filed Nov. 26, 2009, which claims benefit of German application 10 2008 064 200.2, filed Dec. 22, 2008.

BACKGROUND OF THE INVENTION

The present invention relates to organic electroluminescent devices which comprise triazine derivatives as electron-transport materials.

The structure of organic electroluminescent devices (OLEDs) in which organic semiconductors are employed as functional materials is described, for example, in U.S. Pat. Nos. 4,539,507, 5,151,629, EP 0676461 and WO 98/27136. However, further improvements are still desirable. Thus, there is still a need for improvement, in particular, with respect to the lifetime, the efficiency and the operating voltage of organic electroluminescent devices. It is furthermore necessary for the compounds to have high thermal stability and a high glass-transition temperature and to be sublimable without decomposition.

Improvements in the properties are still desirable, in particular, in the case of the electron-transport materials since it is precisely also the properties of the electron-transport material that have an essential influence on the above-mentioned properties of the organic electroluminescent device. In particular, there is a need for improvement in electron-transport materials which simultaneously result in good efficiency, a long lifetime and a low operating voltage. In particular, the properties of the electron-transport material are also frequently limiting for the lifetime, the efficiency and the operating voltage of the organic electroluminescent device.

It would be desirable here to have available electron-transport materials which result in better electron injection into the emitting layer, since an electron-richer emission layer results in better efficiency. In addition, better injection can reduce the operating voltage. Further improvements in the electron-transport material are therefore necessary for this purpose.

There is furthermore generally still a need for improvement in the processability of the materials, since many materials used in organic electro-luminescent devices in accordance with the prior art tend to crystallise on the vapour-deposition source in the process for the production of the electroluminescent device and thus block the vapour-deposition source. These materials can therefore only be employed with increased technical complexity in mass production.

Electroluminescent devices which use $AlQ_3$ as electron conductor have already been known for some time and were already described in 1993 in U.S. Pat. No. 4,539,507. $AlQ_3$ has since then frequently been used as electron-transport material, but has a number of disadvantages: it cannot be vapour-deposited without leaving a residue, since it partially decomposes at the sublimation temperature, which represents a major problem, in particular, for production plants. This has the consequence that the vapour-deposition sources have to be continually cleaned or exchanged. Furthermore, $AlQ_3$ decomposition products enter the OLED, where they contribute to a shortened lifetime and reduced quantum and power efficiency. In addition, $AlQ_3$ has low electron mobility, which results in higher voltages and thus in lower power efficiency. In order to avoid short circuits in the display, it would be desirable to increase the layer thickness; this is not possible with $AlQ_3$ owing to the low charge-carrier mobility and the resultant increase in voltage. The charge-carrier mobility of other electron conductors (U.S. Pat. No. 4,539,507) is likewise too low to build up thicker layers therewith, where the lifetime of the OLED is even worse than on use of $AlQ_3$. The inherent colour (yellow in the solid) of $AlQ_3$, which can result in colour shifts due to reabsorption and weak re-emission, especially in the case of blue OLEDs, also proves unfavourable. It is only possible to produce blue OLEDs here with considerable losses in efficiency and colour location.

Thus, there continues to be a demand for electron-transport materials which result in good efficiencies and simultaneously in long lifetimes in organic electroluminescent devices. Surprisingly, it has now been found that organic electroluminescent devices which comprise certain triazine derivatives—indicated below—as electron-transport materials have significant improvements over the prior art. By means of these materials, it is possible simultaneously to obtain high efficiencies and long lifetimes, which is not possible using materials in accordance with the prior art. In addition, it has been found that, in addition, the operating voltages can be significantly reduced, which results in higher power efficiencies.

It has furthermore been found that organic electronic devices which comprise triazine derivatives as electron-transport materials in combination with an organic alkali-metal compound have significant improvements over the prior art. Using this material combination, high efficiencies and long lifetimes are achieved simultaneously, and the operating voltages are reduced.

U.S. Pat. Nos. 6,229,012 and 6,225,467 disclose the use of fluorene and biphenyl derivatives which are substituted by triazine groups as electron-transport material in OLEDs. However, the patents do not reveal that, in particular, materials which contain a spirobifluorene group instead of the fluorene group offer significant advantages over the materials disclosed in the above-mentioned patents.

WO 05/053055 discloses the use of triazine derivatives, in particular spirobifluorene derivatives which are substituted by triazine groups, as hole-blocking material in a hole-blocking layer in phosphorescent OLEDs. However, the application does not reveal that these materials are also suitable as electron-transport materials for fluorescent electroluminescent devices.

BRIEF SUMMARY OF THE INVENTION

The invention thus relates to an organic electroluminescent device comprising an anode, a cathode and at least one emitting layer which comprises at least one fluorescent emitter, or at least one emitting layer which comprises at least one phosphorescent emitter and which is employed in combination with a following hole-blocking layer, characterised in that an electron-transport layer which comprises at least one compound of the formula (1) or formula (2):

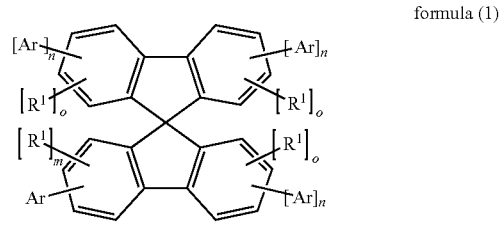

formula (1)

formula (2)

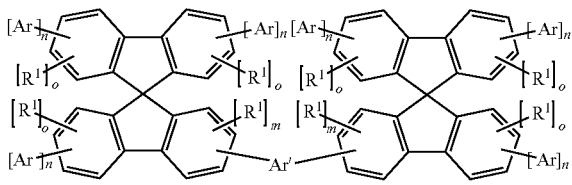

where the following applies to the symbols and indices used:
Ar is a group of the following formula (3):

formula (3)

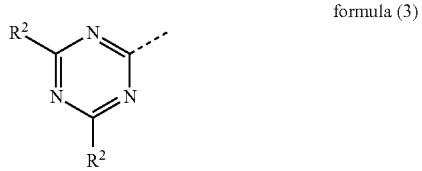

where the dashed bond indicates the bond to the spirobifluorene;
$Ar^1$ is a group of the following formula (4):

formula (4)

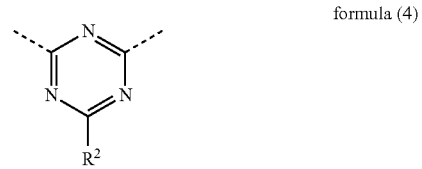

where the dashed bonds indicate the bonds to the spirobifluorene;
$R^1, R^2$ are on each occurrence, identically or differently, H, D, F, Cl, Br, I, CHO, $N(R^3)_2$, $N(Ar^1)_2$, $B(Ar^1)_2$, $C(=O)Ar^1$, $P(=O)(Ar^1)_2$, $S(=O)Ar^1$, $S(=O)_2Ar^1$, $CR^3=CR^3Ar^1$, CN, $NO_2$, $Si(R^3)_3$, $B(OR^3)_2$, $B(R^3)_2$, $B(N(R^3)_2)_2$, $OSO_2R^3$, a straight-chain alkyl, alkenyl, alkynyl, alkoxy or thioalkoxy group having 1 to 40 C atoms or a branched or cyclic alkyl, alkenyl, alkynyl, alkoxy or thioalkoxy group having 3 to 40 C atoms, each of which may be substituted by one or more radicals $R^3$, where one or more non-adjacent $CH_2$ groups may be replaced by $R^3C=CR^3$, C≡C, $Si(R^3)_2$, $Ge(R^3)_2$, $Sn(R^3)_2$, C=O, C=S, C=Se, C=NR$^3$, $P(=O)(R^3)$, SO, $SO_2$, $NR^3$, O, S or $CONR^3$ and where one or more H atoms may be replaced by D, F, Cl, Br, I, CN or $NO_2$, or an aromatic or hetero-aromatic ring system having 5 to 60 aromatic ring atoms, which may in each case be substituted by one or more radicals $R^3$, or an aryloxy or heteroaryloxy group having 5 to 60 aromatic ring atoms, which may be substituted by one or more radicals $R^3$, or a combination of these systems; two or more adjacent substituents $R^1$ here may also form a mono- or polycyclic, aliphatic or aromatic ring system with one another;
$Ar^1$ is on each occurrence, identically or differently, an aromatic or heteroaromatic ring system having 5 to 30 aromatic ring atoms, which may be substituted by one or more radicals $R^3$; two radicals $Ar^1$ here which are bonded to the same nitrogen, phosphorus or boron atom may also be linked to one another by a single bond or a bridge selected from $B(R^3)$, $C(R^3)_2$, $Si(R^3)_2$, C=O, C=NR$^3$, $C=C(R^3)_2$, O, S, S=O, $SO_2$, $N(R^3)$, $P(R^3)$ and $P(=O)R^3$;
$R^3$ is on each occurrence, identically or differently, H, D or an aliphatic, aromatic and/or heteroaromatic hydrocarbon radical having 1 to 20 C atoms, in which, in addition, H atoms may be replaced by D or F; two or more adjacent substituents $R^3$ here may also form a mono- or polycyclic, aliphatic or aromatic ring system with one another;
n is 0 or 1;
m is 0, 1, 2 or 3;
o is 0, 1, 2, 3 or 4 if n=0 in the same ring and is 0, 1, 2 or 3 if n=1 in the same ring,
is introduced between the emitting layer or the hole-blocking layer and the cathode.

BRIEF DESCRIPTION OF THE FIGURES

FIG. 1a) shows the vapour-deposition source on use of ETM4, after vapour deposition for 1.5 hours at a vapour-deposition rate of about 1 nm/s.
FIG. 1b) shows the vapour-deposition source on use of ETM2, after vapour deposition for 1.5 hours at a vapour-deposition rate of about 1 nm/s in each case.

DETAILED DESCRIPTION OF THE INVENTION

An organic electroluminescent device is taken to mean a device which comprises an anode, a cathode and at least one emitting layer which is arranged between the anode and cathode, where at least one layer between the anode and cathode comprises at least one organic or organo-metallic compound. The electron-transport layer comprises at least one compound of the formula (1) or (2) given above. An organic electroluminescent device does not necessarily have to comprise only layers built up from organic or organometallic materials. Thus, it is also possible for one or more layers to comprise inorganic materials or to be built up entirely from inorganic materials.

For the purposes of this invention, a fluorescent compound is a compound which exhibits luminescence from an excited singlet state at room temperature. For the purposes of this invention, all luminescent compounds which contain no heavy atoms, i.e. no atoms having an atomic number greater than 36, in particular, are to be regarded as fluorescent compounds.

For the purposes of this invention, a phosphorescent compound is a compound which exhibits luminescence from an excited state having relatively high spin multiplicity, i.e. a spin multiplicity >1, in particular from an excited triplet state, at room temperature. For the purposes of this invention, all luminescent iridium and platinum compounds, in particular, are to be regarded as phosphorescent compounds.

For the purposes of this invention, an aryl group contains at least 6 C atoms; for the purposes of this invention, a heteroaryl group contains at least 2 C atoms and at least 1 heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group.

For the purposes of this invention, a condensed aryl or heteroaryl group is taken to mean an aryl or heteroaryl group in which at least two aromatic or heteroaromatic rings, for example benzene rings, are fused to one another, i.e. are condensed onto one another by anellation, i.e. have at least one common edge and thus also a common aromatic system. Thus, for example, systems such as naphthalene, anthracene, phenanthrene, benzanthracene, pyrene, etc., are to be regarded as condensed aryl groups for the purposes of this invention and quinoline, acridine, benzo-thiophene, carbazole, etc., are to be regarded as condensed heteroaryl groups for the purposes of this invention, while, for example, fluorene, spirobifluorene, etc., are not condensed aryl groups since separate aromatic electron systems are involved here.

For the purposes of this invention, an aromatic ring system contains at least 6 C atoms in the ring system. For the purposes of this invention, a heteroaromatic ring system contains at least 2 C atoms and at least one heteroatom in the ring system, with the proviso that the sum of C atoms and heteroatoms is at least 5. The heteroatoms are preferably selected from N, O and/or S. For the purposes of this invention, an aromatic or heteroaromatic ring system is intended to be taken to mean a system which does not necessarily contain only aryl or heteroaryl groups, but instead in which a plurality of aryl or heteroaryl groups may also be interrupted by a short non-aromatic unit (preferably less than 10% of the atoms other than H), such as, for example, an $sp^3$-hybridised C, N or O atom. Thus, for example, systems such as 9,9'-spirobifluorene, 9,9-diarylfluorene, triarylamine, diaryl ether, stilbene, benzophenone, etc., are also intended to be taken to mean aromatic ring systems for the purposes of this invention. Likewise, an aromatic or heteroaromatic ring system is taken to mean systems in which a plurality of aryl or heteroaryl groups are linked to one another by single bonds, for example biphenyl, terphenyl or bipyridine.

For the purposes of the present invention, a $C_1$- to $C_{40}$-alkyl group, in which, in addition, individual H atoms or $CH_2$ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, tert-pentyl, 2-pentyl, cyclopentyl, n-hexyl, s-hexyl, tert-hexyl, 2-hexyl, 3-hexyl, cyclohexyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, trifluoromethyl, pentafluoroethyl and 2,2,2-trifluoroethyl. An alkenyl group is particularly preferably taken to mean the radicals ethenyl, propenyl, butenyl, pentenyl, cyclopentenyl, hexenyl, cyclohexenyl, heptenyl, cycloheptenyl, octenyl and cyclooctenyl. An alkynyl group is particularly preferably taken to mean the radicals ethynyl, propynyl, butynyl, pentynyl, hexynyl, heptynyl or octynyl. A $C_1$- to $C_{40}$-alkoxy group is particularly preferably taken to mean methoxy, trifluoromethoxy, ethoxy, n-propoxy, i-propoxy, n-butoxy, i-butoxy, s-butoxy, t-butoxy or 2-methylbutoxy. An aromatic or heteroaromatic ring system having 5-60 aromatic ring atoms, which may in each case also be substituted by the above-mentioned radicals R and which may be linked via any desired positions on the aromatic or heteroaromatic ring system, is taken to mean, in particular, groups derived from benzene, naphthalene, anthracene, phenanthrene, benzanthracene, pyrene, chrysene, perylene, fluoranthene, benzofluoranthene, naphthacene, pentacene, benzopyrene, biphenyl, biphenylene, terphenyl, terphenylene, fluorene, benzofluorene, dibenzofluorene, spirobifluorene, dihydrophenanthrene, dihydropyrene, tetrahydropyrene, cis- or trans-indenofluorene, cis- or trans-monobenzo-indenofluorene, cis- or trans-dibenzoindenofluorene, truxene, isotruxene, spirotruxene, spiroisotruxene, furan, benzofuran, isobenzofuran, dibenzo-furan, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-tri-azole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

The compounds of the formulae (1) and (2) preferably have a glass-transition temperature $T_G$ of greater than 70° C., particularly preferably greater than 90° C., very particularly preferably greater than 110° C.

In another preferred embodiment of the invention, the radical $R^2$, which is bonded to the groups of the formula (3) or (4), stands, identically or differently on each occurrence, for H, D, a straight-chain alkyl or alkoxy group having 1 to 10 C atoms or a branched or cyclic alkyl or alkoxy group having 3 to 10 C atoms, each of which may be substituted by one or more radicals $R^3$, where one or more H atoms may be replaced by D or F, or an aromatic or heteroaromatic ring system having 5 to 30 aromatic ring atoms, which may in each case be substituted by one or more radicals $R^3$, or a combination of these systems. In a particularly preferred embodiment of the invention, the radical $R^2$ stands, identically or differently on each occurrence, for an aromatic or heteroaromatic ring system having 5 to 25 aromatic ring atoms, which may in each case be substituted by one or more radicals $R^3$. The radical $R^2$ very particularly preferably stands, identically or differently on each occurrence, for an aromatic or heteroaromatic ring system having 5 to 14 aromatic ring atoms, which may in each case be substituted by one or more radicals $R^3$, in particular for phenyl, naphthyl or ortho-, meta- or para-biphenyl, each of which may be substituted by one or more radicals $R^3$, but is preferably unsubstituted.

In another preferred embodiment of the invention, the radical $R^1$, which is bonded directly to the spirobifluorene, stands, identically or differently on each occurrence, for H, D, a straight-chain alkyl or alkoxy group having 1 to 10 C atoms or a branched or cyclic alkyl or alkoxy group having 3 to 10 C atoms, each of which may be substituted by one or more radicals $R^2$, where one or more H atoms may be replaced by D or F, or an aromatic or heteroaromatic ring system having 5 to 30 aromatic ring atoms, which may in each case be substituted by one or more radicals $R^3$, or a combination of these systems. In a particularly preferred embodiment of the invention, the radical $R^1$ stands, identically or differently on each occurrence, for H, D, a straight-chain alkyl group having 1 to 5 C atoms or a branched or cyclic alkyl group having 3 to 6 C atoms, each of which may be substituted by one or more radicals $R^3$, where one or more H atoms may be replaced by D or F, or for an aromatic or heteroaromatic ring system having 5 to 25 aromatic ring atoms, which may in each case be substituted by one or more radicals $R^3$.

In a further preferred embodiment of the invention, the group Ar is bonded in the 2-position of the spirobifluorene. If more than one group Ar is present, the other groups Ar are preferably bonded in the 7-position and/or in the 2'-position and/or in the 7'-position. Particularly preferred compounds of the formulae (1) and (2) are therefore the compounds of the formulae (5) and (6):

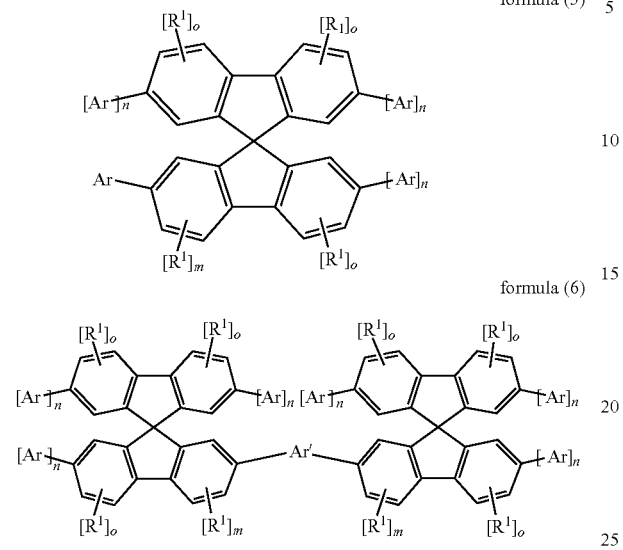

where the symbols and indices have the same meaning as described above and where, for n=0, a substituent $R^1$ may also be bonded in the corresponding position.

In a preferred embodiment of compounds of the formulae (1), (2), (5) and (6), the index m=0, i.e. apart from the group Ar, no further substituent is bonded to this benzene ring.

In a further preferred embodiment of compounds of the formulae (1), (2), (5) and (6), the sum of the indices n+o=0 or 1 on each benzene ring, i.e. a maximum of one group Ar or a maximum of one radical $R^1$ is bonded to each benzene ring. Particularly preferably, o=0.

The compounds of the formula (5) particularly preferably contain one or two triazine groups. The compounds of the formula (5) are thus particularly preferably selected from compounds of the formulae (7), (8) and (9):

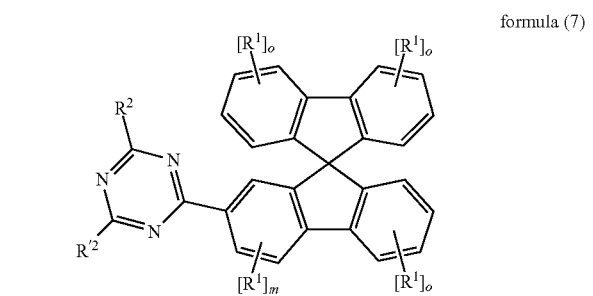

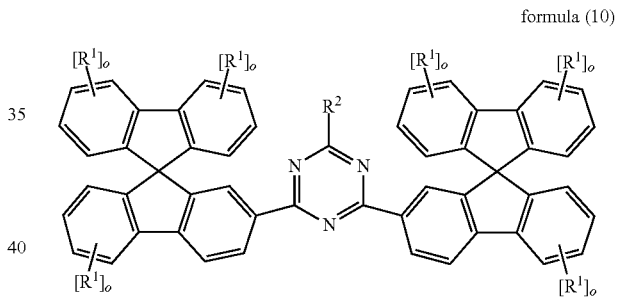

where the symbols used have the meanings given above, and o stands, identically or differently on each occurrence, for 0 or 1, preferably for 0.

The compounds of the formula (6) are preferably selected from the compounds of the formula (10)

formula (10)

[Structure shown]

where the symbols used have the meanings given above, and o stands, identically or differently on each occurrence, for 0 or 1, preferably for 0.

Particular preference is given to the compounds of the formulae (7) to (10) in which $R^2$, which is bonded to the triazine unit, stands, identically or differently on each occurrence, for an aromatic or heteroaromatic ring system having 5 to 25 aromatic ring atoms, in particular for phenyl, 1- or 2-naphthyl, ortho-, meta- or para-biphenyl or 2-spirobifluorenyl. The index o here is very particularly preferably equal to 0.

Examples of preferred compounds of the formulae (1), (2) and (5) to (10) are compounds 1 to 69 depicted below.

1

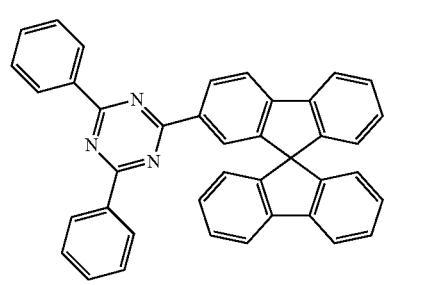

2

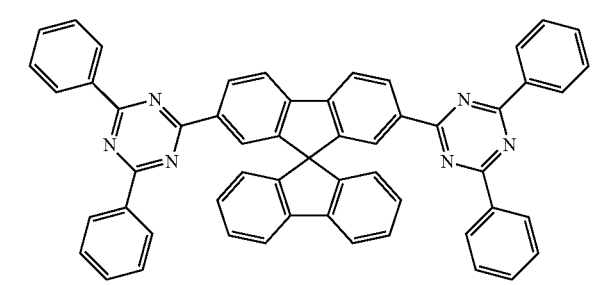

-continued
3
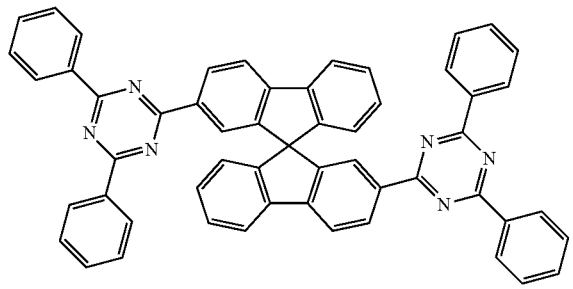
4
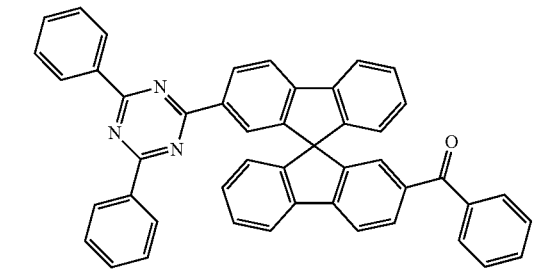
5
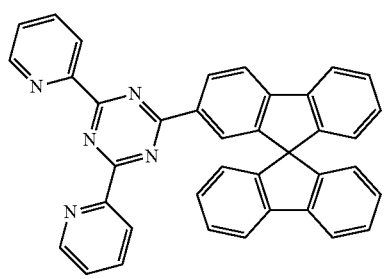
6
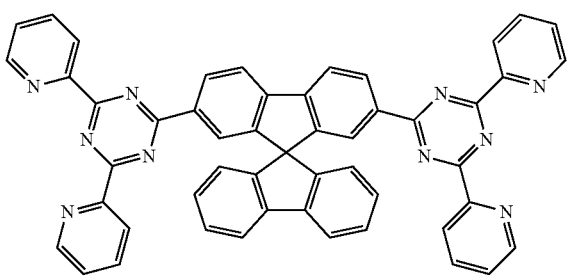
7
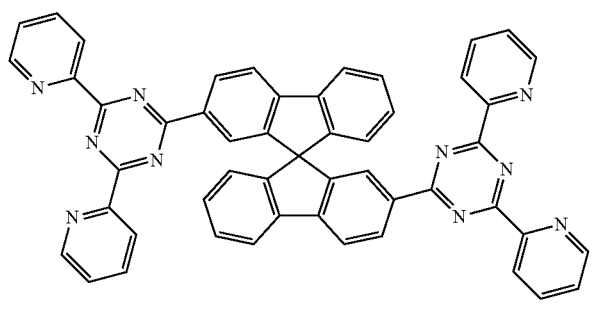
8
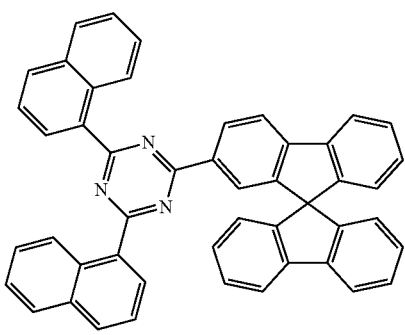
9
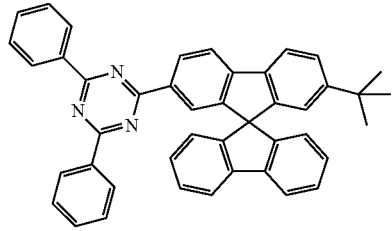
10
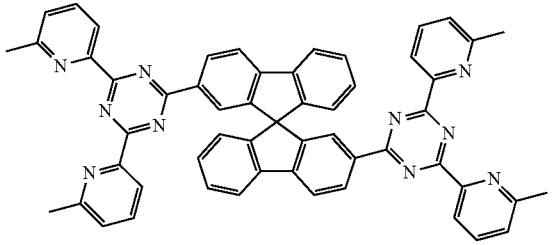
11
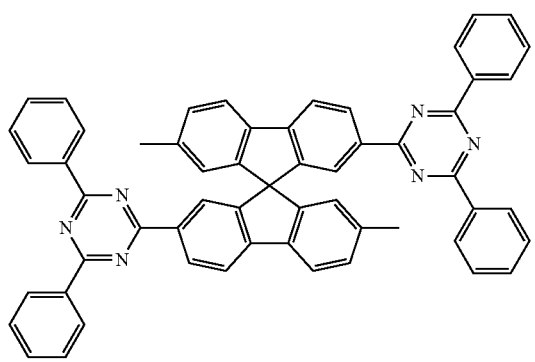
12
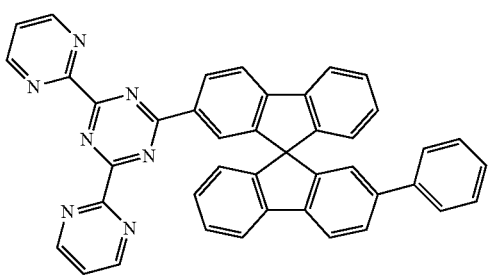

-continued
13
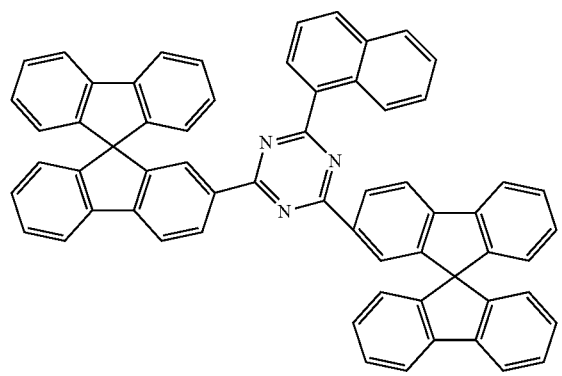
14
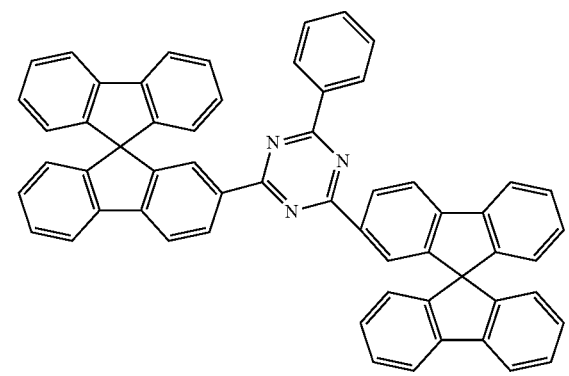
15
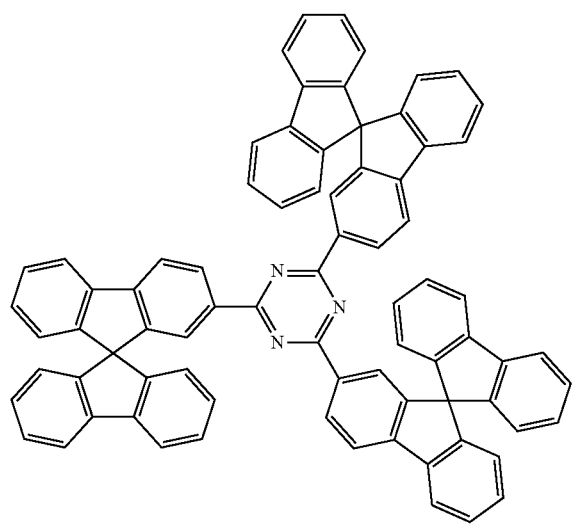
16
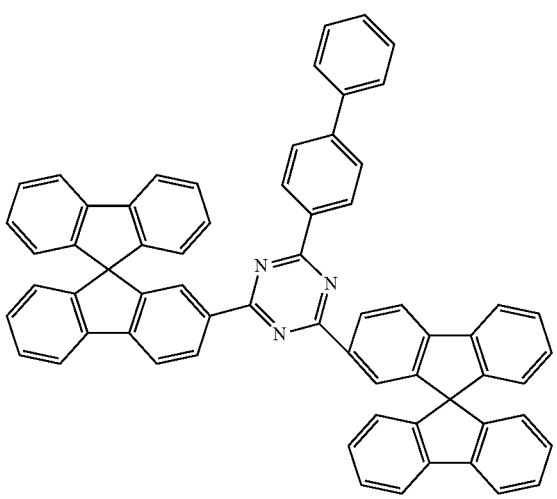
17
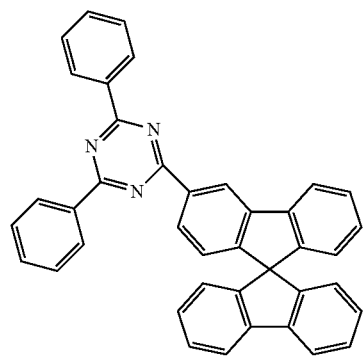
18
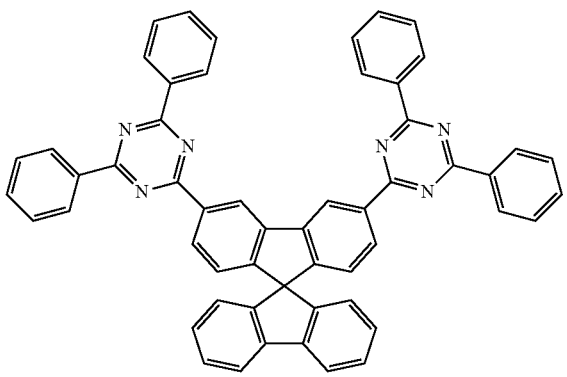

-continued
19
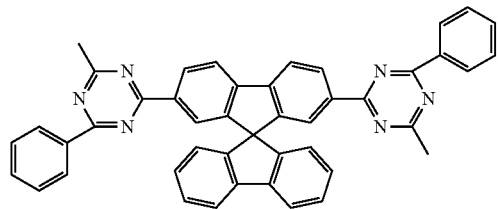
20
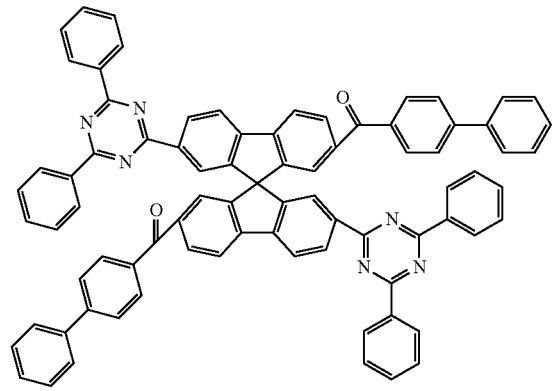
21
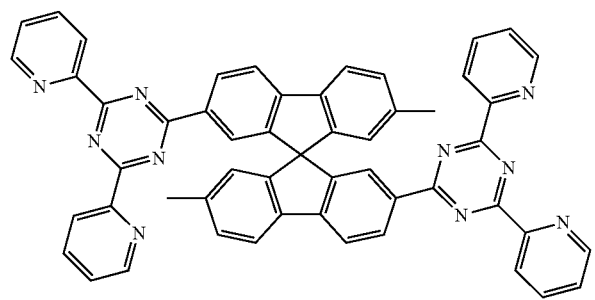
22
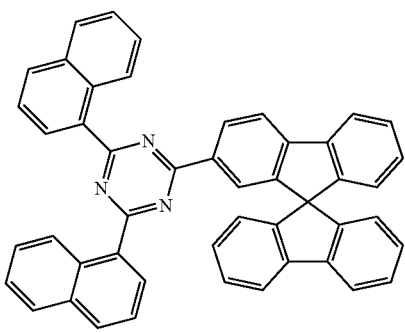
23
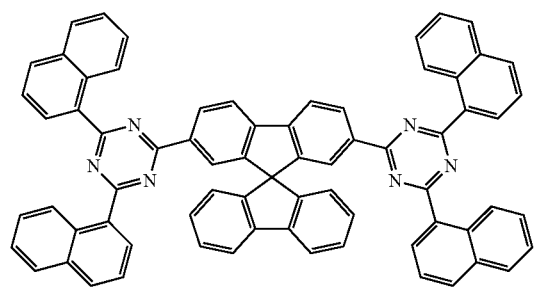
24
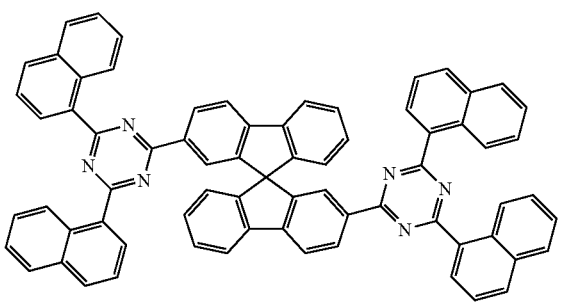
25
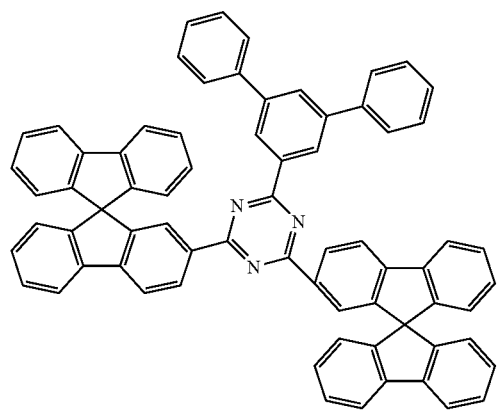
26
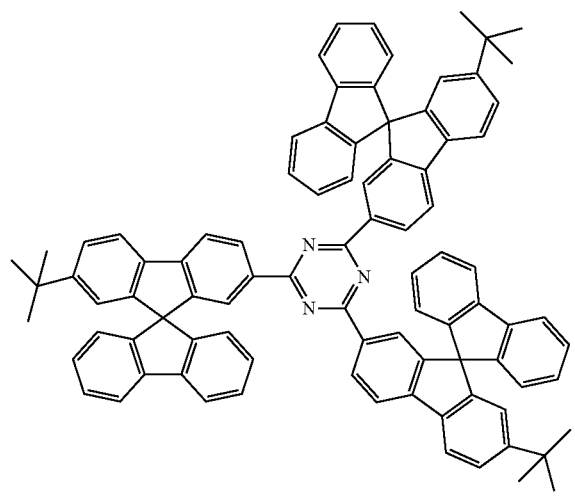

-continued
27
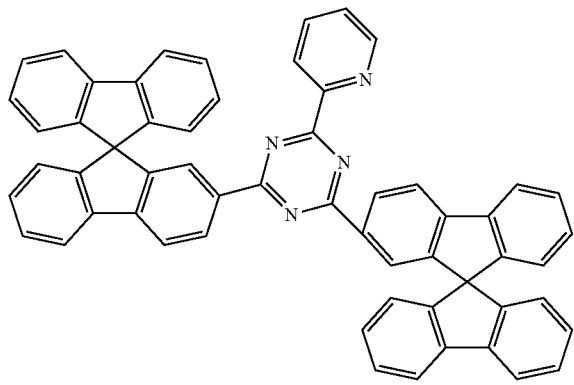
28
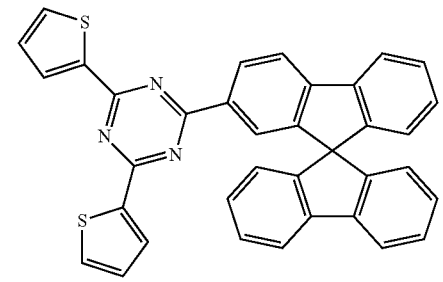
29
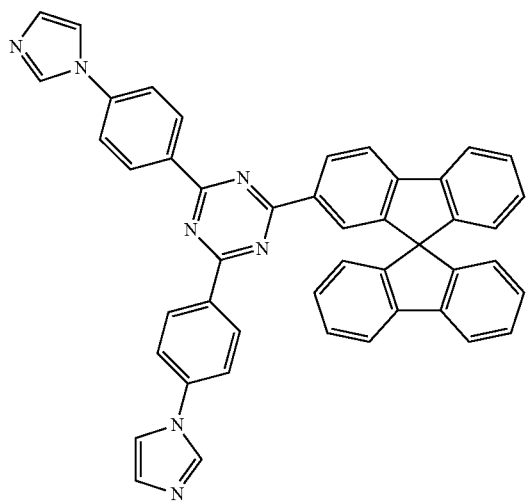
30
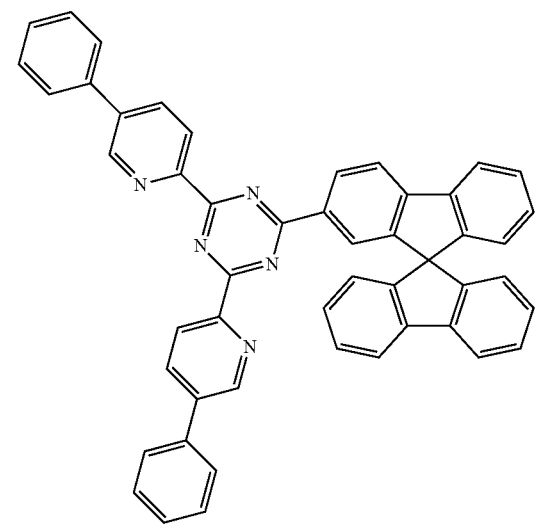
31
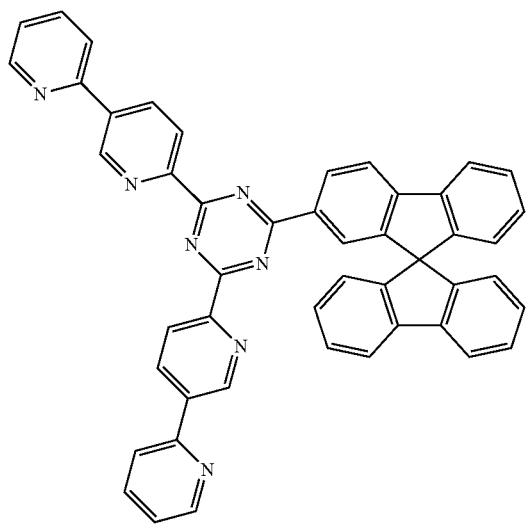
32
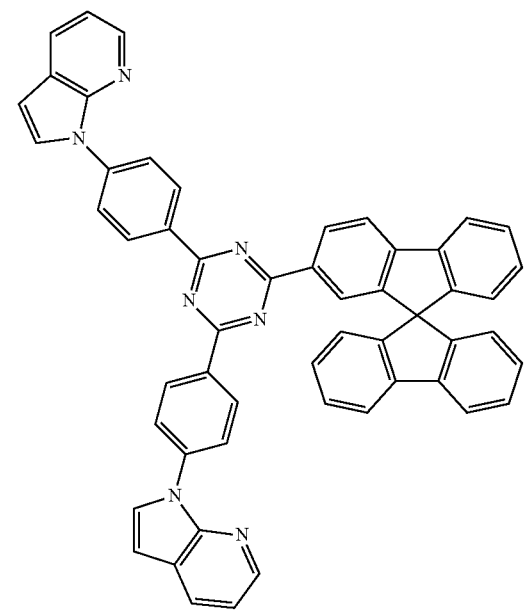

-continued
33
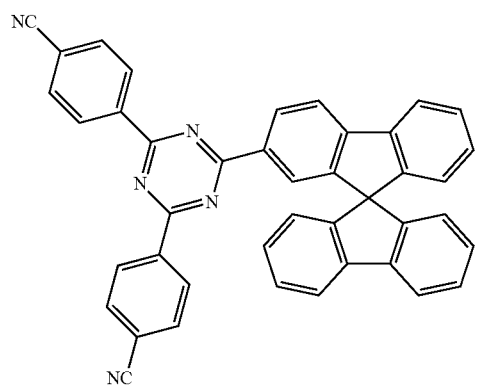
34
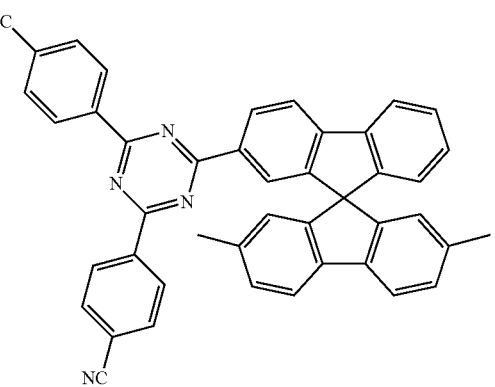
35
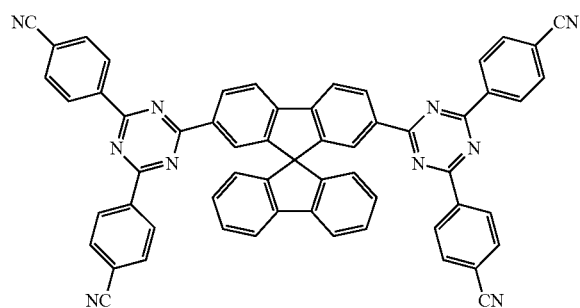
36
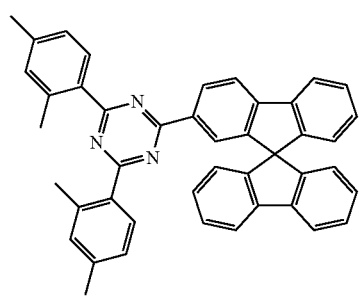
37
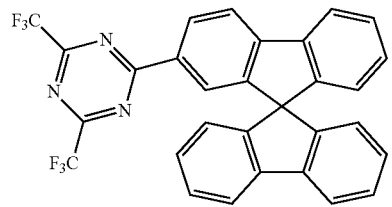
38
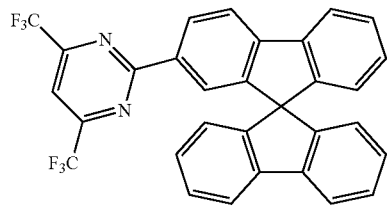
39
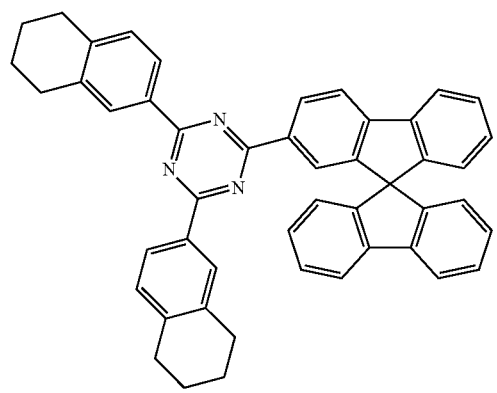
40
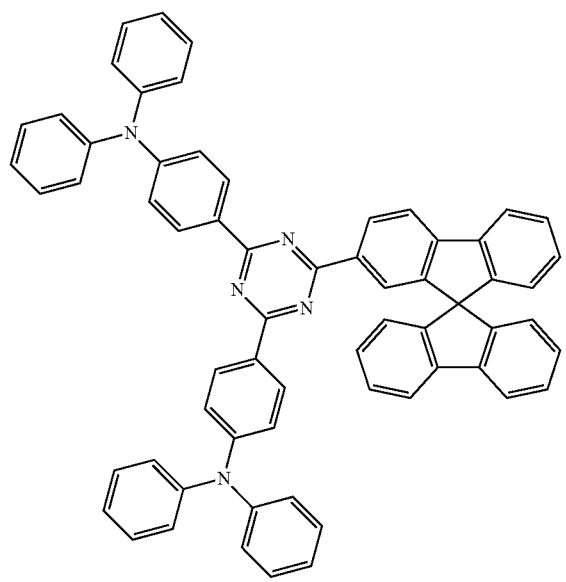

-continued
| | |
|---|---|
| 41 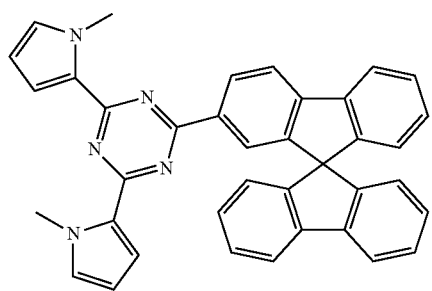 | 42 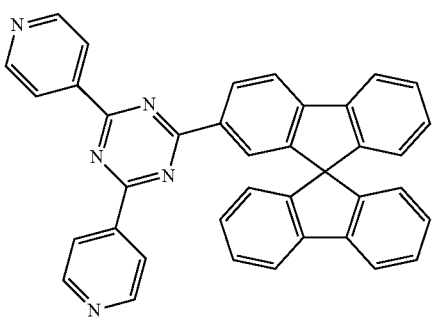 |
| 43 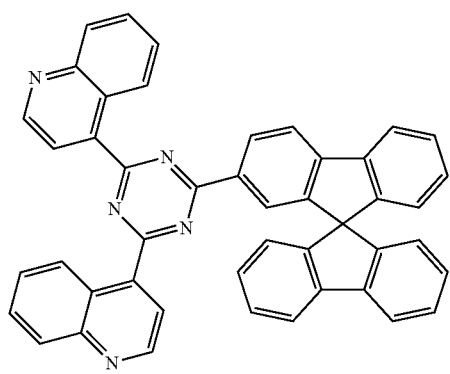 | 44 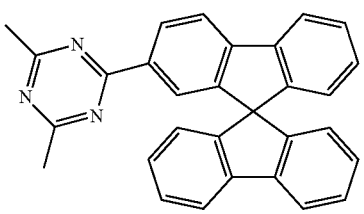 |
| 45 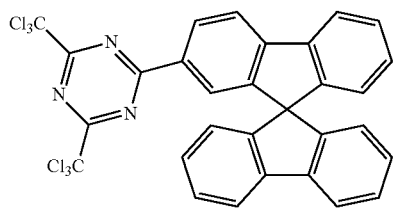 | 46 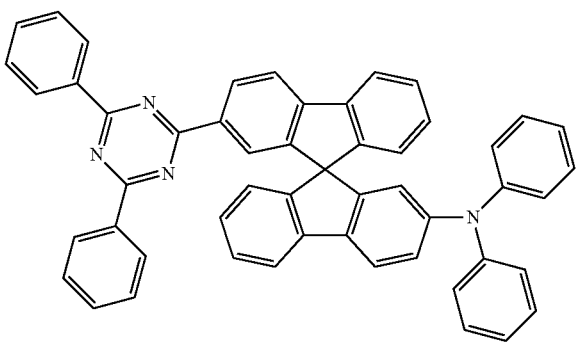 |
| 47 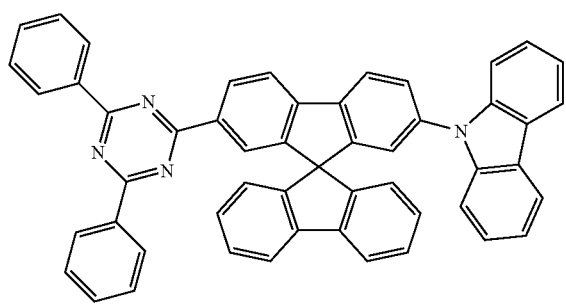 | 48 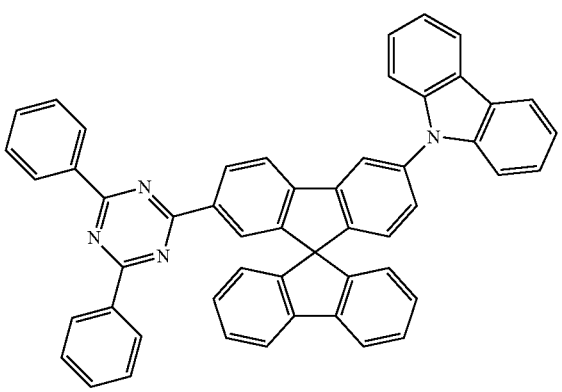 |

-continued
49
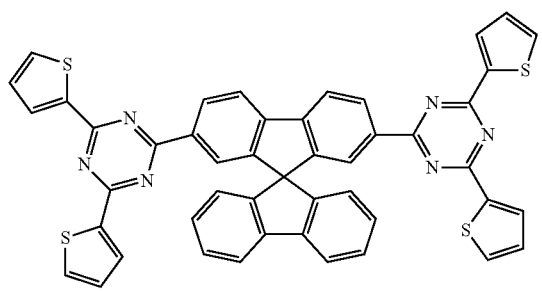
50
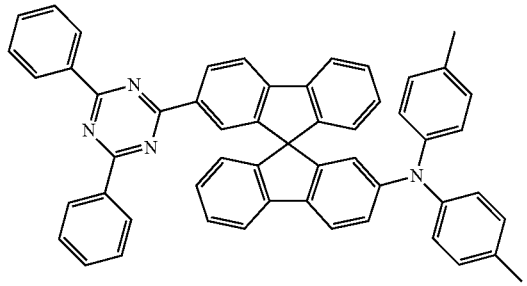
51
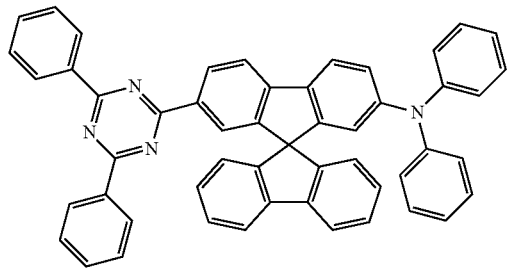
52
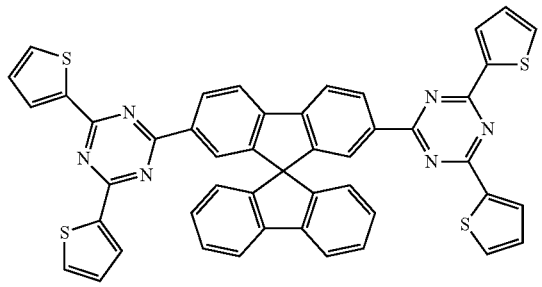
53
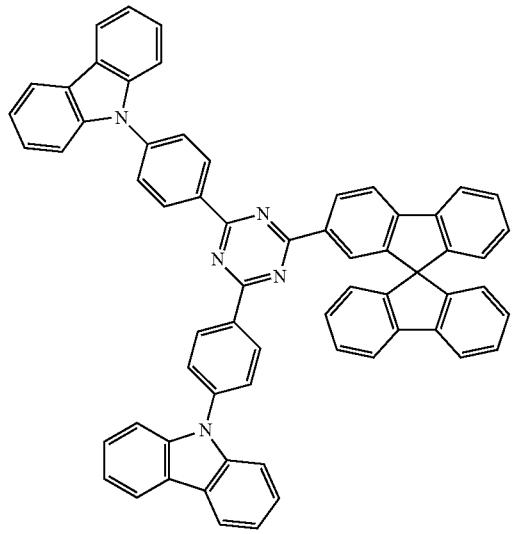
54
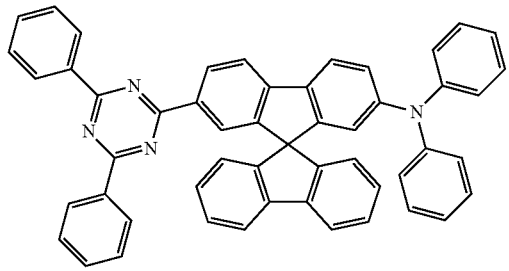
55
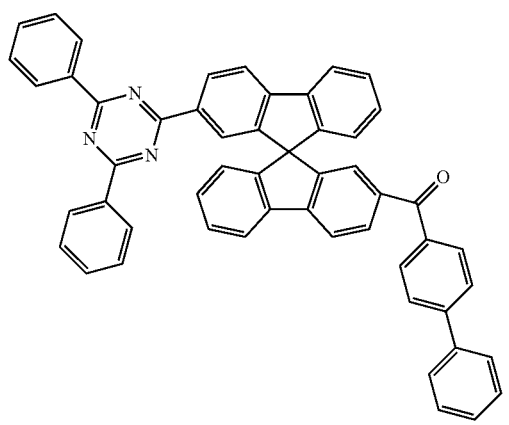
56
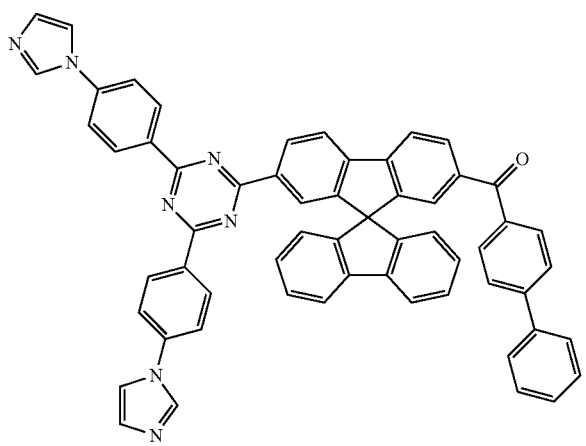

-continued
57
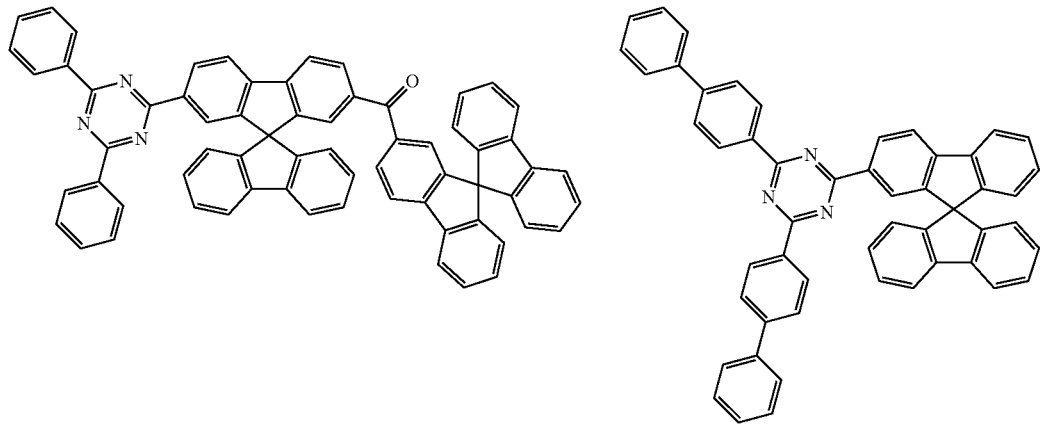
58
59
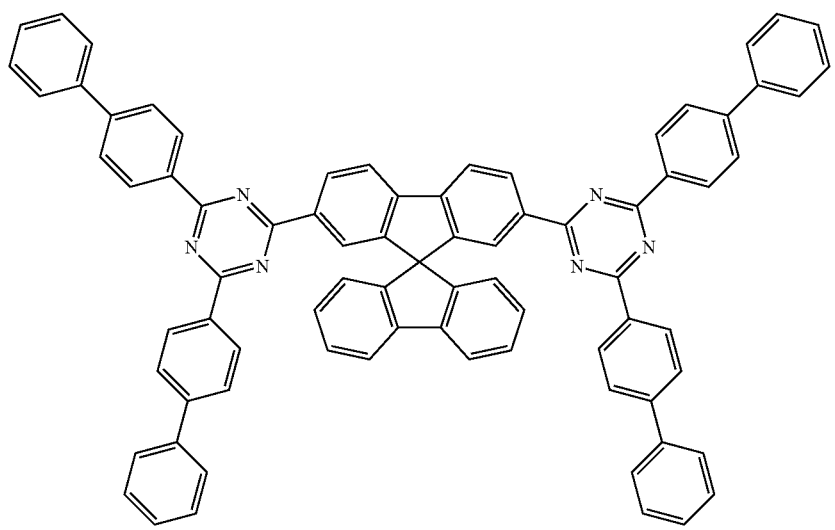
60
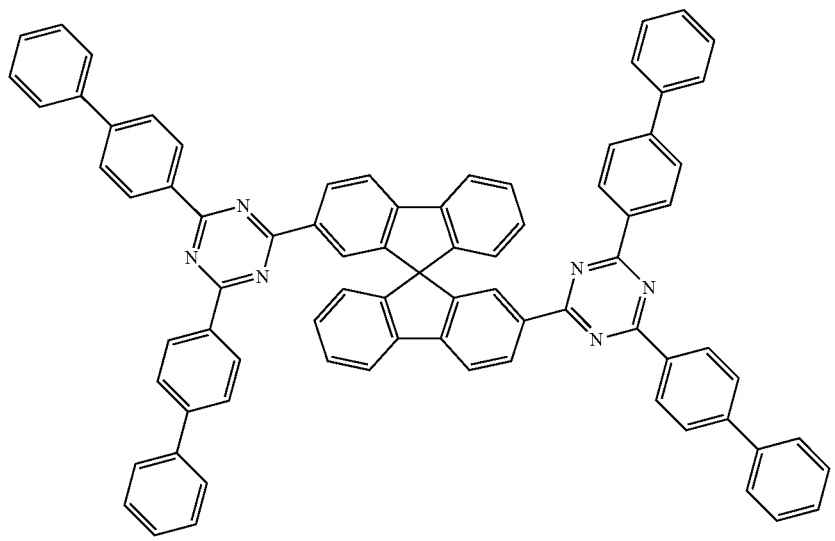

61
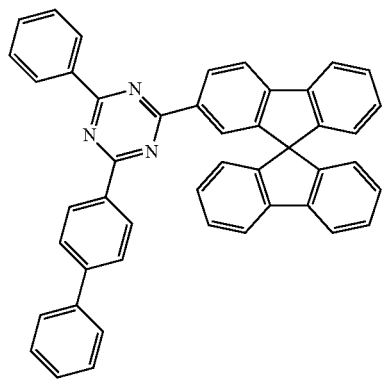
62
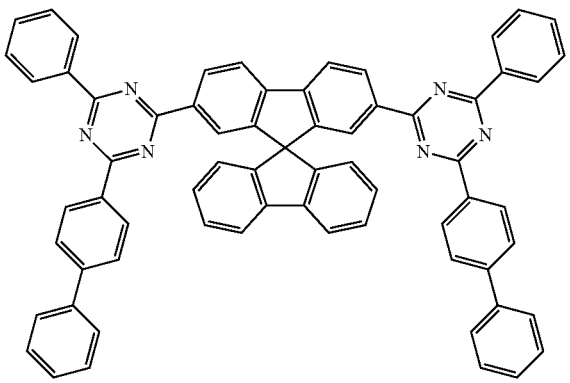
63
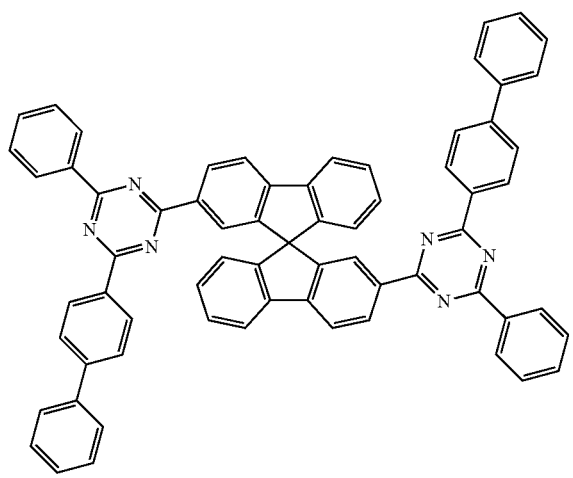
64
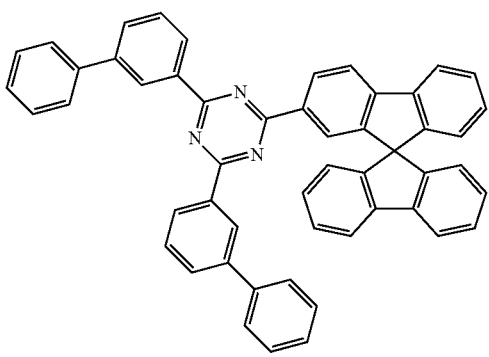
65
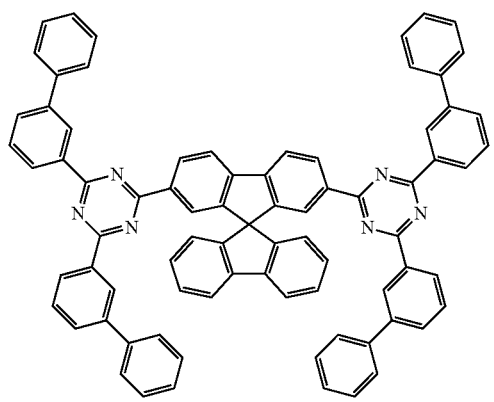
66
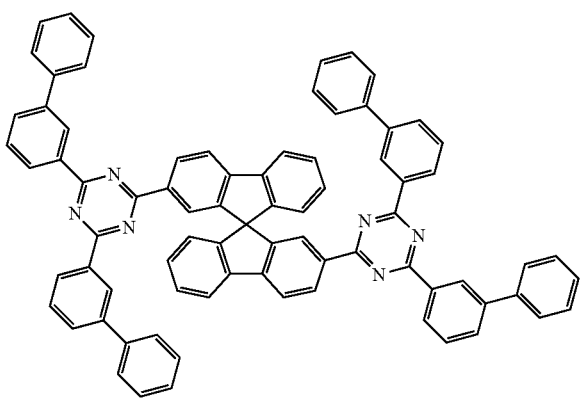

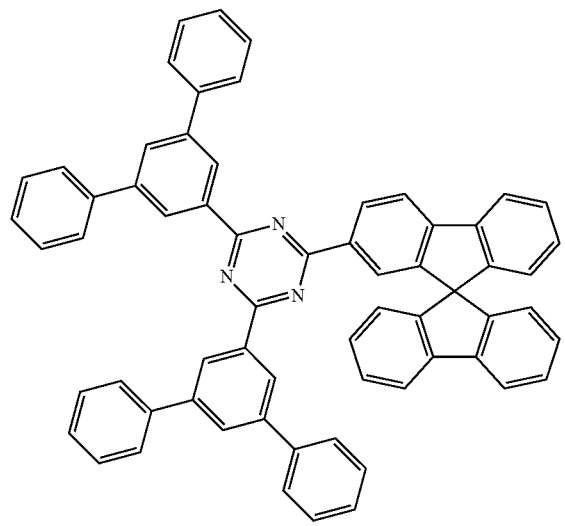
67
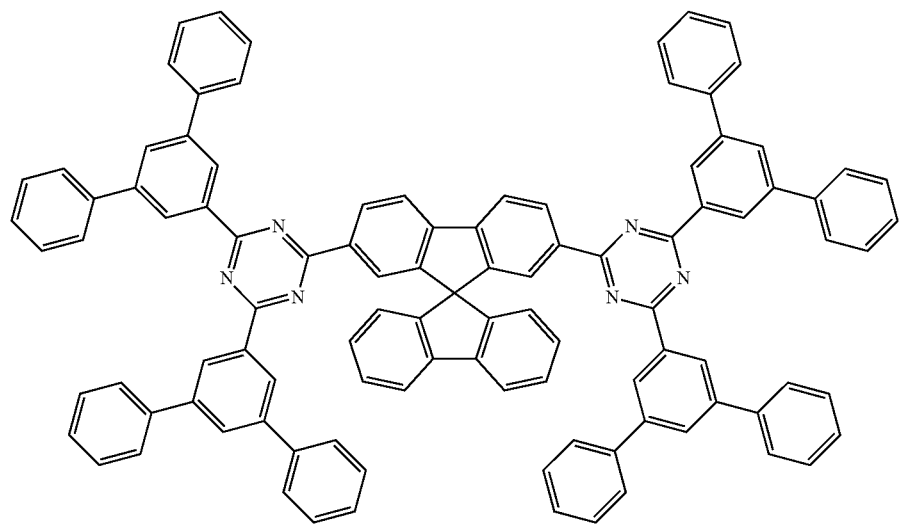
68
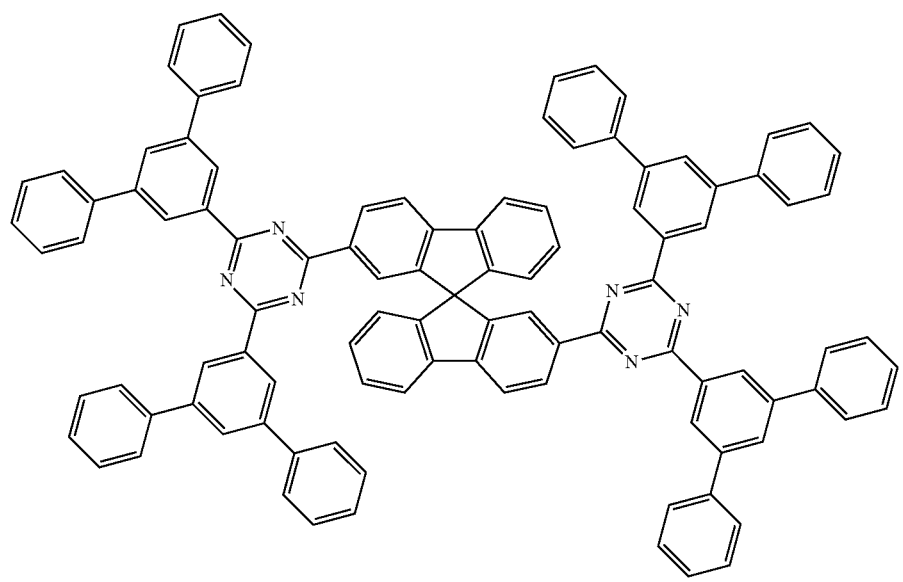
69

It has furthermore proven particularly advantageous for the organic electro-luminescent device to comprise an electron-transport layer which comprises a triaryl-substituted triazine derivative which is doped with an organic alkali-metal compound, or where a further layer which comprises an organic alkali-metal compound is introduced between the electron-transport layer comprising the triaryl triazine and the cathode. The triazine here may be a compound of the formula (1) or (2) depicted above or it may be another aromatic triazine compound.

The invention therefore furthermore relates to an organic electroluminescent device comprising an anode, a cathode, at least one emitting layer and at least one electron-transport layer which is arranged between the emitting layer and the cathode, where the electron-transport layer comprises at least one compound of the formula (11) or (12):

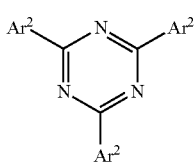

formula (11)

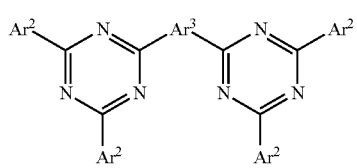

formula (12)

where $R^1$ has the meaning given above, and the following applies to the other symbols used:

$Ar^2$ is, identically or differently on each occurrence, a monovalent aromatic or heteroaromatic ring system having 5 to 60 aromatic ring atoms, which may in each case be substituted by one or more radicals $R^1$;

$Ar^3$ is a divalent aromatic or heteroaromatic ring system having 5 to 60 aromatic ring atoms, which may be substituted by one or more radicals $R^1$;

characterised in that the electron-transport layer is doped with an organic alkali-metal compound or in that a further layer which comprises an organic alkali-metal compound is introduced between the electron-transport layer comprising the compound of the formula (11) or (12) and the cathode.

The compounds of the formulae (11) and (12) preferably have a glass-transition temperature $T_G$ of greater than 70° C., particularly preferably greater than 90° C., very particularly preferably greater than 110° C.

In compounds of the formula (11), at least one group $Ar^2$ is preferably selected from the groups of the following formulae (13) to (27):

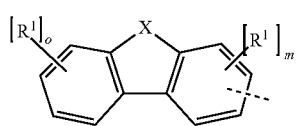

formula (13)

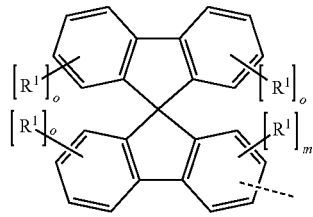

formula (14)

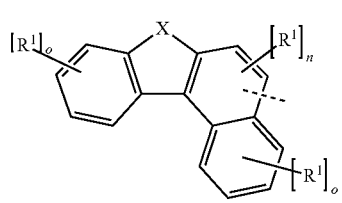

formula (15)

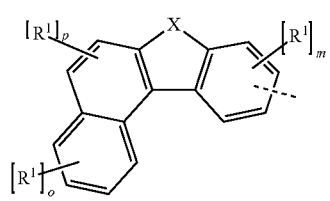

formula (16)

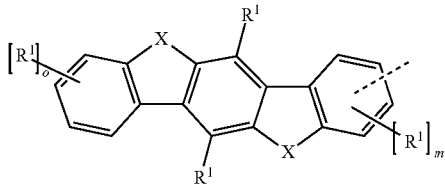

formula (17)

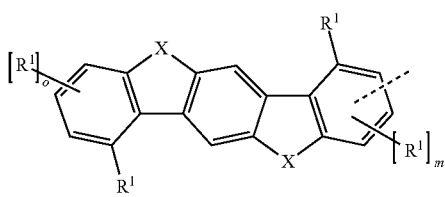

formula (18)

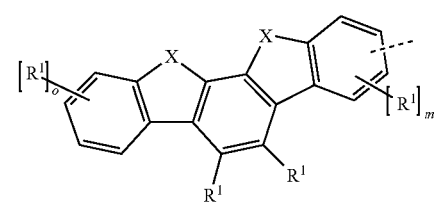

formula (19)

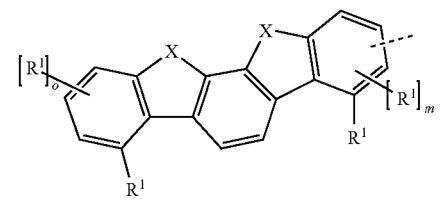

formula (20)

formula (21)
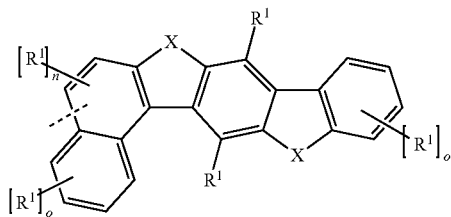

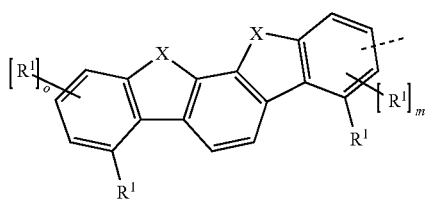
formula (22)

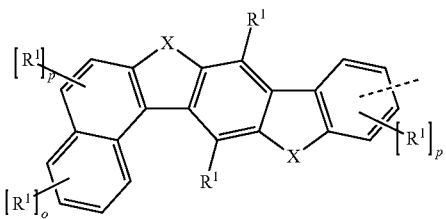
formula (23)

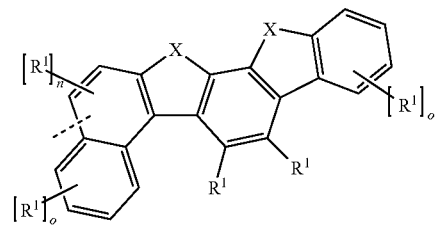
formula (24)

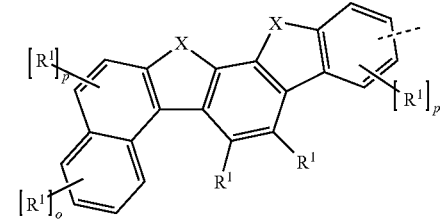
formula (25)

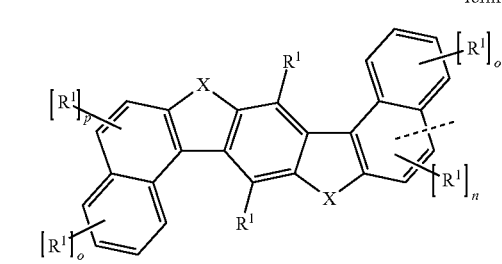

formula (26)
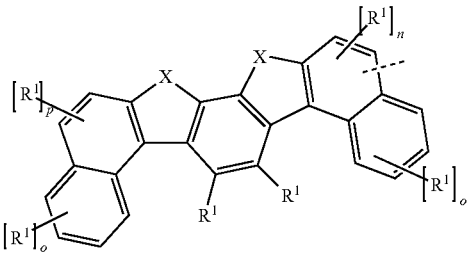

formula (27)
$$(Ar^4)_p\text{——}(Ar^5)_q\text{——}(Ar^6)_r\text{----}$$

where $R^1$ has the same meaning as described above, the dashed bond represents the link to the triazine unit, and furthermore:

X is, identically or differently on each occurrence, a divalent bridge selected from $B(R^1)$, $C(R^1)_2$, $Si(R^1)_2$, $C=O$, $C=NR^1$, $C=C(R^1)_2$, O, S, S=O, $SO_2$, $N(R^1)$, $P(R^1)$ and $P(=O)R^1$;

m is on each occurrence, identically or differently, 0, 1, 2 or 3;

o is on each occurrence, identically or differently, 0, 1, 2, 3 or 4;

$Ar^4$, $Ar^6$ are, identically or differently on each occurrence, an aryl or heteroaryl group having 5 to 18 aromatic ring atoms, which may be substituted by one or more radicals $R^1$;

$Ar^5$ is a condensed aryl or heteroaryl group having 10 to 18 aromatic ring atoms, which may be substituted by one or more radicals $R^1$;

p, r are, identically or differently on each occurrence, 0, 1 or 2, preferably 0 or 1;

q is 1 or 2, preferably 1.

In a preferred embodiment of the invention, $Ar^5$ in formula (27) is a condensed aryl group having 10 to 18 aromatic C atoms, which may be substituted by one or more radicals $R^1$. $Ar^5$ is particularly preferably selected from the group consisting of naphthalene, anthracene, phenanthrene, pyrene, benzanthracene and chrysene, each of which may be substituted by one or more radicals $R^1$. Very particular preference is given to anthracene and benzanthracene.

In a further preferred embodiment of the invention, the groups $Ar^4$ and $Ar^6$ in formula (27) are, identically or differently on each occurrence, an aryl or heteroaryl group having 6 to 14 aromatic ring atoms, which may in each case be substituted by one or more radicals $R^1$. $Ar^4$ and $Ar^6$ are particularly preferably selected, identically or differently on each occurrence, from the group consisting of benzene, pyridine, pyrazine, pyridazine, pyrimidine, triazine, naphthalene, quinoline, isoquinoline, anthracene, phenanthrene, phenanthroline, pyrene, benzanthracene and chrysene, each of which may be substituted by one or more radicals $R^1$. $Ar^4$ and $Ar^6$ are very particularly preferably selected from the group consisting of benzene and naphthalene.

Particularly preferred groups $Ar^2$ are selected from the groups of the following formulae (13a) to (26a):

formula (13a)
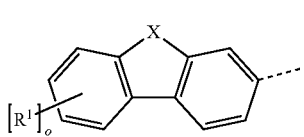

formula (14a)
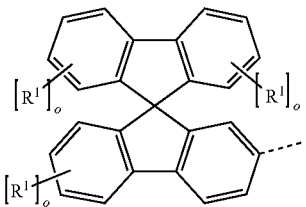
formula (15a)
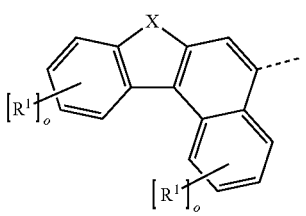
formula (16a)
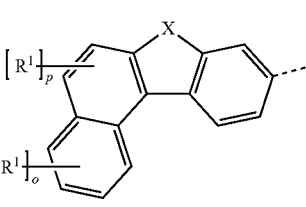
formula (17a)
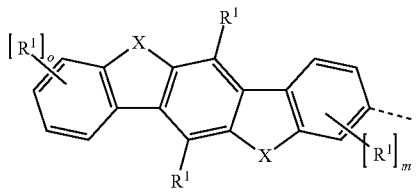
formula (18a)
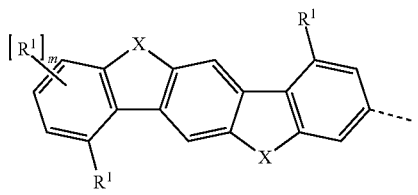
formula (19a)
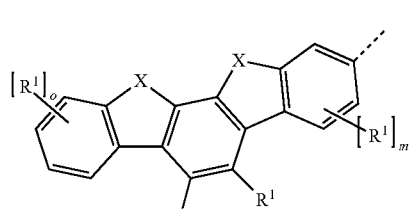
formula (20a)
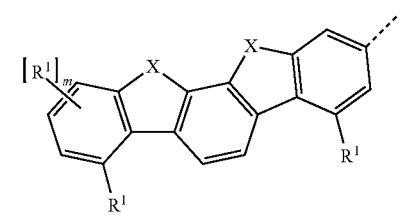
formula (21a)
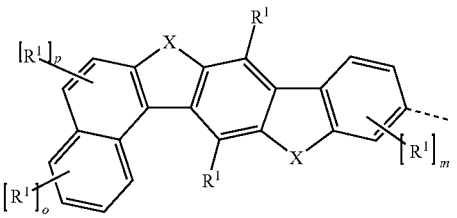
formula (22a)
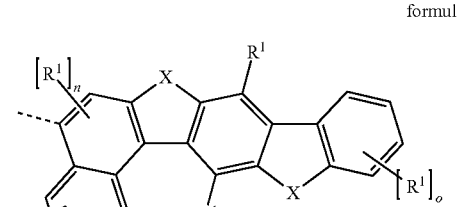
formula (23a)
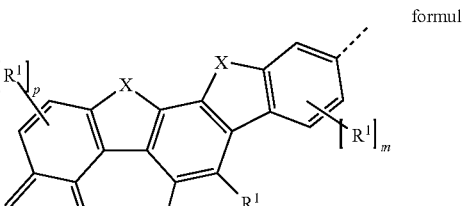
formula (24a)
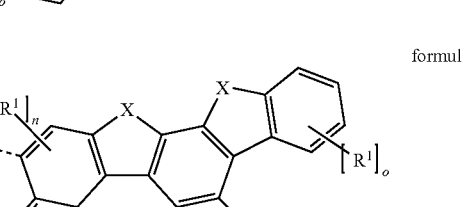
formula (25a)
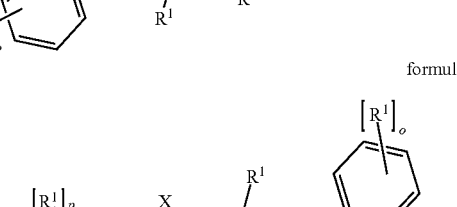
formula (26a)
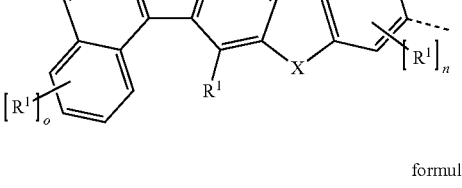

-continued formula (26a)

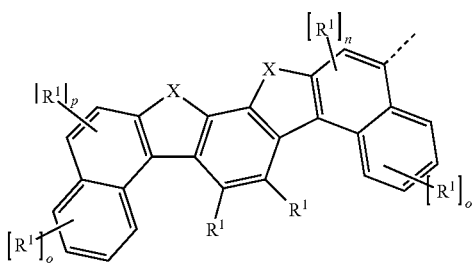

where the symbols and indices used have the same meaning as described above. X here is preferably selected, identically or differently, from C(R$^1$)$_2$, N(R$^1$), O and S, particularly preferably C(R$^1$)$_2$.

Particularly preferred embodiments of the formula (27) are furthermore the groups of the following formulae (27a) to (27d):

formula (27a)

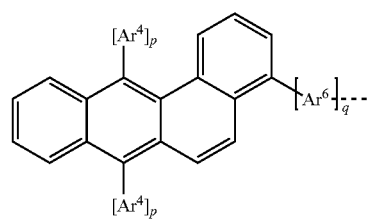

formula (27b)

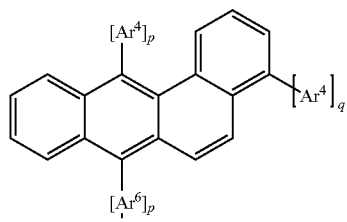

formula (27c)

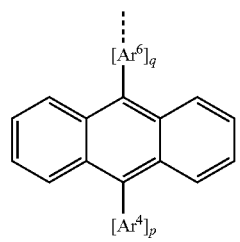

formula (27d)

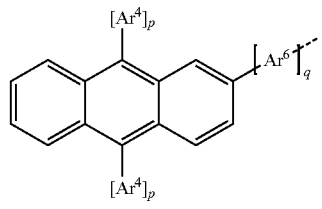

where these groups may also be substituted by one or more radicals R$^1$ and where the symbols and indices used have the meanings given above and the dashed bond indicates the bond to the triazine; the groups of the formulae (27a) to (27d) here may be substituted by one or more radicals R$^1$, and the index p in formulae (27a) to (27d) stands for 0 or 1.

Preference is also given to compounds of the formula (11) in which two or three groups Ar$^2$ stand for a group of the formulae (13) to (27) given above.

Preference is furthermore given to compounds of the formula (11) given above in which a group Ar$^2$ stands for a group of the formulae (13) to (27) given above, and one or both of the other groups Ar$^2$ stand for phenyl, 1- or 2-naphthyl, ortho-, meta- or para-biphenyl, which may be substituted by one or more radicals R$^1$, but are preferably unsubstituted.

Preferred groups Ar$^3$ in compounds of the formula (12) are selected from the groups of the following formulae (28) to (39):

formula (28)

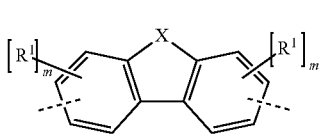

formula (29)

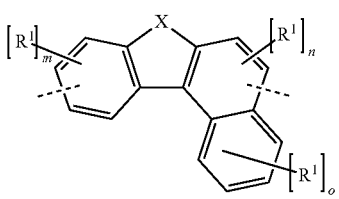

formula (30)

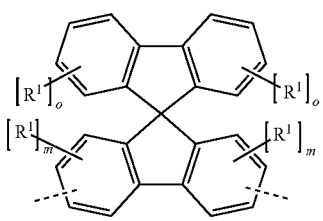

formula (31)

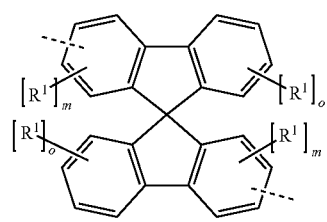

formula (32)

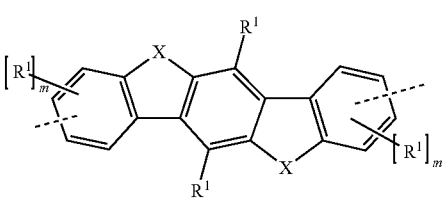

formula (33)

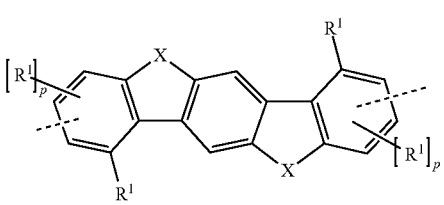

-continued
formula (34)
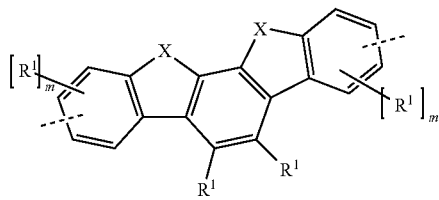
formula (35)
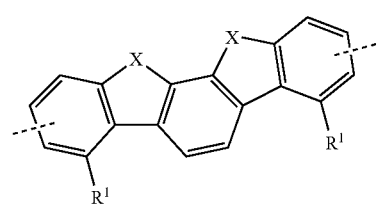
formula (36)
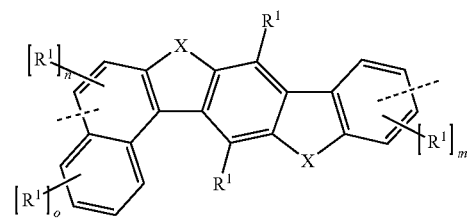
formula (37)
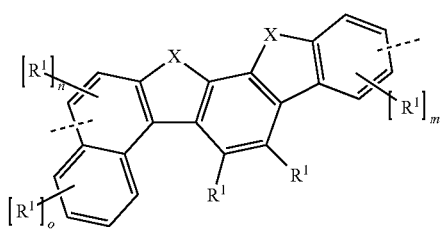
formula (38)
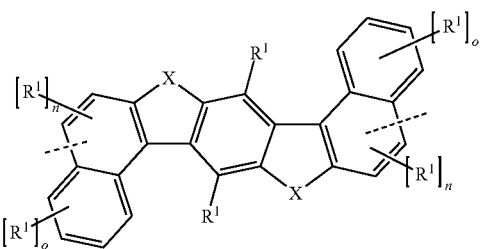
formula (39)
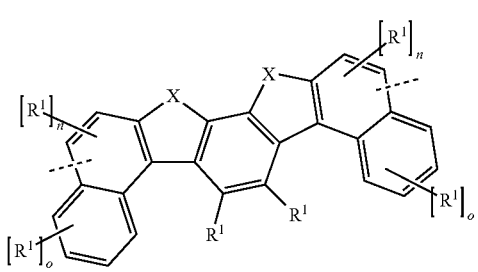
where the symbols and indices used have the same meaning as described above, and the dashed bond represents the link to the two triazine units.
Particularly preferred groups Ar$^3$ are selected from the groups of the following formulae (28a) to (39a):
formula (28a)
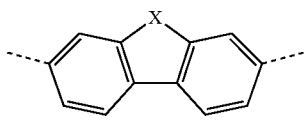
formula (29a)
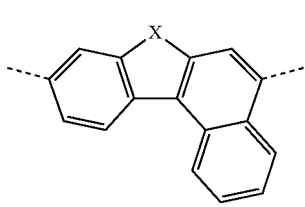
formula (30a)
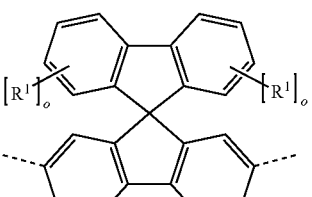
formula (31a)
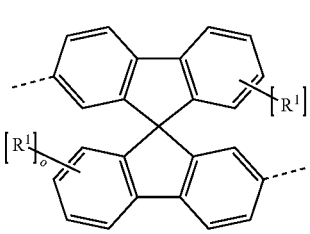
formula (32a)
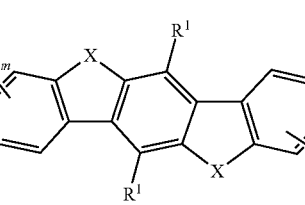
formula (33a)
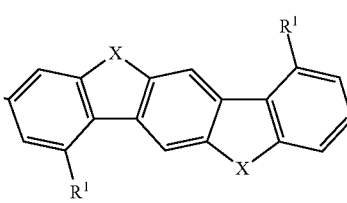

formula (34a)
formula (35a)
formula (36a)
formula (37a)

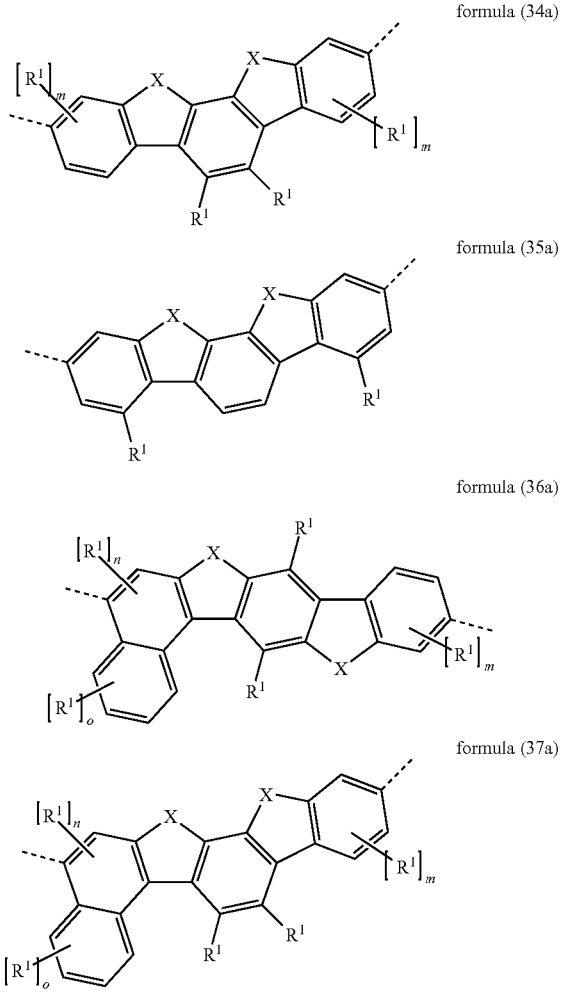

formula (38a)
formula (39a)

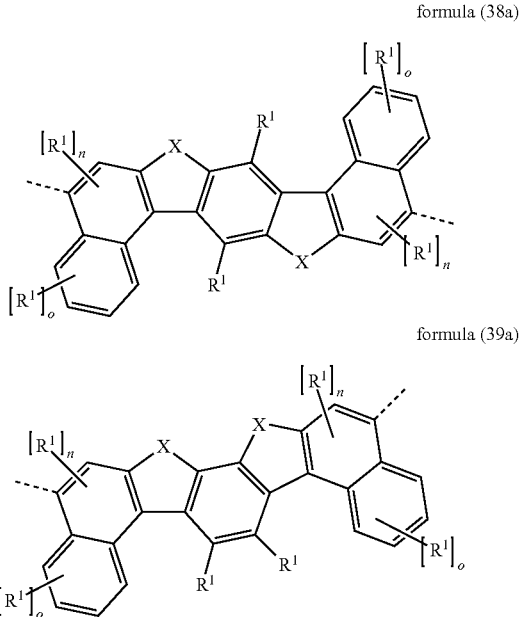

where the symbols and indices used have the same meaning as described above. X here is preferably selected, identically or differently, from $C(R^1)_2$, $N(R^1)$, O and S, particularly preferably $C(R^1)_2$.

Preference is furthermore given to compounds of the formula (12) given above in which the group $Ar^3$ is selected from the formulae (28) to (39) given above, and $Ar^2$ is selected, identically or differently on each occurrence, from the formulae (13) to (27) given above or phenyl, 1- or 2-naphthyl, ortho-, meta- or para-biphenyl, which may be substituted by one or more radicals $R^1$, but are preferably unsubstituted.

Apart from structures 1 to 69 depicted above, examples of preferred compounds of the formulae (11) and (12) are the following structures 70 to 178:

70

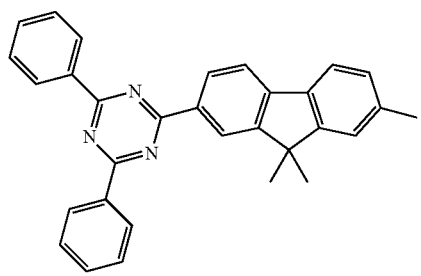

71

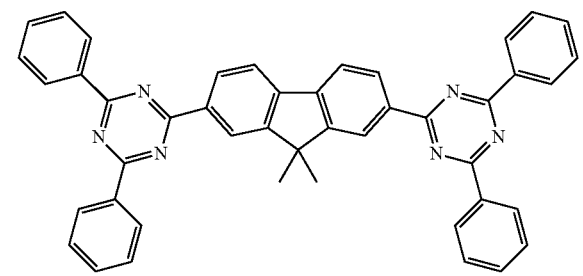

72

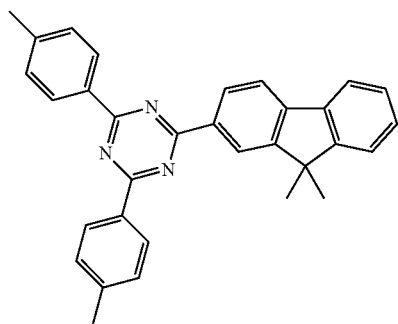

73

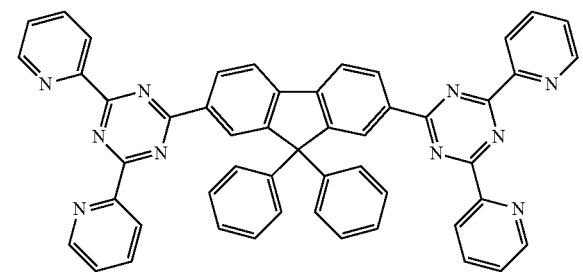

-continued
74
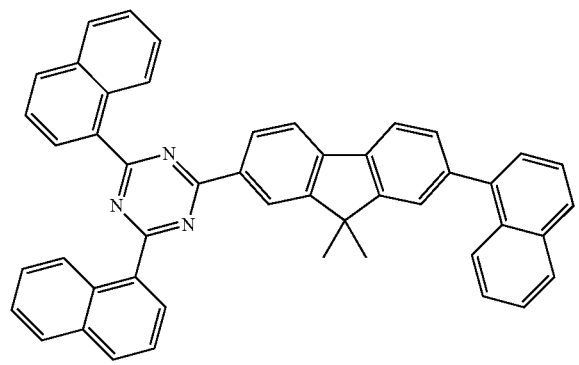
75
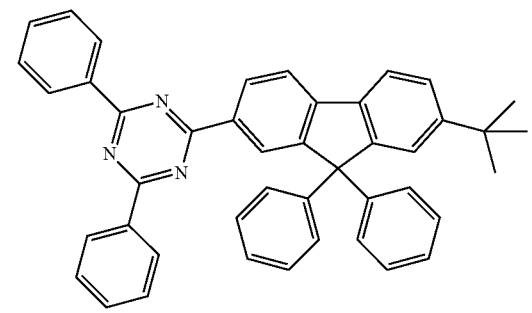
76
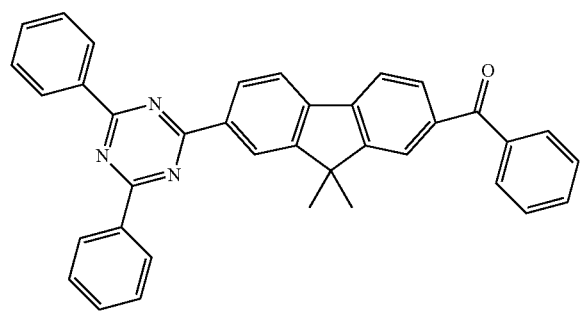
77
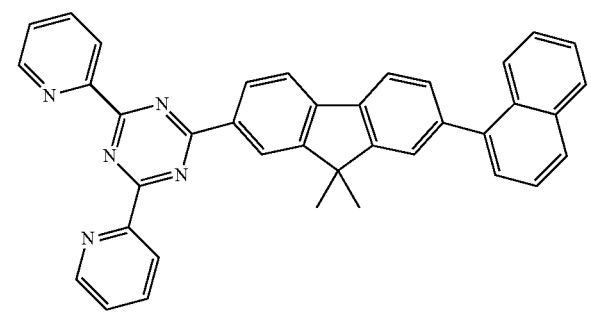
78
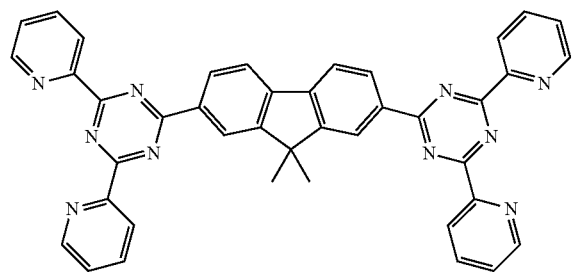
79
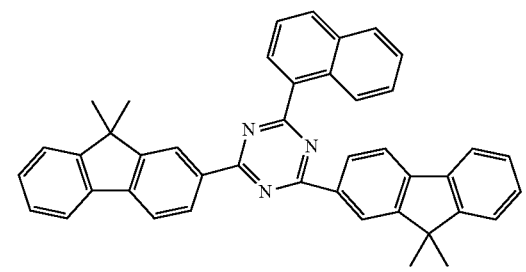
80
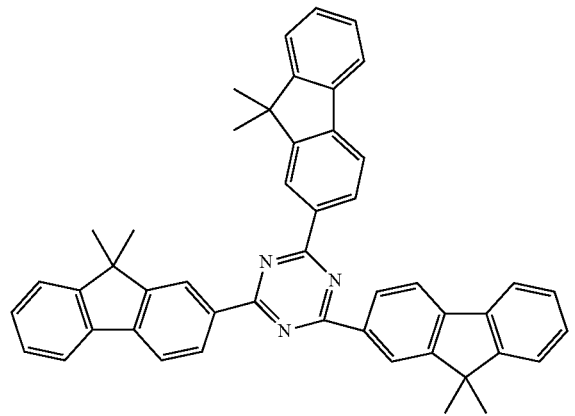
81
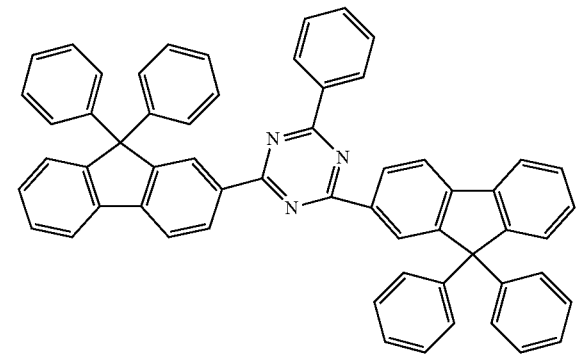

-continued
82
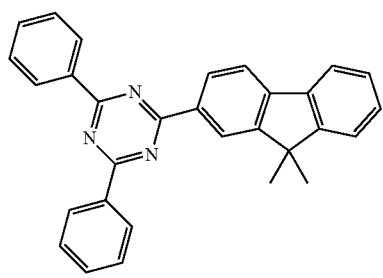
83
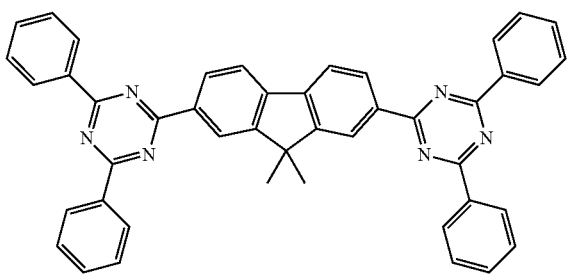
84
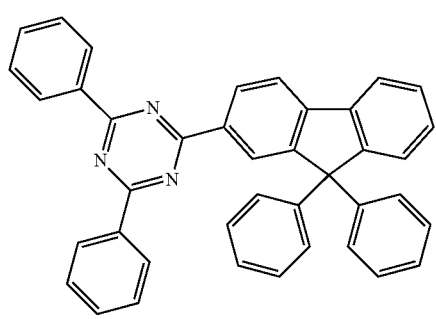
85
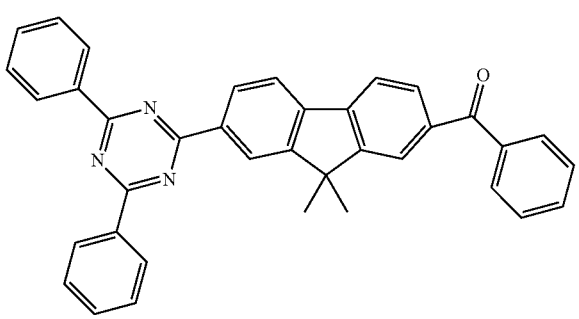
86
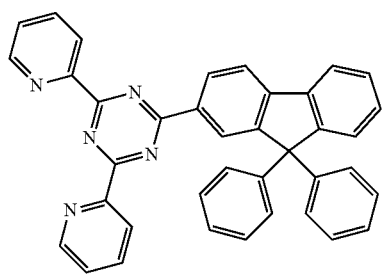
87
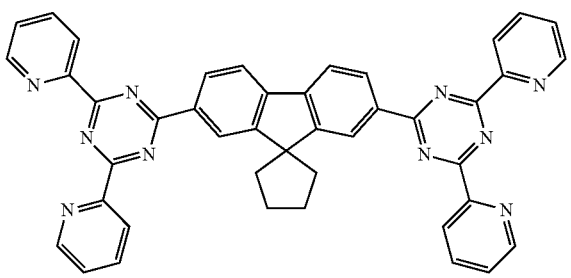
88
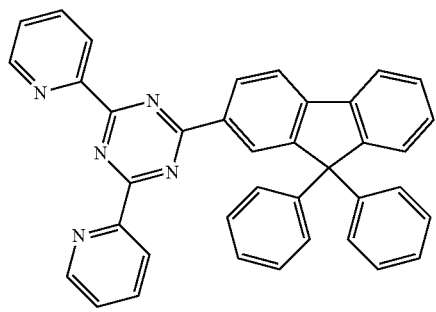
89
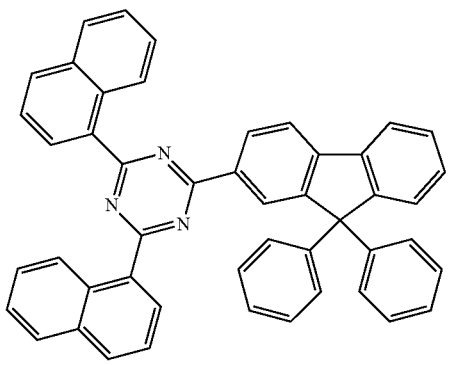
90
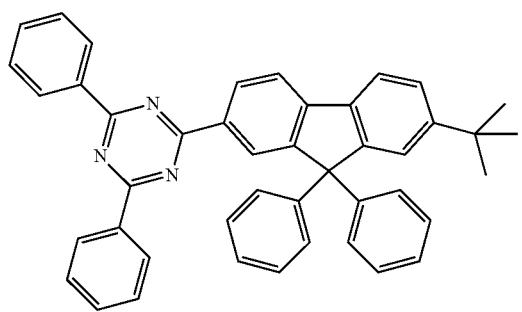
91
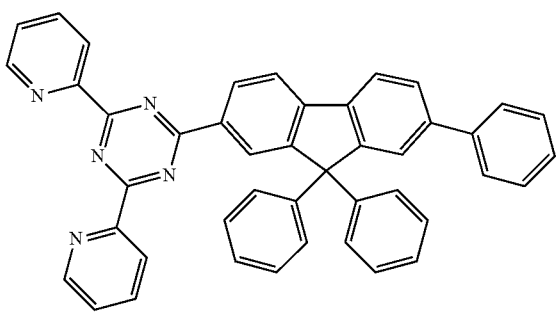

-continued
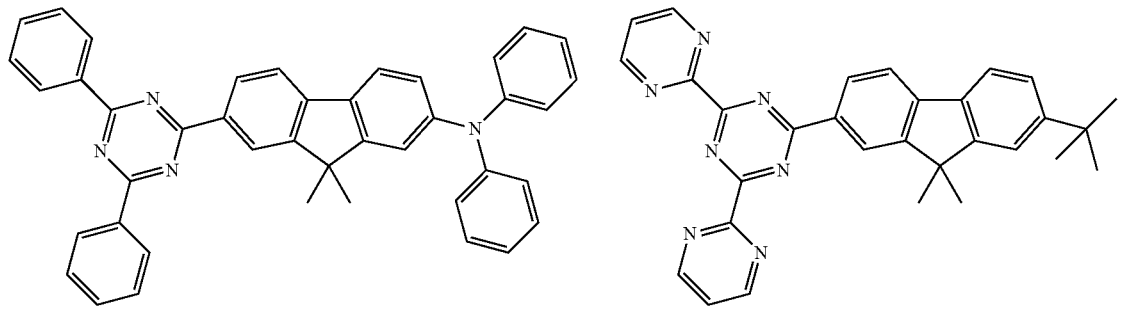
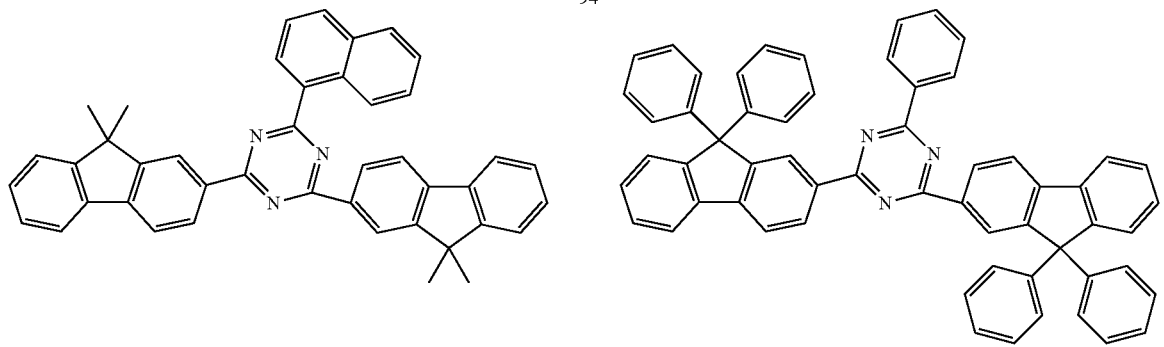
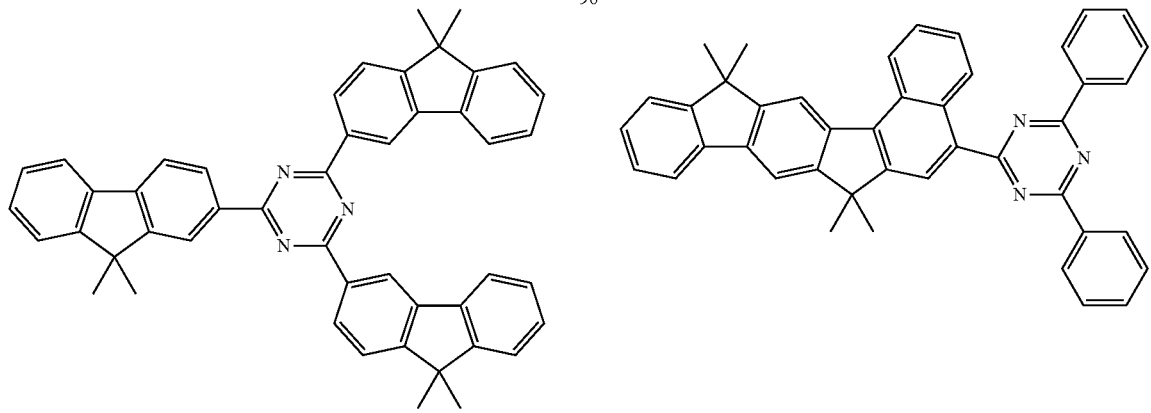
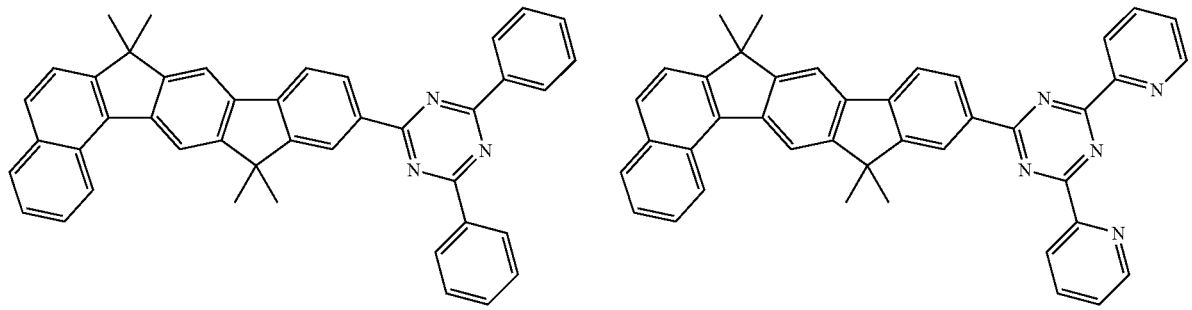

-continued
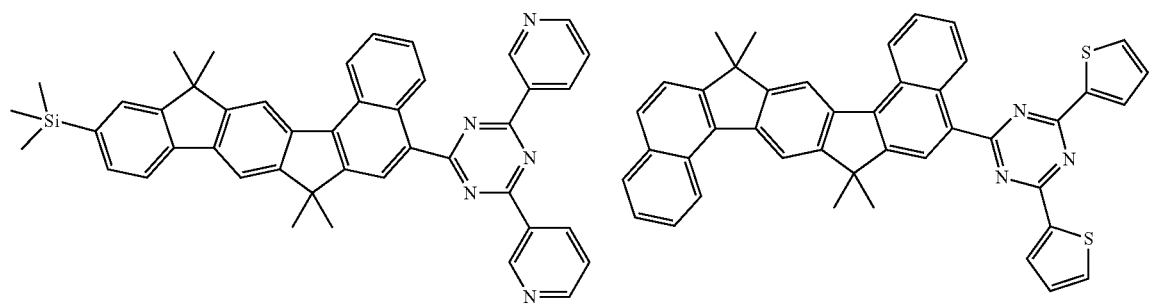
100
101
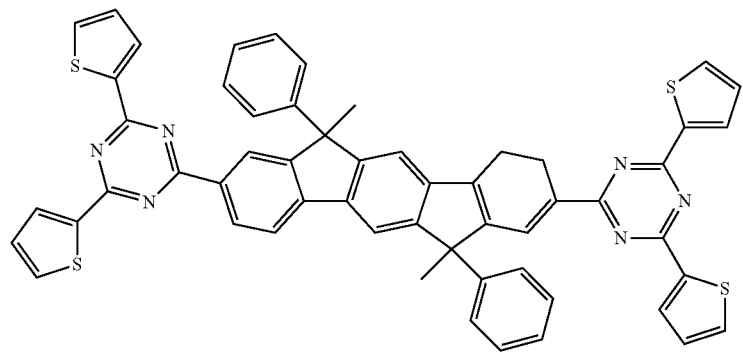
102
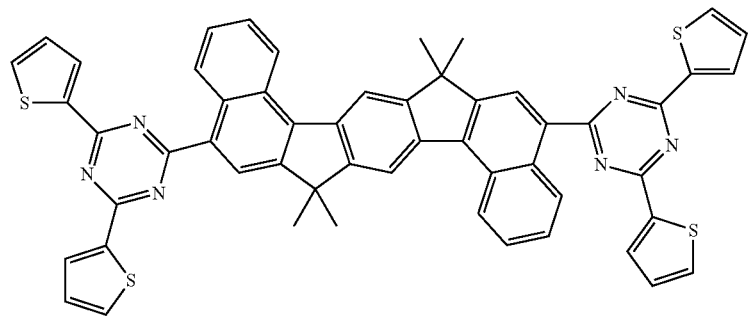
103
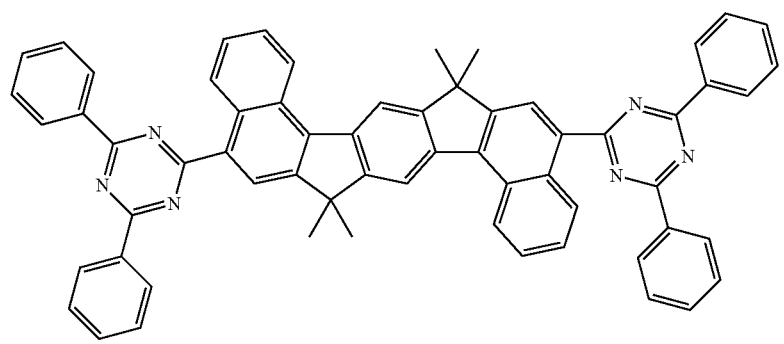
104

-continued
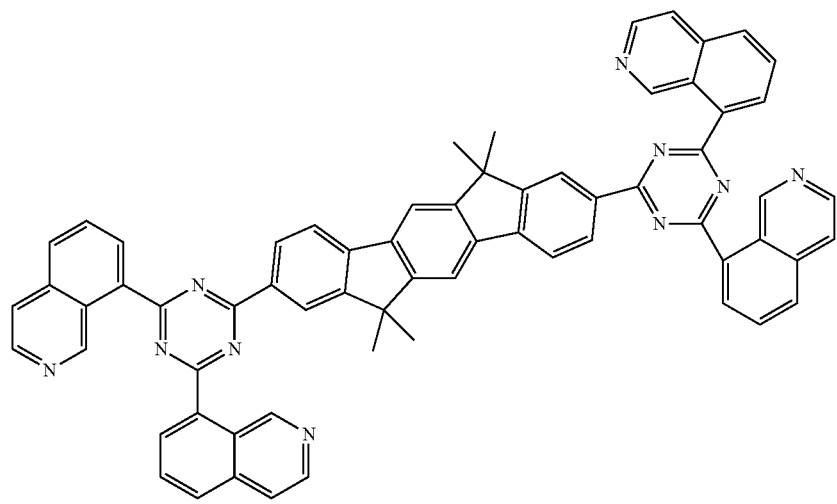
105
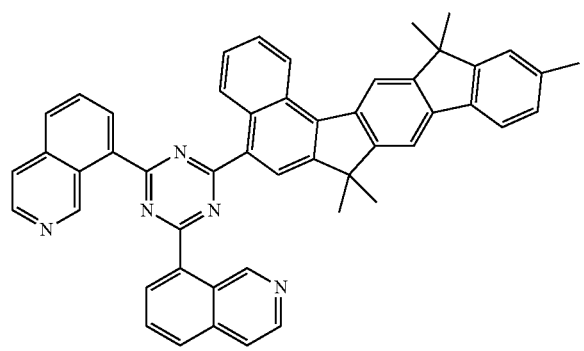
106
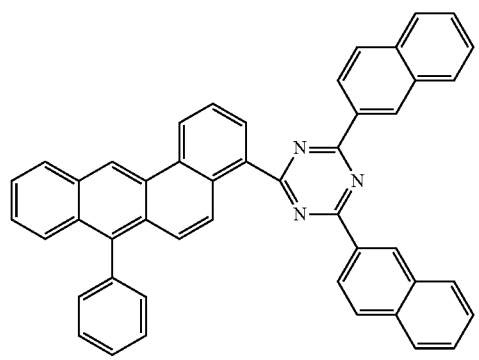
107
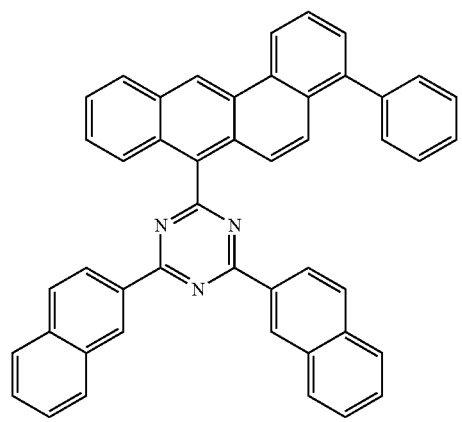
108
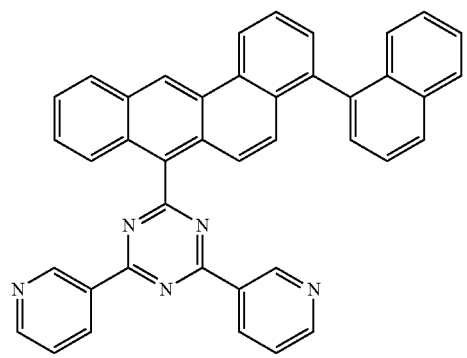
109

-continued
110
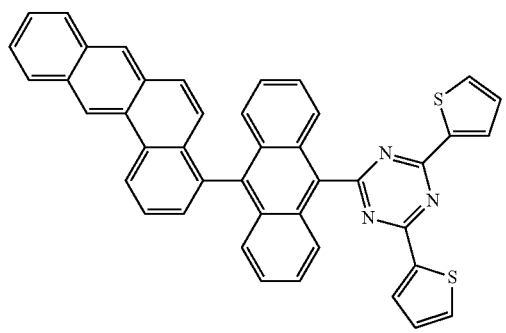
111
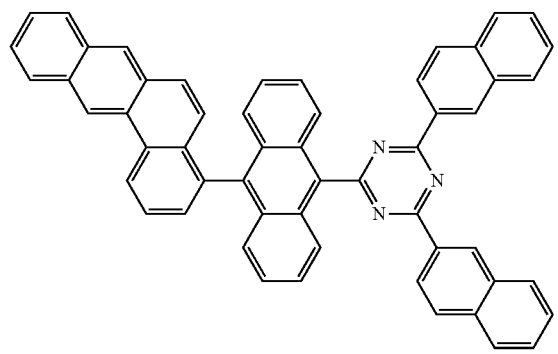
112
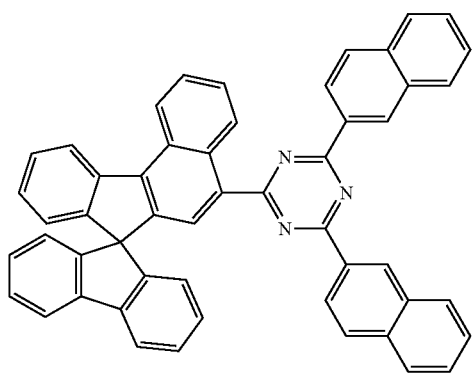
113
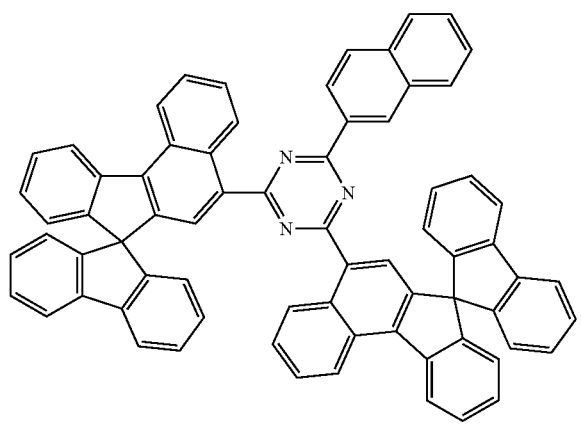
114
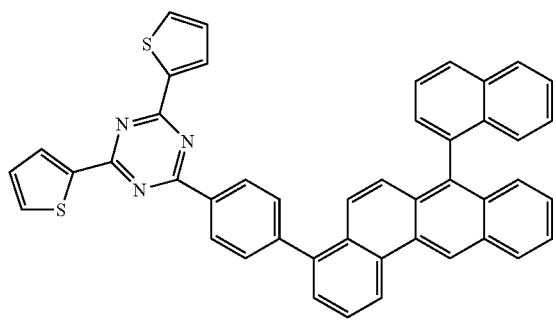
115
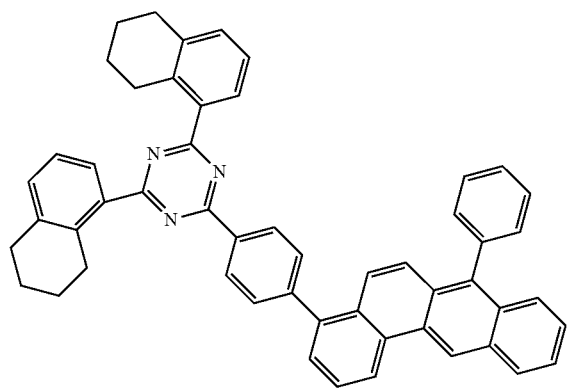

-continued
116
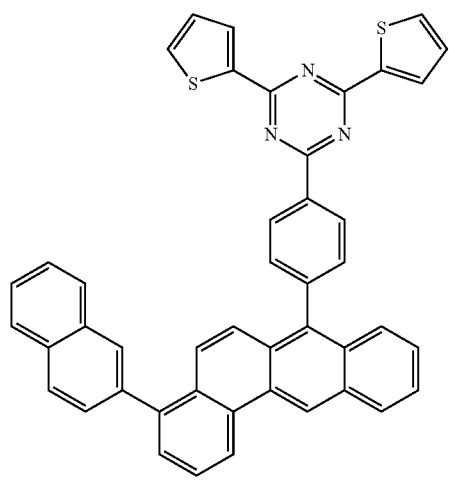
117
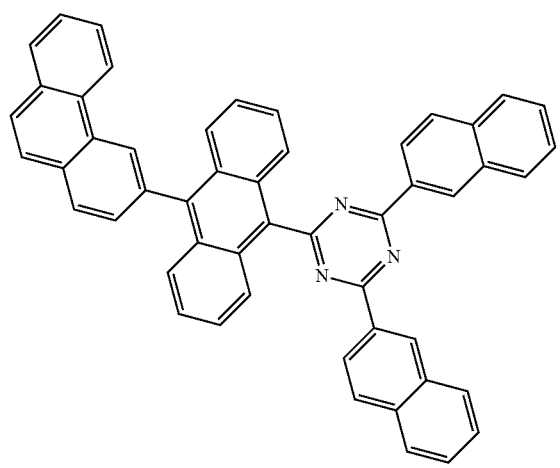
118
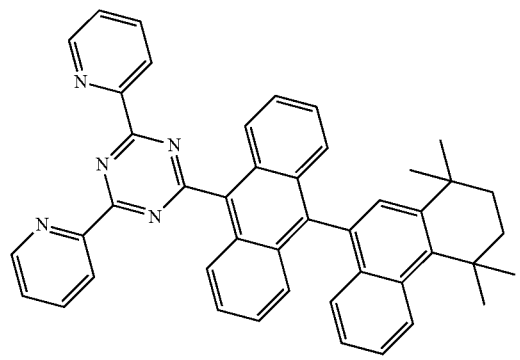
119
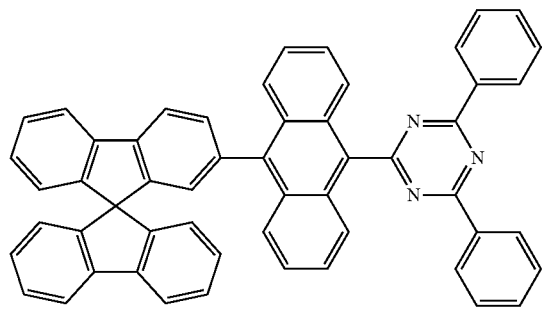
120
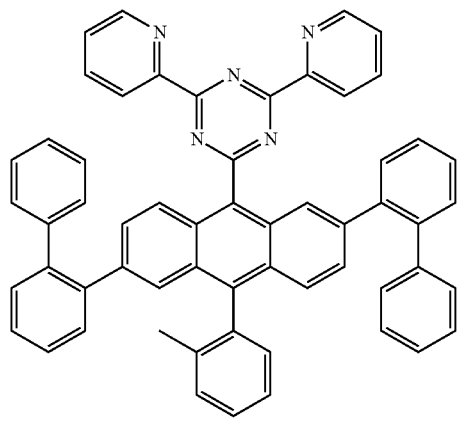
121
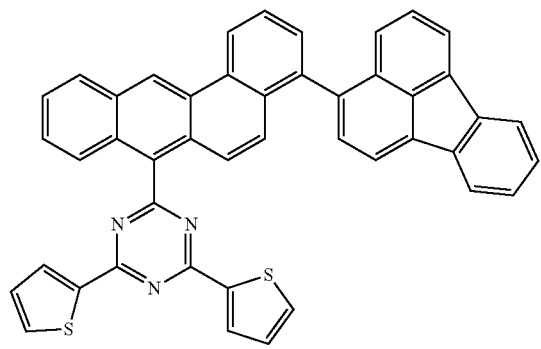

-continued
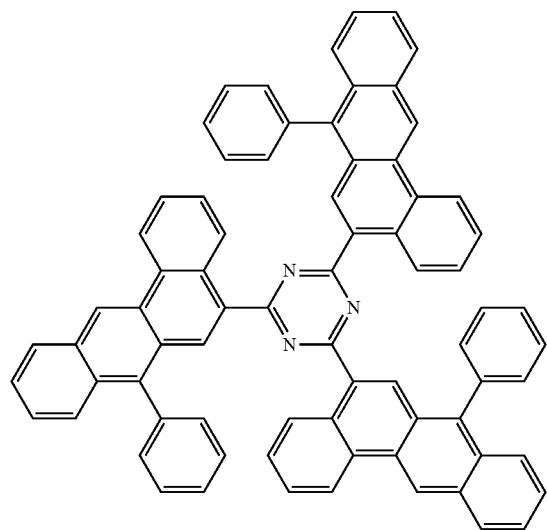
122
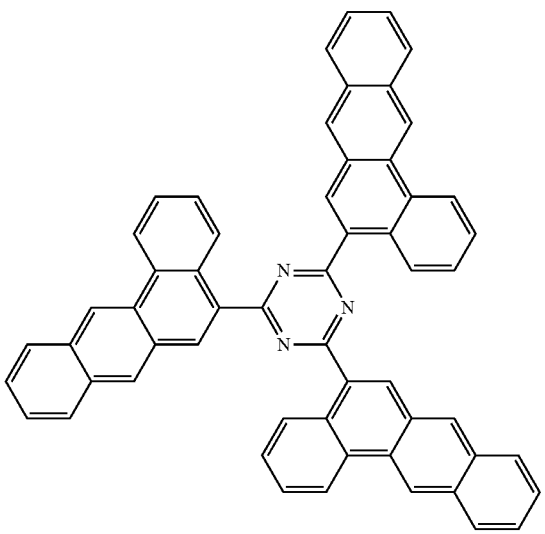
123
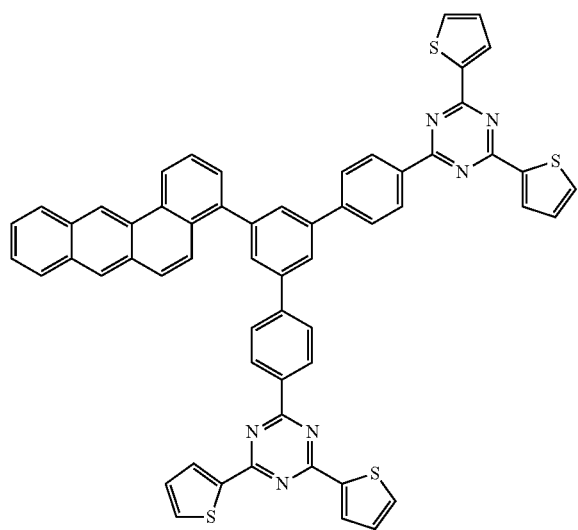
124
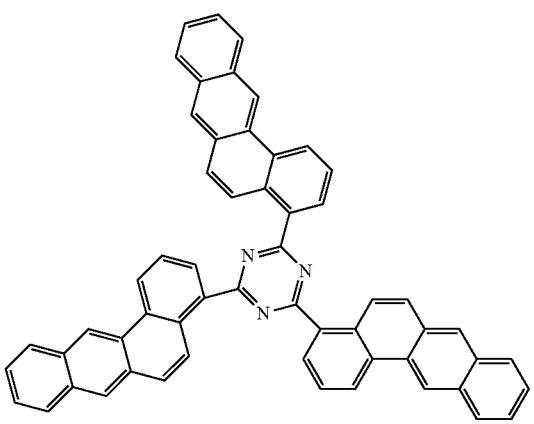
125
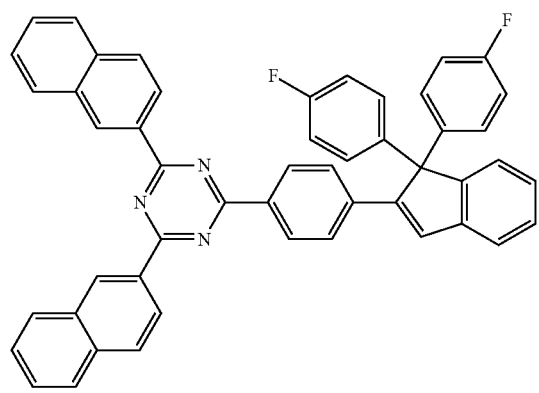
126
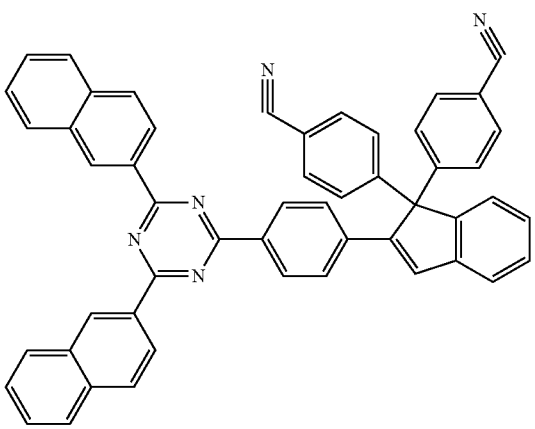
127

-continued
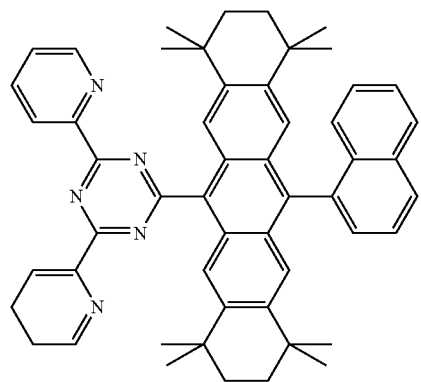
128
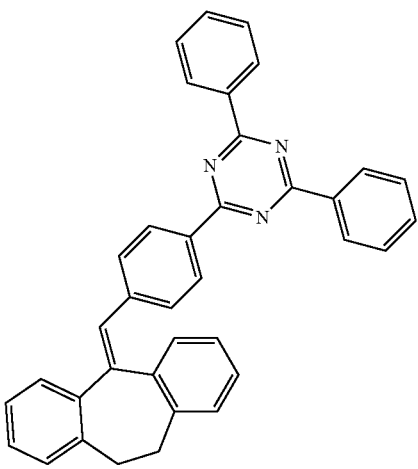
129
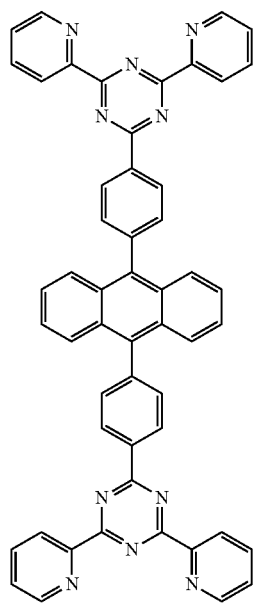
130
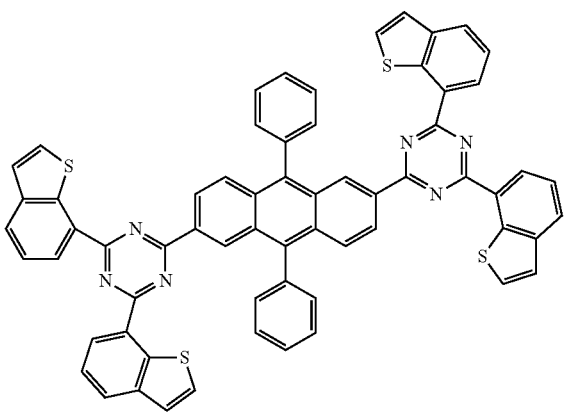
131
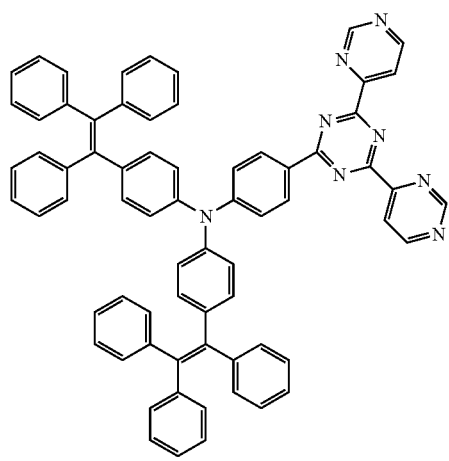
132
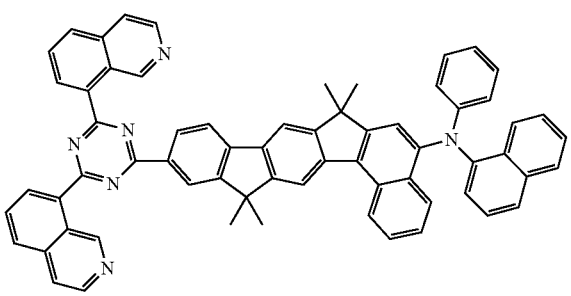
133

-continued
134 135
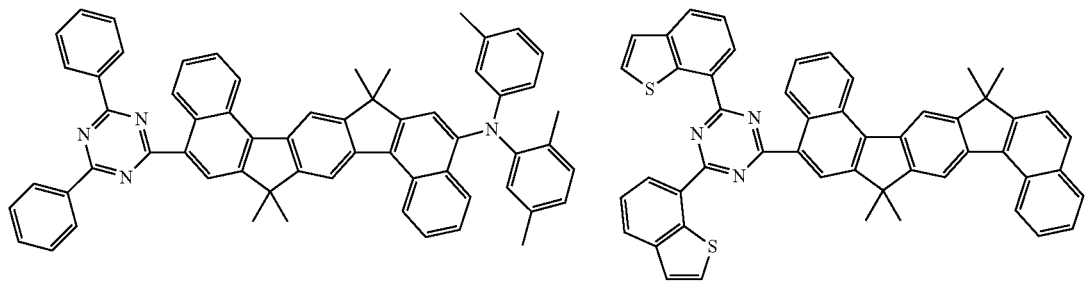
136 137
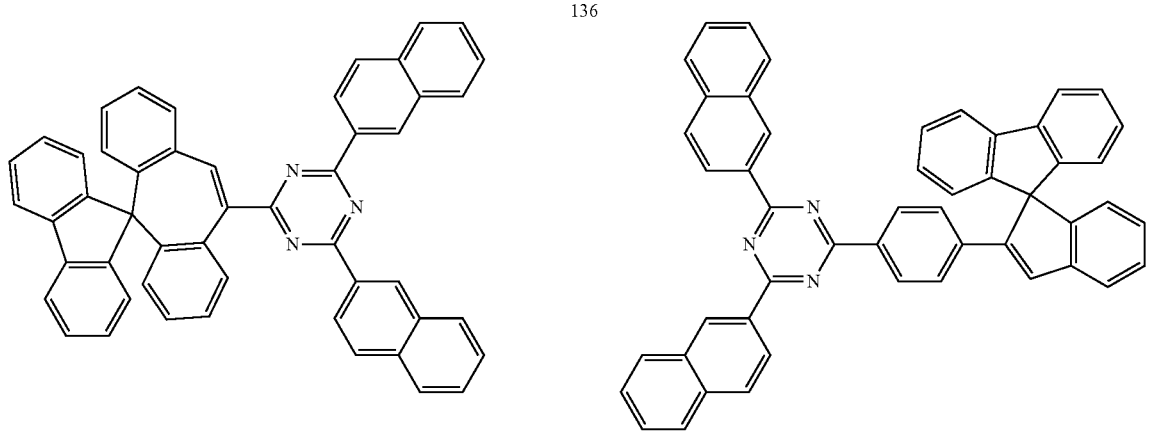
138 139
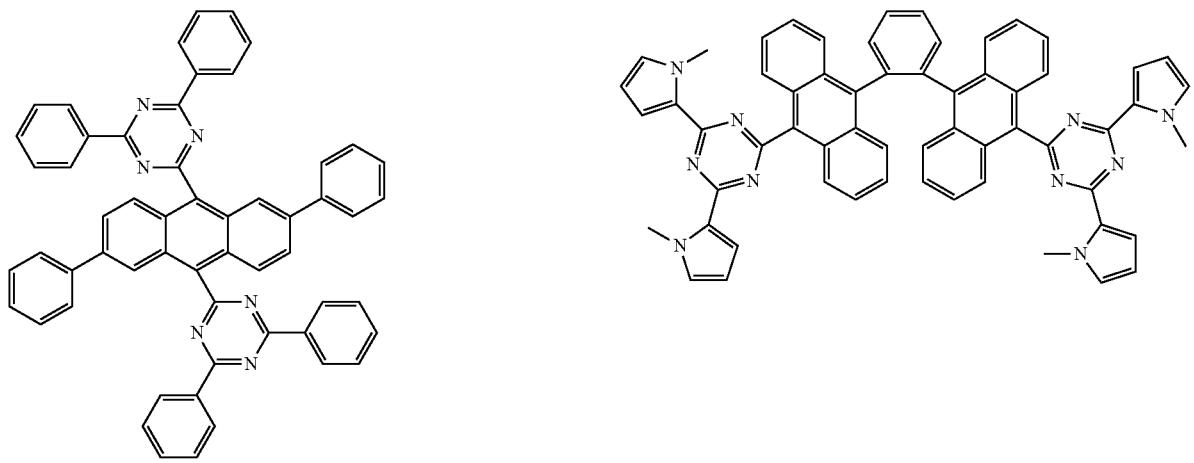
140 141
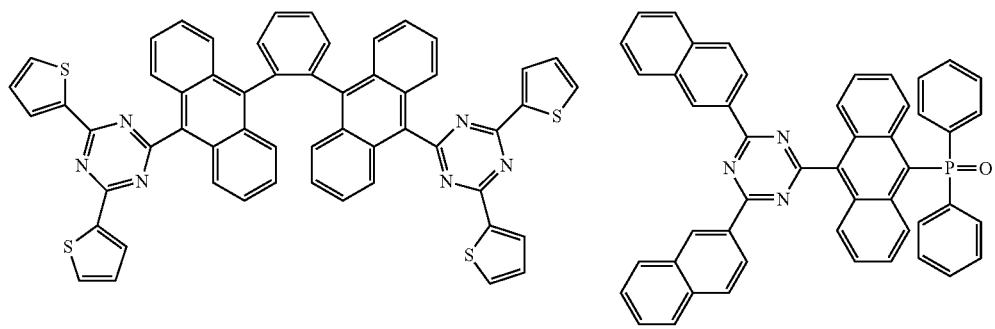

142
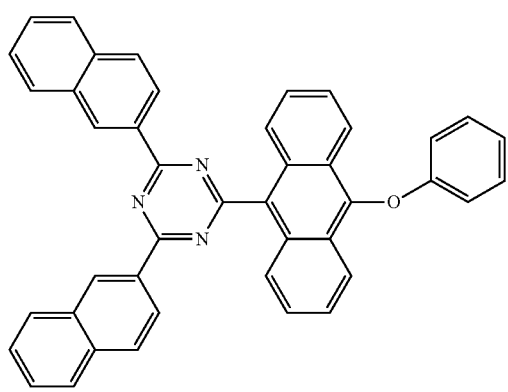
143
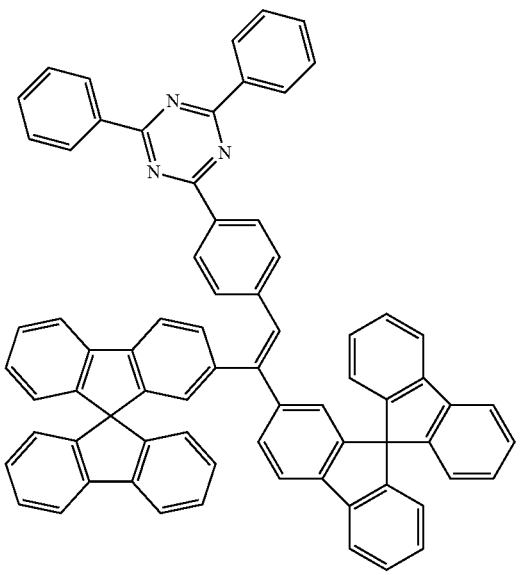
144
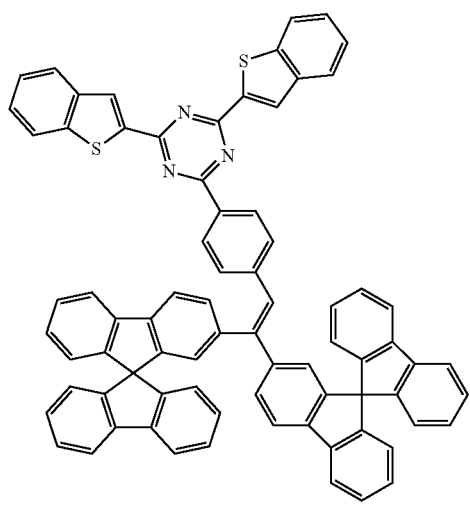
145
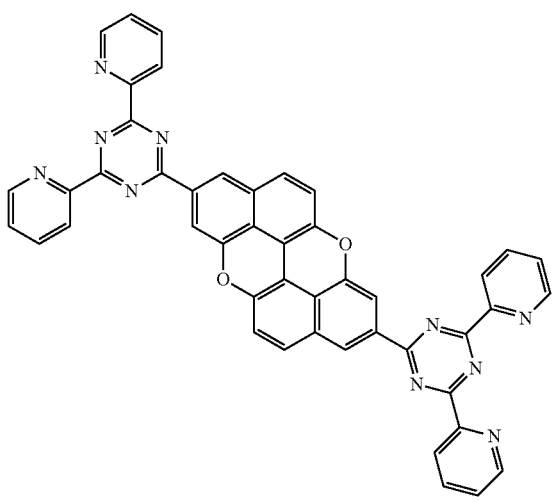
146
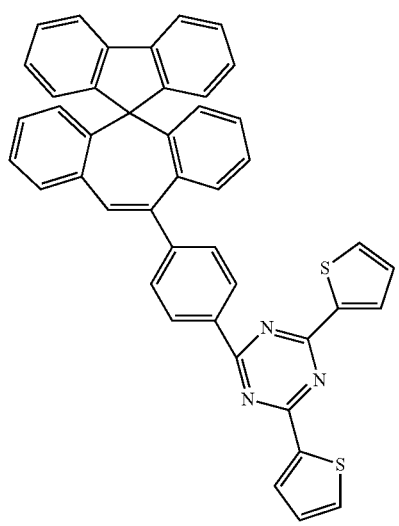

-continued
147
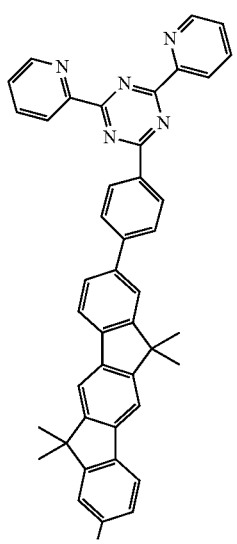
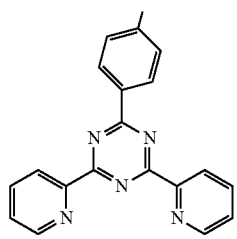
148
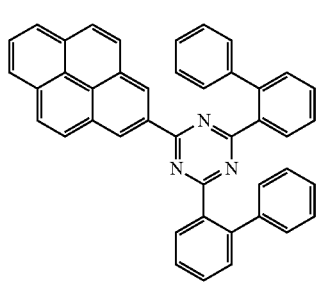
149
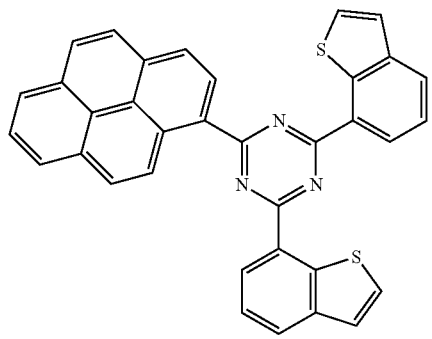
150
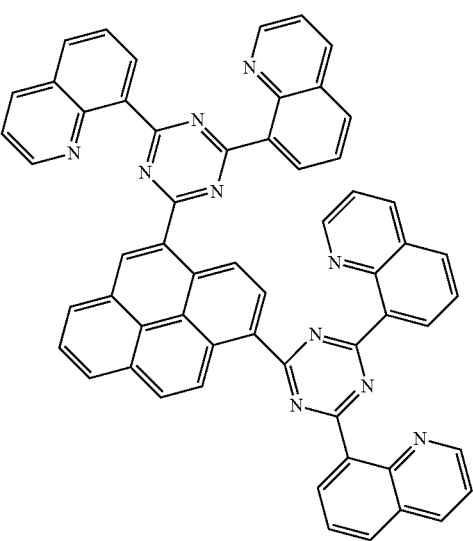

-continued
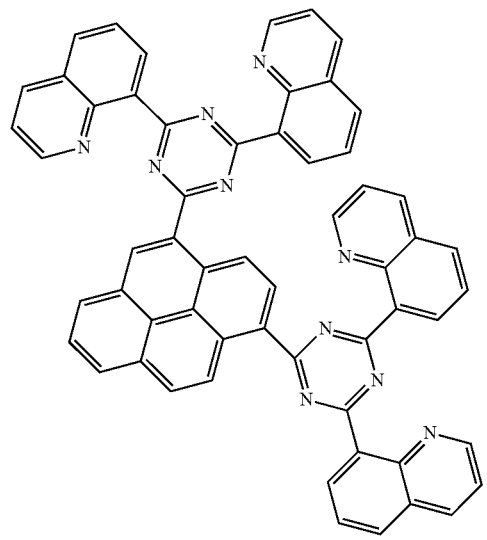
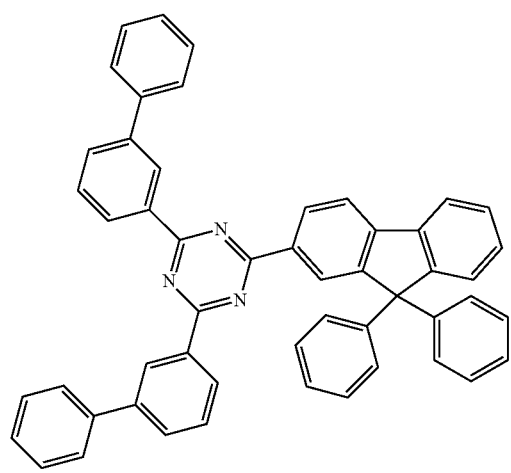
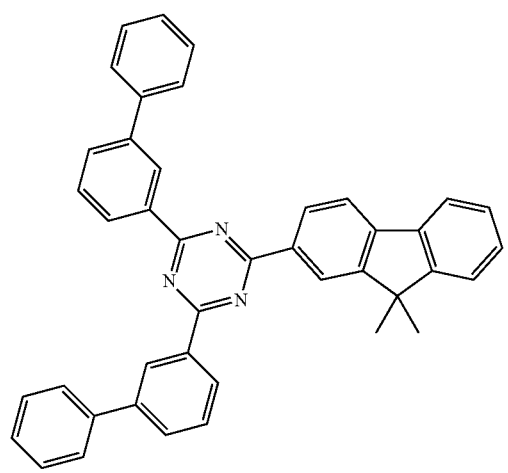
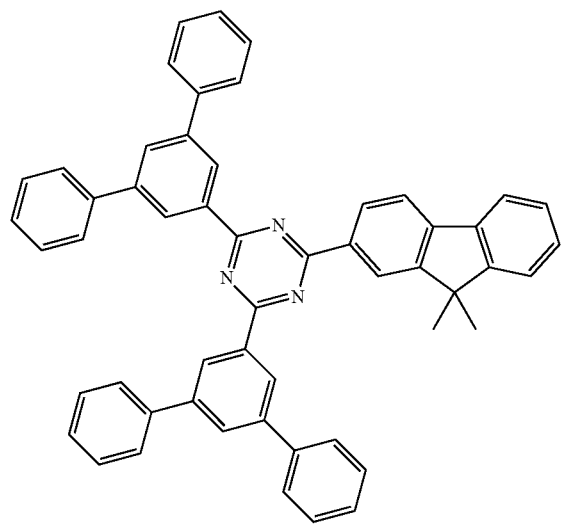
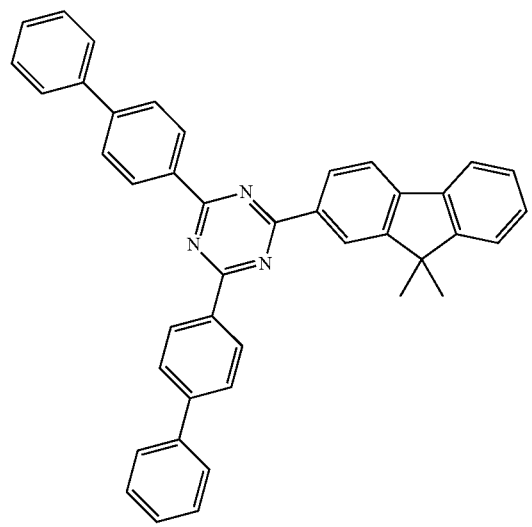

155
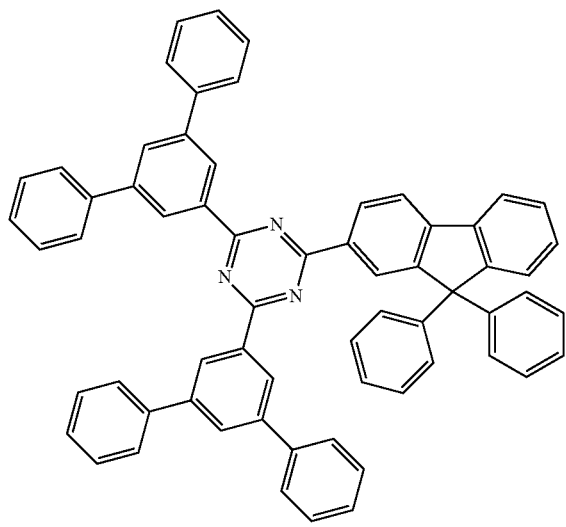
156
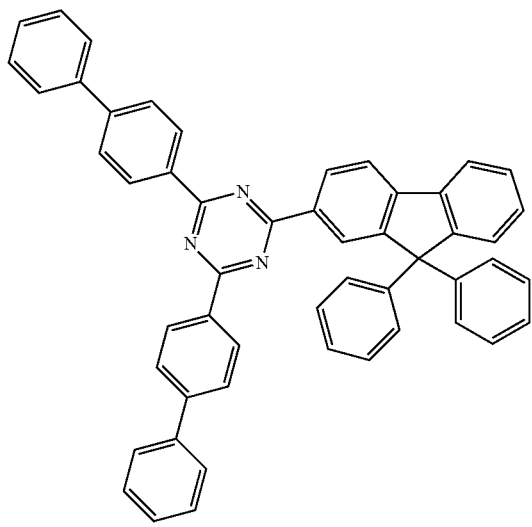
157
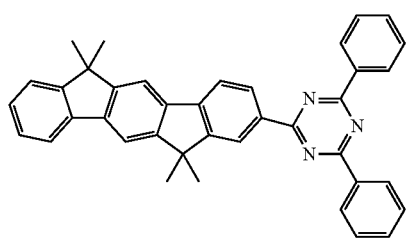
158
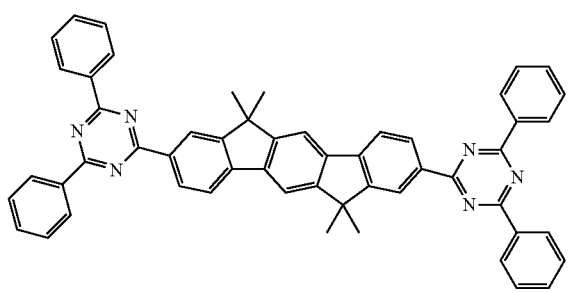
159
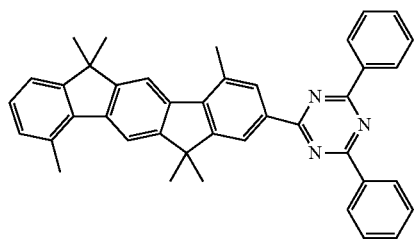
160
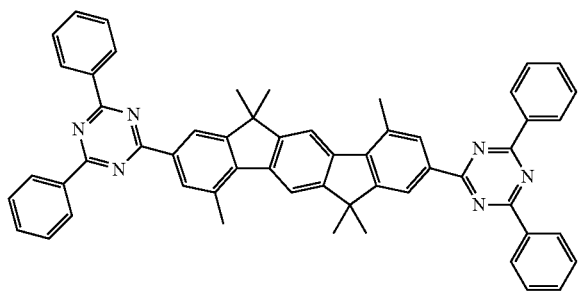

-continued
161
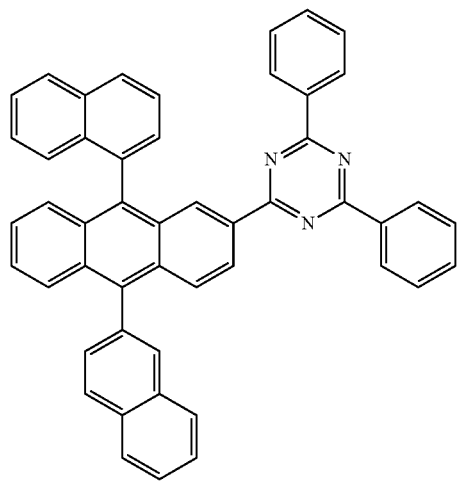
162
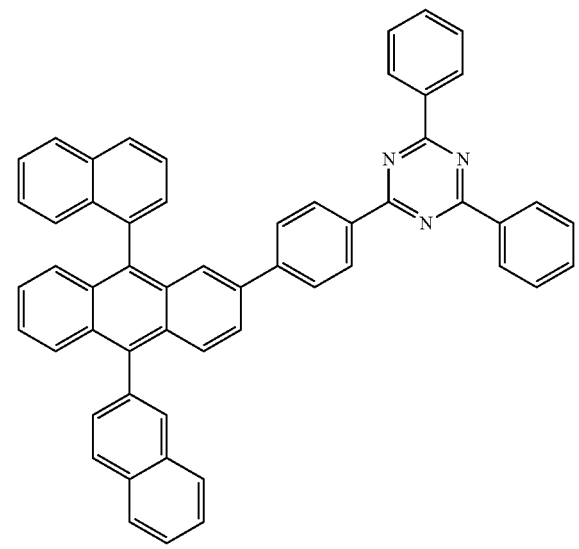
163
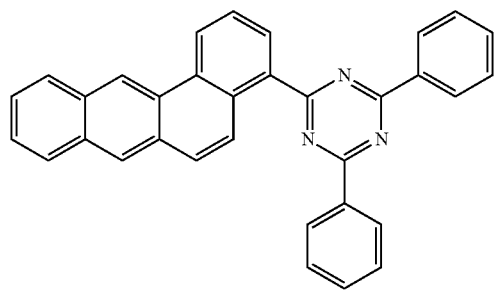
164
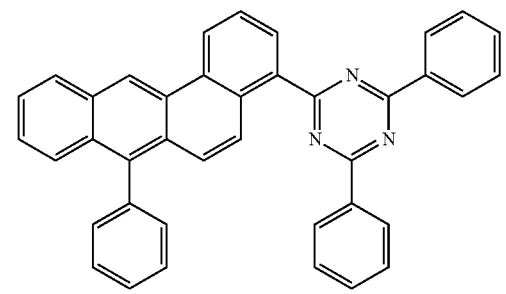
165
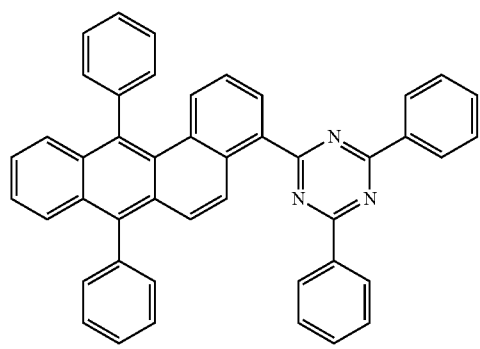
166
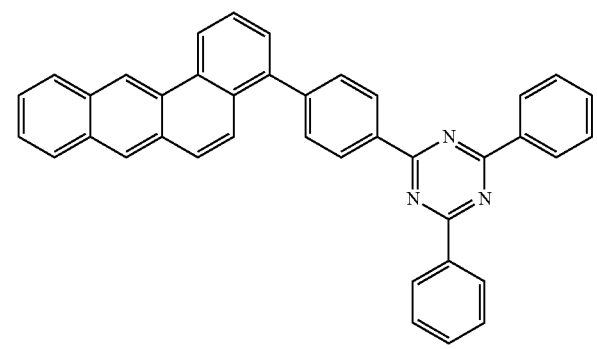
167
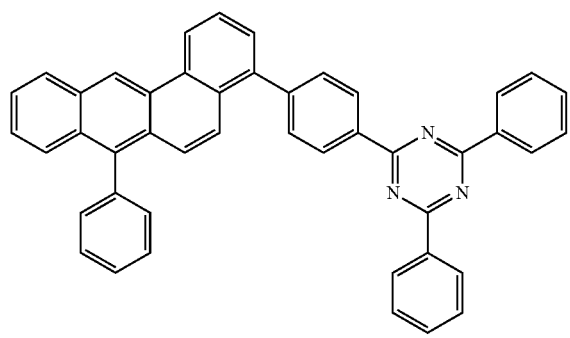
168
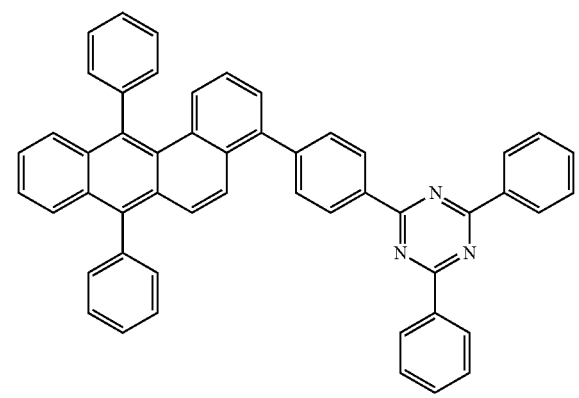

-continued
169
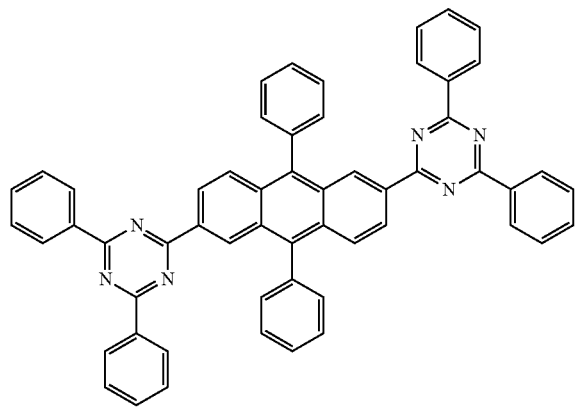
170
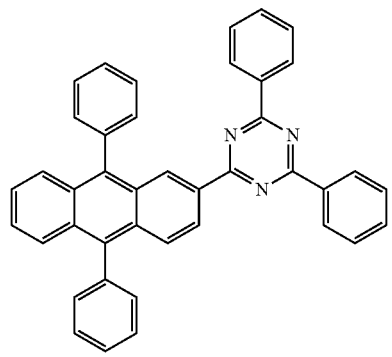
171
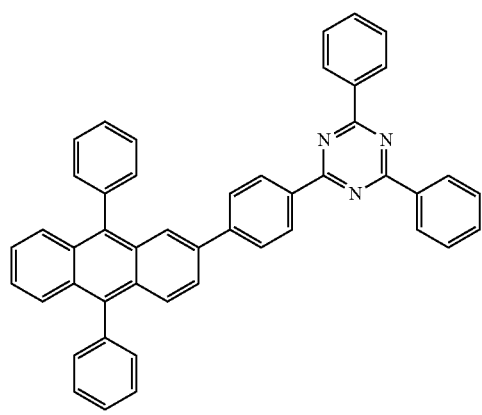
172
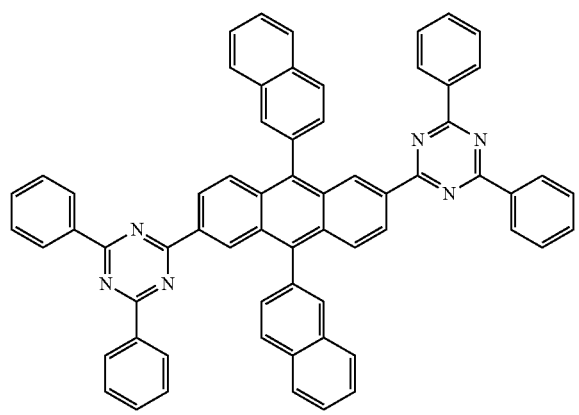
173
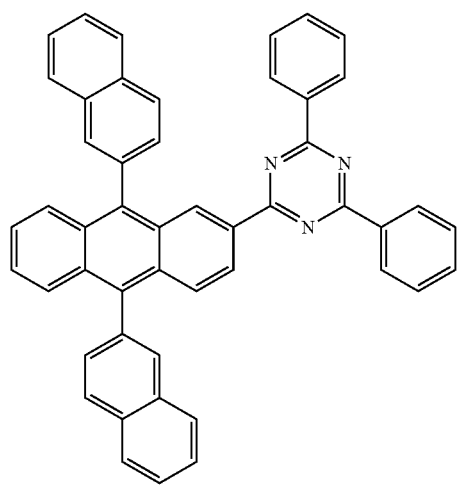
174
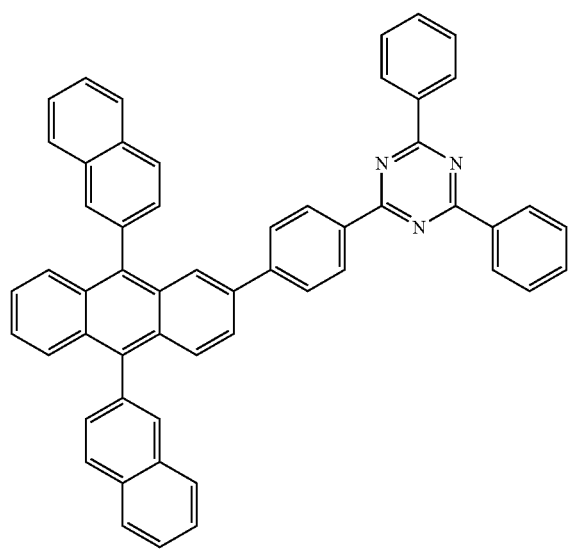

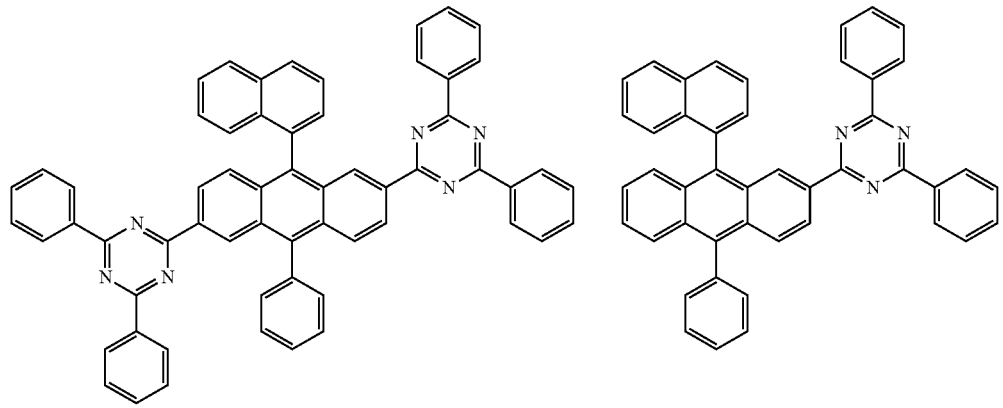

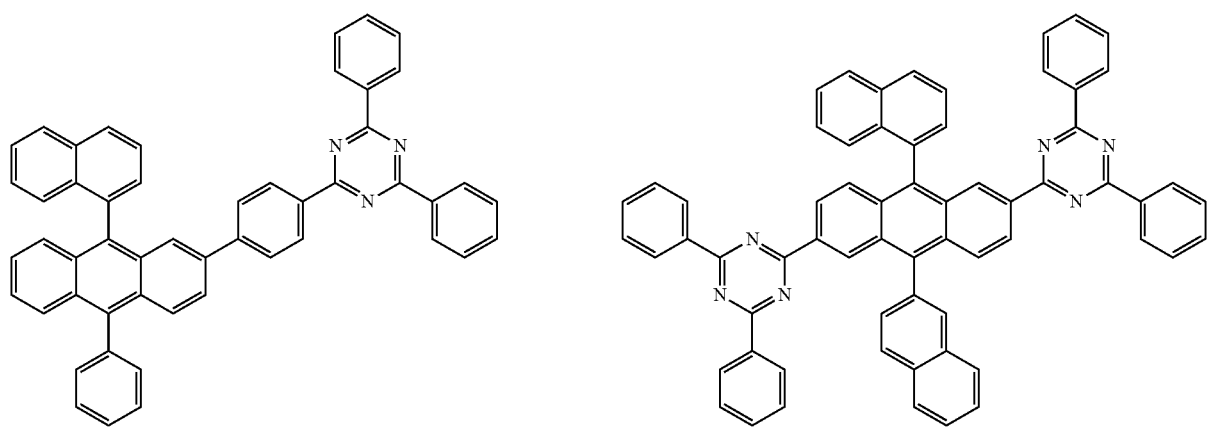

The triazine compounds mentioned above can be synthesised, for example, in accordance with the processes described in U.S. Pat. Nos. 6,229,012, 6,225,467, WO 05/053055 and in the unpublished application DE 102008036982.9. In general, nucleophilic aromatic substitution reactions and metal-catalysed coupling reactions, in particular the Suzuki coupling, are suitable for the synthesis of the compounds, as shown in scheme 1 below for the example of the triazine. Thus, for example, an aromatic Grignard compound can react with 1,3,5-trichlorotriazine in a nucleophilic aromatic substitution reaction, giving, depending on the stoichiometric ratio, the monoaryl-, diaryl- or triaryltriazine. Furthermore, for example, an aromatic compound which is in each case substituted by a boronic acid or a boronic acid derivative can be coupled with palladium catalysis to the triazine, which is substituted by one reactive leaving group for compounds of the formulae (1) and (11) and by two reactive leaving groups for compounds of the formulae (2) and (12). Suitable reactive leaving groups are, for example, halogens, in particular chlorine, bromine or iodine, triflate or tosylate. A further suitable synthetic method is the trimerisation of aromatic nitrites. These synthetic methods are generally known to the person skilled in the art of organic synthesis and can be applied by him without inventive step to the triazine compounds of the formulae (11) and (12).

Scheme 1:

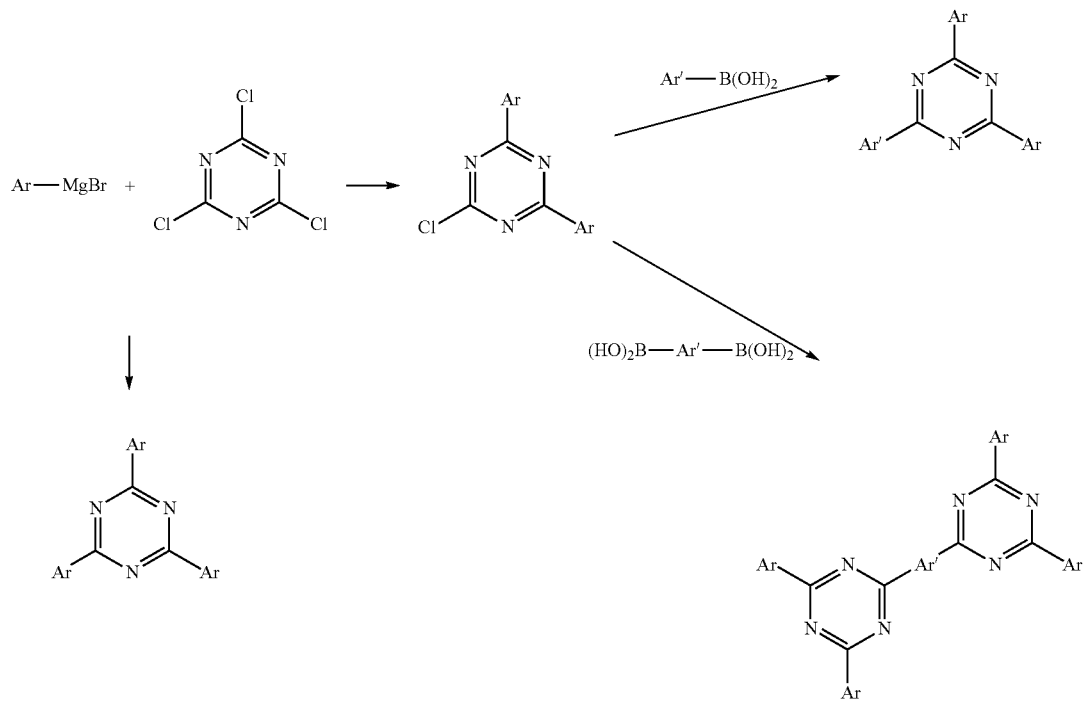

Ar, Ar' = aromatic or heteroaromatic ring system

The triazine derivatives mentioned above are employed in accordance with the invention in combination with an organic alkali-metal compound in the electron-transport layer of an organic electroluminescent device. "In combination with an organic alkali-metal compound" here means that the triazine derivative and the alkali-metal compound are either in the form of a mixture in one layer or separately in two successive layers. In a preferred embodiment of the invention, the triazine derivative and the organic alkali-metal compound are in the form of a mixture in one layer.

For the purposes of this invention, an organic alkali-metal compound is intended to be taken to mean a compound which contains at least one alkali metal, i.e. lithium, sodium, potassium, rubidium or caesium, and which furthermore contains at least one organic ligand.

Suitable organic alkali-metal compounds are, for example, the compounds disclosed in WO 07/050,301, WO 07/050,334 and EP 1144543. These are incorporated into the present application by way of reference.

Preferred organic alkali-metal compounds are the compounds of the following formula (40):

formula (40)

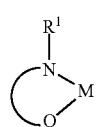

where $R^1$ has the same meaning as described above, the curved line represents two or three atoms and bonds which are necessary to make up a 5- or 6-membered ring with M, where these atoms may also be substituted by one or more radicals $R^1$, and M represents an alkali metal selected from lithium, sodium, potassium, rubidium and caesium.

It is possible here for the complex of the formula (40) to be in monomeric form, as depicted above, or for it to be in the form of aggregates, for example comprising two alkali-metal ions and two ligands, four alkali-metal ions and four ligands, six alkali-metal ions and six ligands or other aggregates.

Preferred compounds of the formula (40) are the compounds of the following formulae (41) and (42):

formula (41)

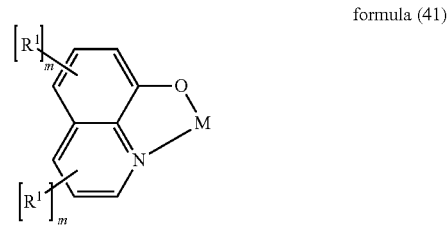

formula (42)

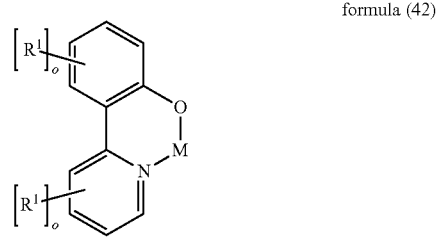

where the symbols and indices used have the meanings given above.

Further preferred organic alkali-metal compounds are the compounds of the following formula (43):

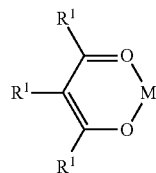

formula (43)

where the symbols used have the same meaning as described above.

The alkali metal is preferably selected from lithium, sodium and potassium, particularly preferably lithium and sodium, very particularly preferably lithium.

Particular preference is given to a compound of the formula (41), in particular where M=lithium. Furthermore, the indices m are very particularly preferably =0. Unsubstituted lithium quinolinate is thus very particularly preferred.

The organic electroluminescent device very particularly preferably comprises a mixture of a triazine compound selected from the compounds of the formulae (7) to (10) given above, in particular where o=0 and $R^2$ is equal to phenyl, 1- or 2-naphthyl, ortho-, meta- or para-biphenyl or 2-spirobifluorenyl, and an organic alkali-metal compound of the formula (41), preferably where M=lithium, in particular unsubstituted lithium quinolinate.

Examples of suitable organic alkali-metal compounds are structures 179 to 223 shown in the following table.

179

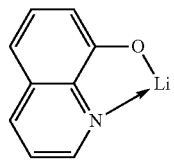

180

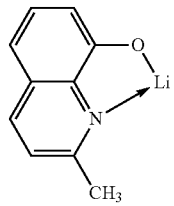

181

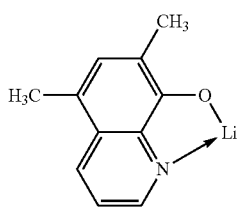

182

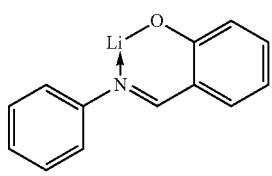

-continued

183

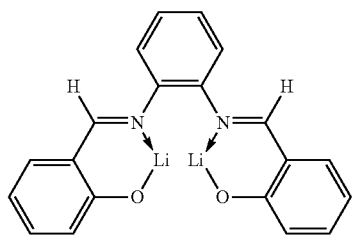

184

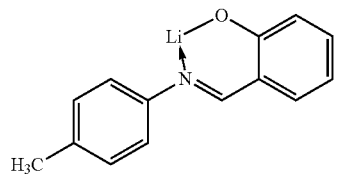

185

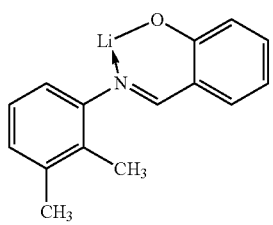

186

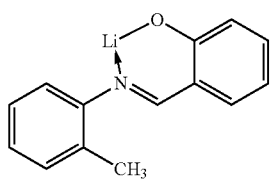

187

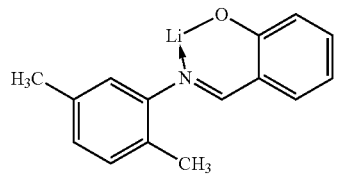

188

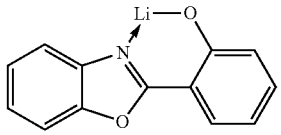

189

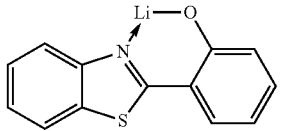

190

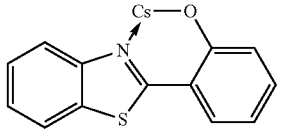

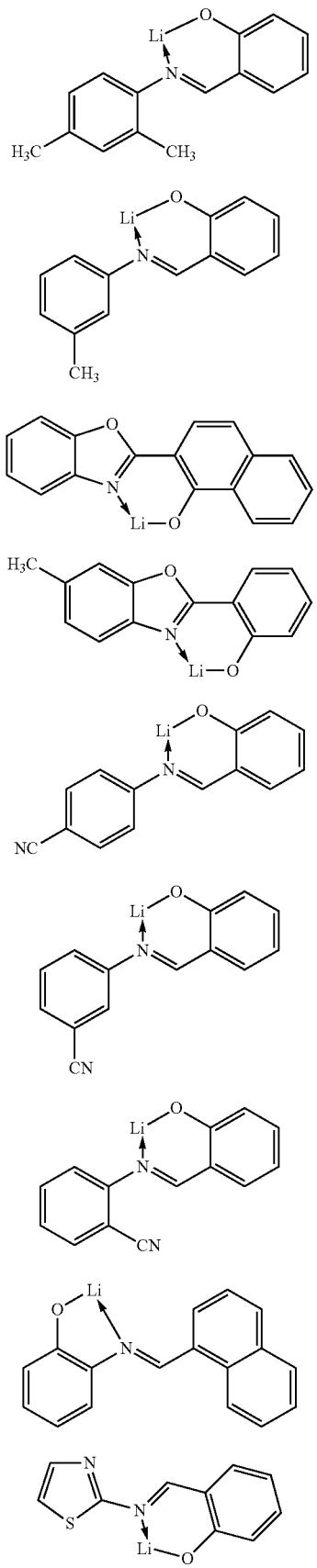
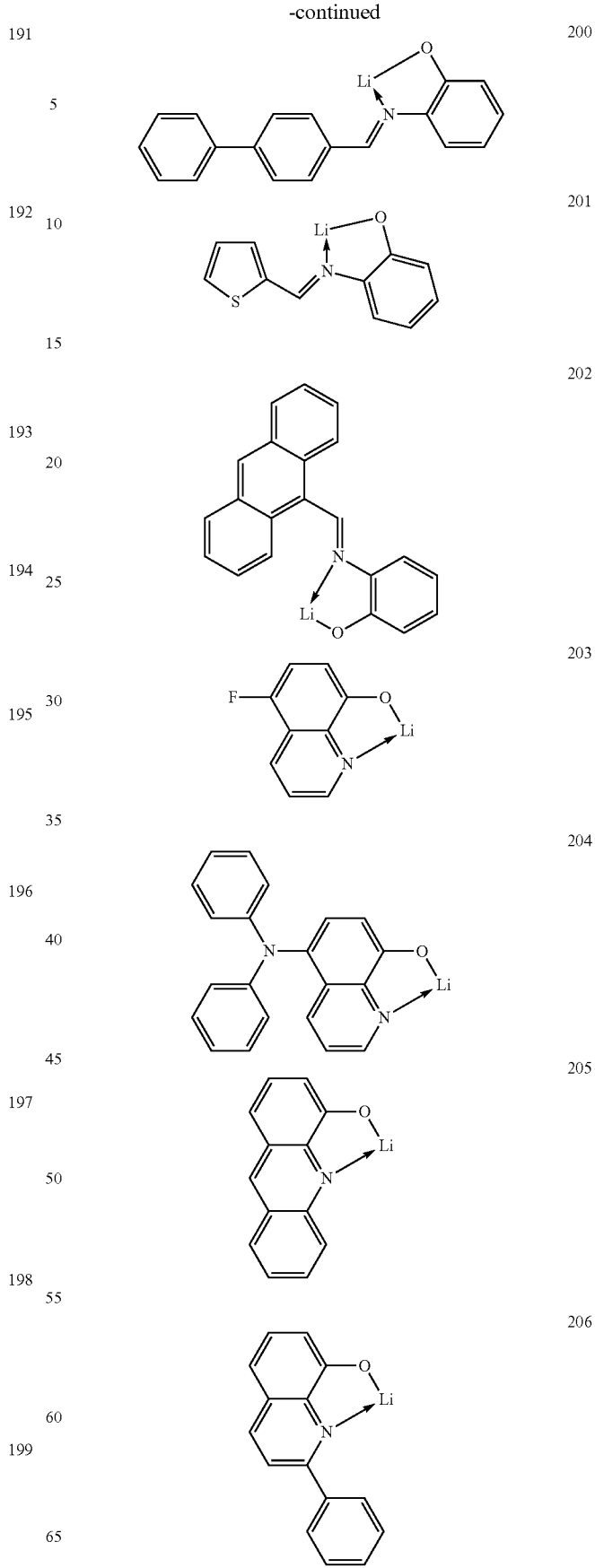

-continued

| | |
|---|---|
| 207 | |
| 208 | |
| 209 | |
| 210 | |
| 211 | |
| 212 | |
| 213 | |

-continued

| | |
|---|---|
| 214 | |
| 215 | |
| 216 | |
| 217 | |
| 218 | |
| 219 | |
| 220 | |

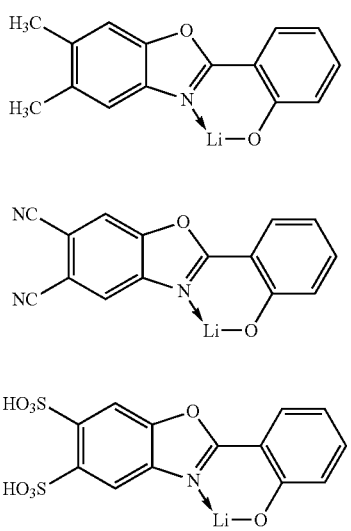

If the triazine compound and the organic alkali-metal compound are in the form of a mixture, the ratio of the triazine compound of the formula (11) or (12) to the organic alkali-metal compound is preferably 20:80 to 80:20, particularly preferably 30:70 to 70:30, very particularly preferably 30:70 to 50:50, in particular 30:70 to 45:55. The organic alkali-metal compound is thus particularly preferably present in a higher proportion than the triazine compound of the formula (11) or (12).

If the triazine compound and the organic alkali-metal compound are in the form of a mixture, the layer thickness of this electron-transport layer is preferably between 3 and 150 nm, particularly preferably between 5 and 100 nm, very particularly preferably between 10 and 60 nm, in particular between 15 and 40 nm.

If the triazine compound and the organic alkali-metal compound are present in two successive layers, the layer thickness of the layer which comprises the triazine compound of the formula (11) or (12) is preferably between 3 and 150 nm, particularly preferably between 5 and 100 nm, very particularly preferably between 10 and 60 nm, in particular between 15 and 40 nm. The layer thickness of the layer which comprises the organic alkali-metal compound and which is arranged between the triazine layer and the cathode is preferably between 0.5 and 20 nm, particularly preferably between 1 and 10 nm, very particularly preferably between 1 and 5 nm, in particular between 1.5 and 3 nm.

The emitting layer here can be a fluorescent or phosphorescent layer. In general, all known emitting materials and layers are suitable in combination with the electron-transport layer according to the invention, and the person skilled in the art will be able, without inventive step, to combine any desired emitting layers with the electron-transport layer according to the invention.

Apart from the cathode, anode, one or more emitting layers and the electron-transport layer according to the invention, the organic electroluminescent device may also comprise further layers. These are selected, for example, from in each case one or more hole-injection layers, hole-transport layers, hole-blocking layers, electron-injection layers, electron-blocking layers, exciton-blocking layers, charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*) and/or organic or inorganic p/n junctions. In addition, interlayers which control the charge balance in the device may be present. Furthermore, the layers, in particular the charge-transport layers, may also be doped. Doping of the layers may be advantageous for improved charge transport. However, it should be pointed out that each of these layers does not necessarily have to be present, and the choice of layers is always dependent on the compounds used.

In a further preferred embodiment of the invention, the organic electroluminescent device comprises a plurality of emitting layers. These emission layers particularly preferably have in total a plurality of emission maxima between 380 nm and 750 nm, resulting overall in white emission, i.e. various emitting compounds which are able to fluoresce or phosphoresce and which emit blue and yellow, orange or red light are used in the emitting layers. Particular preference is given to three-layer systems, i.e. systems having three emitting layers, where the three layers exhibit blue, green and orange or red emission (for the basic structure, see, for example, WO 05/011013). The use of more than three emitting layers may also be preferred. Emitters which have broad-band emission bands and thus exhibit white emission are likewise suitable for white emission.

The electron-transport layers according to the invention can be employed with any desired cathode materials, as used in accordance with the prior art. Examples of particularly suitable cathode materials are generally metals having a low work function, followed by a layer of aluminium or a layer of silver. Examples thereof are caesium, barium, calcium, ytterbium and samarium, in each case followed by a layer of aluminium or silver. An alloy of magnesium and silver is furthermore suitable. Pure aluminium is furthermore suitable.

It is furthermore possible to introduce an electron-injection layer between the electron-transport layer according to the invention and the cathode. Suitable materials for the electron-injection layer are, for example, LiF, lithium quinolinate, CsF, $Cs_2CO_3$, $Li_2O$, $LiBO_2$, $K_2SiO_3$, $Cs_2O$ or $Al_2O_3$.

Preference is furthermore given to an organic electroluminescent device, characterised in that one or more layers are applied by means of a sublimation process, in which the materials are applied by vapour deposition in vacuum sublimation units at an initial pressure of usually less than $10^{-5}$ mbar, preferably less than $10^{-6}$ mbar. However, it should be noted that the pressure may also be even lower, for example less than $10^{-7}$ mbar.

Preference is likewise given to an organic electroluminescent device, characterised in that one or more layers are applied by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and are thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing. Soluble compounds are necessary for this purpose. High solubility can be achieved by suitable substitution of the compounds. It is possible here to apply not only solutions of individual materials, but also solutions which comprise a plurality of compounds, for example matrix materials and dopants.

The organic electroluminescent device can also be produced as a hybrid system by applying one or more layers from solution and applying one or more other layers by vapour deposition. Thus, for example, it is possible to apply an emitting layer from solution and to apply an electron-transport layer comprising a compound of the formula (1), (2), (11) or (12) on top, optionally in combination with an organic alkali-metal compound, by vacuum vapour deposition.

These processes are generally known to the person skilled in the art and can be applied by him without problems to organic electroluminescent devices comprising compounds of the formula (1), (2), (11) or (12) or the preferred embodiments mentioned above.

The present invention furthermore relates to mixtures comprising at least one compound of the formula (11) or (12) and at least one organic alkali-metal compound. The compounds of the formula (11) or (12) here are preferably selected from the preferred embodiments mentioned above. The organic alkali-metal compound here is preferably selected from the compounds of the formulae (40) to (43) mentioned above.

The present invention still furthermore relates to the use of compounds of the formula (11) or formula (12) as electron-transport material in an electron-transport layer in an organic electroluminescent device in combination with an organic alkali-metal compound. The compounds of the formulae (11) and (12) here are preferably selected from the preferred embodiments mentioned above. The organic alkali-metal compound here is preferably selected from the compounds of the formulae (40) to (43) given above.

The compounds of the formulae (11) and (12) given above in which Ar² and Ar³ stand for groups of the formulae (15) to (27) and (32) to (39) respectively are novel and are therefore likewise a subject-matter of the present invention. The invention furthermore relates to an organic electroluminescent device comprising one or more of the compounds of the formulae (11) and (12) given above in which Ar² and Ar³ stand for a group of the formulae (15) to (27) and (32) to (39) respectively, in particular in an electron-transport layer. The electron-transport layer here may be doped or undoped. The layer is preferably doped, in particular by an organic alkali-metal compound. Preferred embodiments of these materials here are the embodiments mentioned above.

The organic electroluminescent devices according to the invention have the following surprising advantages over the prior art:

1. The organic electroluminescent devices according to the invention have very high efficiency. The improved efficiency is possibly attributable to improved electron injection from the electron-transport layer into the emitting layer.
2. The organic electroluminescent devices according to the invention simultaneously have a comparable lifetime.
3. The organic electroluminescent devices according to the invention simultaneously have a reduced operating voltage. The reduced operating voltage is possibly attributable to improved electron injection from the electron-transport layer into the emitting layer.

The invention is described in greater detail by the following examples without wishing to restrict it thereby. The person skilled in the art will be able, without an inventive step, to prepare further compounds according to the invention and to use them in organic electronic devices.

EXAMPLES

The following syntheses are carried out under a protective-gas atmosphere in dried solvents, unless indicated otherwise. The starting materials can be purchased from ALDRICH (tri-o-tolylphosphine, palladium(II) acetate). Spiro-9,9'-bifluorene-2-boronic acid can be prepared in accordance with the unpublished application DE 102008036982.9. 2-Chlorocarbonyl-2',7'-dibromospiro-9,9'-bifluorene can be prepared as described in *J. Org. Chem.* 2006, 71, 456-465.

Example 1

Synthesis of 2-(4,6-bis[3,1';5,1"]terphen-1-yl)-1,3,5-triazin-2-yl)spiro-9,9'-bifluorene

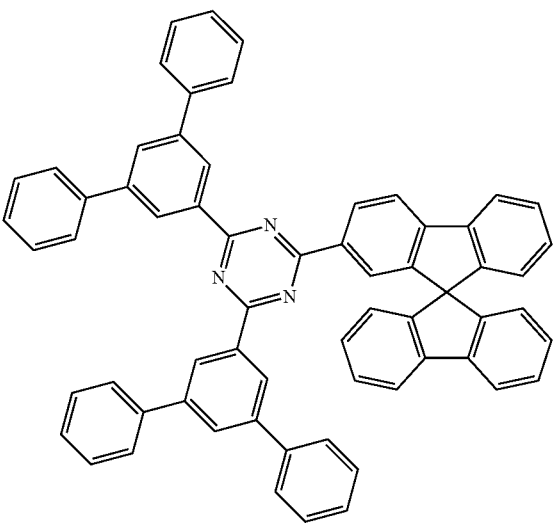 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1]

a) Synthesis of 2-chloro-(4,6-bis[3,1'5,1"]terphen-1-yl)-1,3,5-triazine 82.6 ml of a 2.0 molar solution of n-butyllithium in hexane were slowly added dropwise to a solution, cooled to −78° C., of 50.30 g (163 mmol) of 1-bromo-[3,1';5,1"]terphen-1-yl in 400 ml of abs. tetrahydrofuran, and the mixture was stirred for 15 min. The reaction solution was slowly added dropwise to a solution, cooled to −78° C., of 10.00 g (45 mmol) of cyanuric chloride in 400 ml of abs. tetrahydrofuran, and the cooling was removed. When RT had been reached, the precipitated product was filtered off. The yield was 21.08 g (37 mmol), corresponding to 67.9% of theory.

b) Synthesis of 2-(4,6-bis[3,1';5,1"]terphen-1-yl)-1,3,5-triazin-2-yl)-spiro-9,9'-bifluorene 17.46 g (48 mmol) of spiro-9,9'-bifluorene-2-boronic acid, 21.06 g (37 mmol) of 2-chloro-(4,6-bis[3,1';5,1"]terphen-1-yl)-1,3,5-triazine and 21.4 g (101 mmol) of tripotassium phosphate are suspended in 1200 ml of toluene, 1200 ml of dioxane and 480 ml of water. 438 mg (1.4 mmol) of tri-o-tolylphosphine and then 54 mg (0.3 mmol) of palladium(II) acetate are added to this suspension, and the reaction mixture is heated under reflux for 16 h. After cooling, the organic phase is separated off, filtered through silica gel, washed three times with 500 ml of water and subsequently evaporated to dryness. The residue is recrystallised from toluene and finally sublimed in a high vacuum. The yield is 20.21 g (24 mmol), corresponding to 64.4% of theory.

Example 2

Synthesis of 2-(4,6-bis(3-([3,1';5,1"]terphen-1-yl)phen-1-yl)-1,3,5-triazin-2-yl)spiro-9,9'-bifluorene

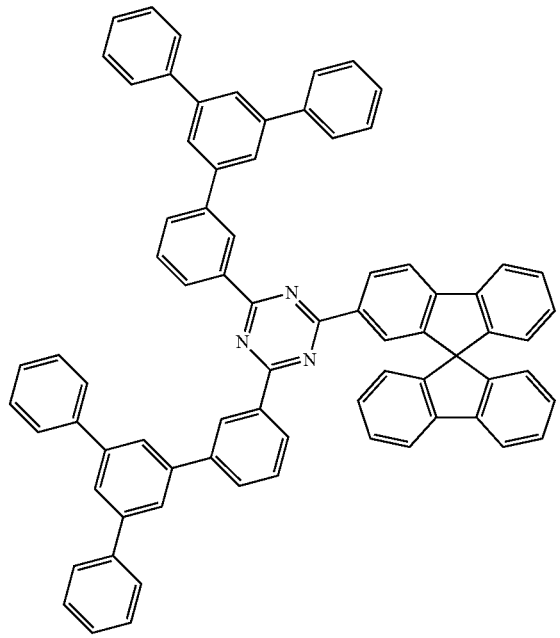 [SMILES: c1ccc(-c2cc(-c3ccccc3)cc(-c3cccc(-c4nc(-c5cccc(-c6cc(-c7ccccc7)cc(-c7ccccc7)c6)c5)nc(-c5ccc6c(c5)C5(c7ccccc7-c7ccccc75)c5ccccc5-6)n4)c3)c2)cc1]

a) Synthesis of 1-bromo-3-([3,1';5,1"]terphen-1-yl)phenyl 40.0 g (146 mmol) of 3-boronyl-[3,1',5,1"]terphenyl, 18.8 g (146 mmol) of 1-iodo-3-bromobenzene and 109.3 g (730 mmol) of potassium carbonate are suspended in 1350 ml of toluene and 1150 ml of water. 844 mg (0.73 mmol) of palladium(0) tetrakis(triphenylphosphine) are added to this suspension, and the reaction mixture is heated under reflux for 16 h. After cooling, the organic phase is separated off, washed three times with 200 ml of water, dried using sodium sulfate and subsequently evaporated to dryness. The residue is washed with ethanol and recrystallised from ethyl acetate and finally dried under reduced pressure. The yield is 47.6 g (123 mmol), corresponding to 84.5% of theory.

b) Synthesis of 2-chloro-4,6-bis(3-([3,1';5,1"]terphen-1-yl)phen-1-yl)-1,3,5-triazine The synthesis is carried out analogously to Example 1, with 1-bromo-[3,1';5,1"]terphen-1-yl being replaced by 43.88 g (143 mmol) of 1-bromo-3-([3,1';5,1"]terphen-1-yl)phenyl. The yield is 6.30 g (9.0 mmol), corresponding to 23.3% of theory.

c) Synthesis of 2-(4,6-bis(3-([3,1';5,1"]terphen-1-yl)phen-1-yl)-1,3,5-triazin-2-yl)spiro-9,9% bifluorene The synthesis is carried out analogously to Example 1 using 4.07 g (11.3 mmol) of spiro-9,9'-bifluorene-2-boronic acid, with 2-chloro-(4,6-bis[3,1',5,1"]terphen-1-yl)-1,3,5-triazine being replaced by 6.30 g (9.0 mmol) of 2-chloro-4,6-bis(3-([3,1';5,1"]terphen-1-yl)phen-1-yl)-1,3,5-triazine. The yield is 4.9 g (4.8 mmol), corresponding to 56.3% of theory.

Example 3

Synthesis of 2-(4,6-diphenyl-1,3,5-triazin-2-yl)-2',7'-bis-([3,1';5,1"]terphen-1-yl)spiro-9,9'-bifluorene

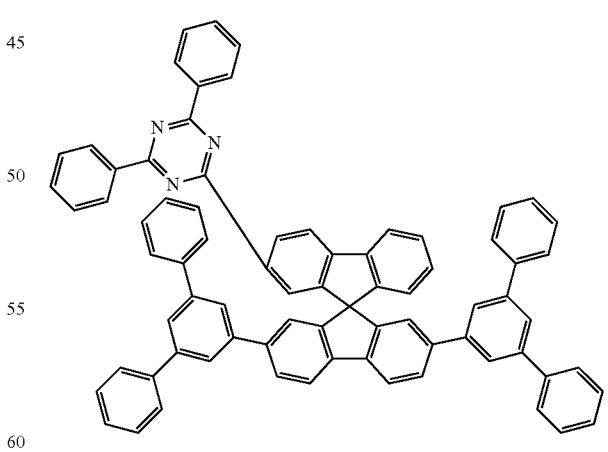

a) Synthesis of 2-(4,6-diphenyl-1,3,5-triazin-2-yl)-2',7'-dibromospiro-9,9'-bifluorene 47.90 g (89 mmol) of 2-chlorocarbonyl-2',7'-dibromospiro-9,9'-bifluorene, 11.90 g (89 mmol) of aluminium trichloride and 1.9 ml (27 mmol) of thionyl chloride were suspended in 260 ml of dichlorobenzene in a flask. 19.3 ml (187 mmol) of benzonitrile were then added slowly. The reaction mixture was stirred at 100° C. for 1 h. 9.55 g (179 mmol) of ammonium chloride were added, and the batch was stirred at 100° C. for 16 h. After cooling to RT, the reaction solution was added to 3.5 l of methanol, and the mixture was stirred for 45 min. The precipitated solid was filtered off and recrystallised from toluene. The yield was 18.8 g (26.7 mmol), corresponding to 29.8% of theory.

b) Synthesis of 2-(4,6-diphenyl-1,3,5-triazin-2-yl)-2', 7'-bis([3,1';5,1"]-terphen-1-yl)spiro-9,9'-bifluorene The synthesis is carried out analogously to Example 1, with spiro-9,9'-bifluorene-2-boronic acid being replaced by 10.65 g (38.9 mmol) of [3,1';5,1"]terphen-1-ylboronic acid and 2-chloro-(4,6-bis[3,1';5,1"]terphen-1-yl)-1,3,5-triazine being replaced by 11.42 g (16.2 mmol) of 2-(4,6-diphenyl-1, 3,5-triazin-2-yl)-2',7'-dibromospiro-9,9'-bifluorene. The yield is 14.62 g (14.6 mmol), corresponding to 89.7% of theory.

Examples 4 to 17

Production of OLEDs

OLEDs according to the invention and OLEDs in accordance with the prior art are produced by a general process in accordance with WO 04/058911, which is adapted to the circumstances described here (layer-thickness variation, materials used).

In Examples 4 to 17 below (see Table 2), the results for various OLEDs are presented. Glass flakes coated with structured ITO (indium tin oxide) in a thickness of 150 nm form the substrates of the OLEDs. For improved processing, 20 nm of PEDOT (spin-coated from water; purchased from H. C. Starck, Goslar, Germany; poly(3,4-ethylenedioxy-2,5-thiophene)) is applied to the substrate. The OLEDs consist of the following layer sequence: substrate/PEDOT 20 nm/hole-injection layer (HIL1) 5 nm/hole-transport layer (HTM1) 140 nm/NPB 20 nm/emission layer (EML) 30 nm/electron-transport layer (ETM) 20 nm and finally a cathode. The materials used for the production of the OLEDs are shown in Table 1.

All materials apart from PEDOT are applied by thermal vapour deposition in a vacuum chamber. The emission layer here always consists of a matrix material (host) and a dopant, which is admixed with the host by co-evaporation. In Examples 4 to 17, the matrix material used is compound H1 which is doped in each case with 5% of D1 or 1% of D2. The OLEDs exhibit blue emission. The cathode is formed by an optional electron-injection layer (LiF or LiQ) and an Al layer with a thickness of 100 nm deposited on top.

The OLEDs are characterised by standard methods; for this purpose, the electroluminescence spectra, the current efficiency (measured in cd/A), the power efficiency (measured in lm/W) and the external quantum efficiency (EQE, measured in percent) as a function of the luminance, calculated from current-voltage-luminance characteristic lines (IUL characteristic lines), and the lifetime are determined. The lifetime is defined as the time after which the initial luminance of 6000 $cd/m^2$ has dropped to half. The OLEDs produced in accordance with Examples 4 to 12 shown all have comparable CIE colour coordinates and a comparable lifetime of about 150 h at the initial luminance indicated. This corresponds to about 5500 h at an initial luminance of 1000 $cd/m^2$ using the extrapolation formulae known to the person skilled in the art as a basis. In Examples 13 and 14, the lifetime at an initial luminance of 6000 $cd/m^2$ is about 110 h, which corresponds to a lifetime of about 4000 h at 1000 $cd/m^2$. In Examples 15 and 16, the lifetime at an initial luminance of 6000 $cd/m^2$ is about 500 h Example 15) or 540 h (Example 16), which corresponds to a lifetime of about 18,000 h or 19,400 h respectively at 1000 $cd/m^2$. In Example 17, the lifetime at an initial luminance of 6000 $cd/m^2$ is about 300 h, which corresponds to a lifetime of about 11,000 h at 1000 $cd/m^2$.

Table 2 shows the results for some OLEDs (Examples 4 to 17, lifetime values indicated in running text). The electron-transport materials according to the invention are compounds ETM3, ETM4 and ETM5 from Table 1, where the compounds in the electron-transport layer are in some cases in the form of a mixture with LiQ. In Table 2, information such as ETM4:LiQ (40%:60%) means that compound ETM4 is applied in a mixture with LiQ, more precisely in a volume ratio of 40% of ETM4 and 60% of LiQ. A layer of this type is produced analogously to the emission layer by co-evaporation of the two materials. As prior art, electron-transport layers comprising the compounds $Alq_3$, ETM1 (in accordance with WO 08/145,239) and ETM2 (in accordance with WO 03/060956), in some cases likewise mixed with LiQ, are mentioned.

Compared with the prior art, the electroluminescent devices according to the invention comprising ETM3, ETM4 and ETM5 are distinguished, in particular, by significantly increased power efficiency.

If electron-transport layers which are not mixed with LiQ (Examples 4, 5, 8, 10 and 17) are compared, a 14%-increased power efficiency is evident on use of ETM4 (Example 10) compared with the best example in accordance with the prior art (use of ETM2, Example 5). On use of ETM5 (Example 17), an 80%-increased power efficiency is evident compared with the best example in accordance with the prior art (use of ETM2, Example 5). This represents a significant improvement.

On use of electron-transport layers according to the invention consisting of a mixture of a triazine-containing compound with LiQ, much greater improvements can be achieved. Compared with the best value in accordance with the prior art, Example 7, significantly improved power efficiency can be achieved on use of compounds ETM3 and ETM4 according to the invention in a mixture with LiQ. On use of an ETM3:LiQ mixture in the ratio 40% to 60%, an improvement of 10% can be achieved (comparison of Example 7 with Example 12). A further improvement in the power efficiency compared with the prior art to 23% is possible through the use of the electron-transport layer according to the invention consisting of a mixture of ETM4 with LiQ in the ratio 40 to 60% (comparison of Example 7 with Example 11).

A further improvement in the power efficiency of 24% compared with the prior art is possible through the use of the electron-transport layer according to the invention consisting of a mixture of ETM5 with LiQ in the ratio 40 to 60% (comparison of Example 7 with Example 15).

With ETM5, it was found that it was possible to increase the lifetime (not shown in the table) from 300 h at 6000 cd/m$^2$ (Example 17) to 540 h at 6000 cd/m$^2$ (Example 16) using a mixture of ETM5:LiQ (Example 16) compared with ETM5 (Example 17) at the expense of a slightly reduced power efficiency (−12%). This represents a considerable improvement of about 80%.

The electron-transport layers according to the invention also exhibit a major improvement compared with the prior art on use of dopant D2 instead of D1. Dopant D2 differs from D1 essentially through the absence of amine groups and thus a significantly lower HOMO or LUMO level. Compared with an electron-transport layer consisting of ETM1 in accordance with the prior art, an increase in the power efficiency of 70% with virtually unchanged colour coordinates, which represents an extremely high value (comparison of Example 13 with Example 14), can be achieved on use of the ETM4:LiQ (40%:60%) electron-transport layer according to the invention.

TABLE 1

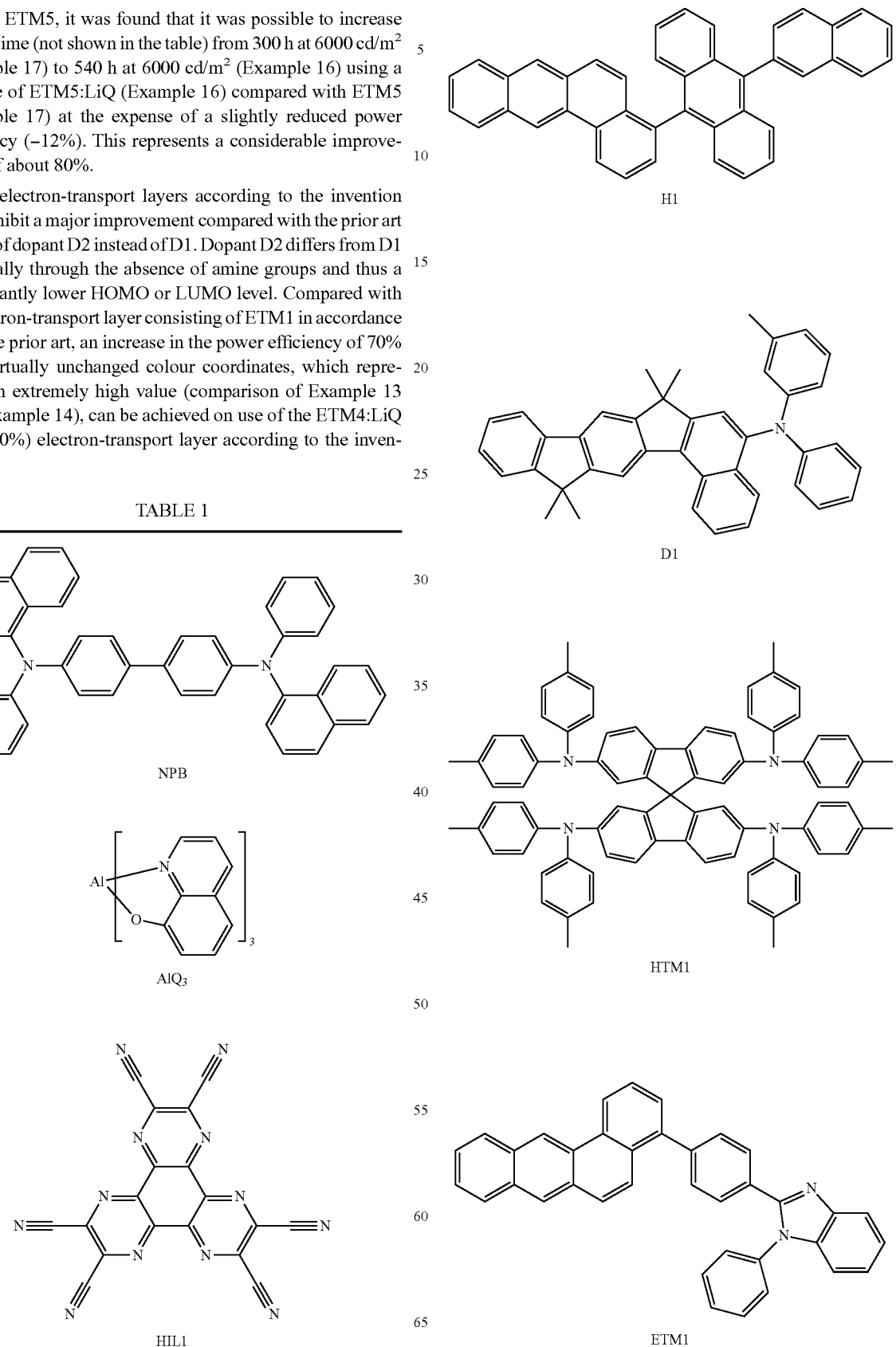

TABLE 1-continued

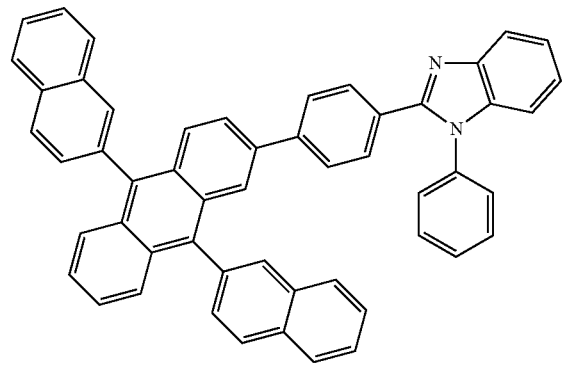

ETM2

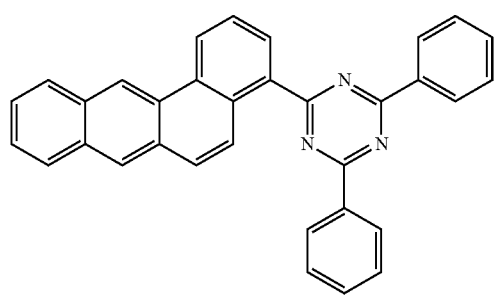

ETM3

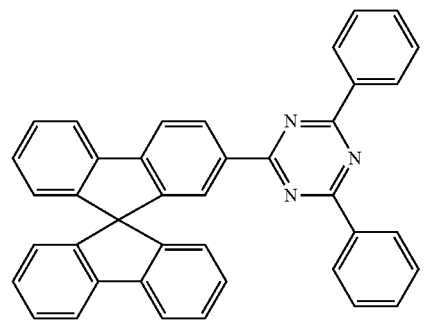

ETM4

TABLE 1-continued

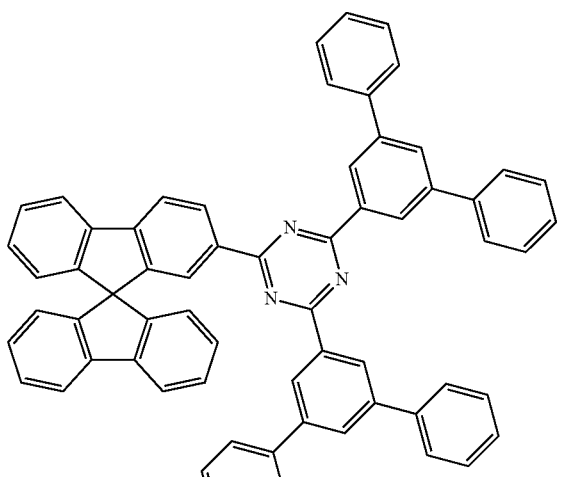

ETM5

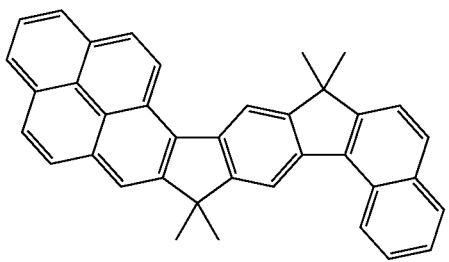

D2

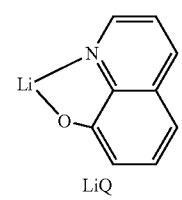

LiQ

TABLE 2

| Ex. | Dopant | ETM | EIM | Voltage for 1000 cd/m² | Efficiency at 1000 cd/m² | Efficiency at 1000 cd/m² | EQE at 1000 cd/m² | CIE x/y at 1000 cd/m² |
|---|---|---|---|---|---|---|---|---|
| 4 comp. | D1 | Alq₃ | LiF 1 nm | 6.4 V | 5.1 cd/A | 2.5 lm/W | 4.2% | 0.142/0.151 |
| 5 comp. | D1 | ETM2 | LiQ 1 nm | 5.4 V | 6.0 cd/A | 3.5 lm/W | 4.9% | 0.139/0.153 |
| 6 comp. | D1 | Alq₃:LiQ (40%:60%) | — | 6.6 V | 5.7 cd/A | 2.7 lm/W | 4.7% | 0.142/0.151 |
| 7 comp. | D1 | ETM2:LiQ (40%:60%) | — | 4.7 V | 8.1 cd/A | 5.4 lm/W | 6.3% | 0.142/0.155 |
| 8 comp. | D1 | ETM2 | LiF 1 nm | 6.2 V | 5.9 cd/A | 3.0 lm/W | 4.7% | 0.141/0.160 |
| 9 comp. | D1 | ETM1:LiQ (40%:60%) | — | 6.3 V | 5 cd/A | 2.5 lm/W | 4.0% | 0.142/0.156 |
| 10 | D1 | ETM4 | LiQ 1 nm | 5.1 V | 6.5 cd/A | 4.0 lm/W | 5.3% | 0.141/0.157 |
| 11 | D1 | ETM4:LiQ (40%:60%) | — | 4.4 V | 9.3 cd/A | 6.6 lm/W | 7.5% | 0.142/0.154 |
| 12 | D1 | ETM3:LiQ (40%:60%) | — | 4.5 V | 8.5 cd/A | 5.9 lm/W | 7.2% | 0.143/0.156 |

TABLE 2-continued

| Ex. | Dopant | ETM | EIM | Voltage for 1000 cd/m² | Efficiency at 1000 cd/m² | Efficiency at 1000 cd/m² | EQE at 1000 cd/m² | CIE x/y at 1000 cd/m² |
|---|---|---|---|---|---|---|---|---|
| 13 comp. | D2 | ETM1 | LiF 1 nm | 5.9 V | 4.0 cd/A | 2.1 lm/W | 4.0% | 0.141/0.095 |
| 14 | D2 | ETM4:LiQ (40%:60%) | — | 4.9 V | 5.7 cd/A | 3.6 lm/W | 6.6% | 0.141/0.091 |
| 15 | D1 | ETM5:LiQ (40%:60%) | LiQ 1 nm | 4.3 V | 9.2 cd/A | 6.7 lm/W | 7.2% | 0.142/0.153 |
| 16 | D1 | ETM5:LiQ (40%:60%) | — | 4.4 V | 8.9 cd/A | 6.4 lm/W | 6.9% | 0.142/0.155 |
| 17 | D1 | ETM5 | LiQ 1 nm | 4.1 V | 9.3 cd/A | 7.1 lm/W | 7.1% | 0.141/0.159 |

Example 18

Comparison of Processability

A further advantage of the electron-transport materials according to the invention is the significantly improved processability compared with the prior art ETM2.

Layers of materials ETM4 and ETM2 are deposited over 2 hours under identical vapour-deposition conditions (vapour-deposition rate of 0.1 nm/s). Under these conditions, ETM4 exhibits absolutely no tendency to clog the vapour-deposition source. By contrast, a layer of the material grows inward in an annular manner at the upper edge of the vapour-deposition source on use of compound ETM2, with the consequence that controlled layer deposition is no longer possible with compound ETM2 after only about 1.5 h. This is confirmed by photographs in FIG. 1, where FIG. 1a) shows the vapour-deposition source on use of ETM4 and FIG. 1b) shows the vapour-deposition source on use of ETM2, in each case after vapour deposition for 1.5 h at a vapour-deposition rate of about 1 nm/s in each case. Absolutely no clogging of the vapour-deposition source is evident in FIG. 1a), whereas the source has clogged so much after only 1.5 h in FIG. 1b) (evident in the figure from the pale "lid") that controlled further deposition is not possible here. Compound ETM4 according to the invention is thus significantly more suitable for use in mass production than compound ETM2 in accordance with the prior art.

The invention claimed is:
1. An organic electroluminescent device comprising an anode, a cathode and at least one emitting layer which comprises at least one fluorescent emitter, or at least one emitting layer which comprises at least one phosphorescent emitter and which is employed in combination with a hole-blocking layer, wherein an electron-transport layer which comprises at least one compound of the formula (1) or formula (2):

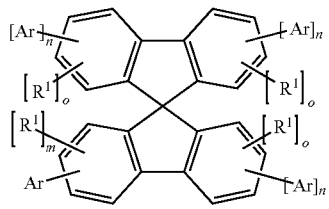

formula (1)

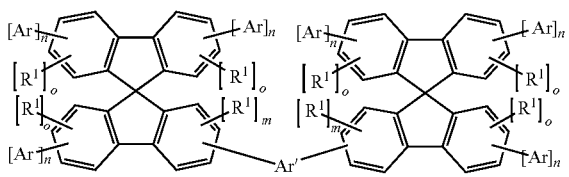

formula (2)

where the following applies to the symbols and indices used:
Ar is a group of the following formula (3):

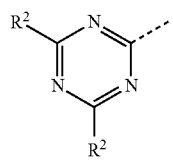

formula (3)

where the dashed bond indicates the bond to the spirobifluorene;
$Ar^1$ is a group of the following formula (4):

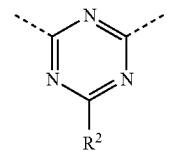

formula (4)

where the dashed bonds indicate the bonds to the spirobifluorene;
$R^1$ and $R^2$ are on each occurrence, identically or differently, H, D, F, Cl, Br, I, CHO, $N(R^3)_2$, $N(Ar^1)_2$, $B(Ar^1)_2$, $C(=O)Ar^1$, $P(=O)(Ar^1)_2$, $S(=O)Ar^1$, $S(=O)_2Ar^1$, $CR^3=CR^3Ar^1$, CN, $NO_2$, $Si(R^3)_3$, $B(OR^3)_2$, $B(R^3)_2$, $B(N(R^3)_2)_2$, $OSO_2R^3$, a straight-chain alkyl, alkenyl, alkynyl, alkoxy or thioalkoxy group having 1 to 40 C atoms or a branched or cyclic alkyl, alkenyl, alkynyl, alkoxy or thioalkoxy group having 3 to 40 C atoms, each of which is optionally substituted by one or more radicals $R^3$, where one or more non-adjacent $CH_2$ groups is optionally replaced by $R^3C=CR^3$, $C\equiv C$, $Si(R^3)_2$, $Ge(R^3)_2$, $Sn(R^3)_2$, C=O, C=S, C=Se, $C=NR^3$, $P(=O)(R^3)$, SO, $SO_2$, $NR^3$, O, S or $CONR^3$ and where one or more H atoms is optionally replaced by D, F, Cl, Br, I, CN or $NO_2$, or an aromatic or heteroaromatic ring system having 5 to 60 aromatic ring atoms, which may in each case be substituted by one or more radicals $R^3$, or an aryloxy or heteroaryloxy group having 5 to 60 aromatic ring atoms, which is optionally substituted by one or more radicals $R^3$, or a combination of these systems; two or more adjacent substituents $R^1$ here optionally forms a mono- or polycyclic, aliphatic or aromatic ring system with one another;

$Ar^1$ is on each occurrence, identically or differently, an aromatic or heteroaromatic ring system having 5 to 30 aromatic ring atoms, which is optionally substituted by one or more radicals $R^3$; two radicals $Ar^1$ here which are bonded to the same nitrogen, phosphorus or boron atom may also be linked to one another by a single bond or a bridge selected from $B(R^3)$, $C(R^3)_2$, $Si(R^3)_2$, C=O, C=NR$^3$, C=C(R$^3$)$_2$, O, S, S=O, SO$_2$, N(R$^3$), P(R$^3$) and P(=O)R$^3$;

$R^3$ is on each occurrence, identically or differently, H, D or an aliphatic, aromatic and/or heteroaromatic hydrocarbon radical having 1 to 20 C atoms, in which, in addition, H atoms is optionally replaced by D or F;

two or more adjacent substituents $R^3$ here may also form a mono- or polycyclic, aliphatic or aromatic ring system with one another;

n is 0 or 1;

m is 0, 1, 2 or 3;

o is 0, 1, 2, 3 or 4 if n=0 in the same ring and is 0, 1, 2 or 3 if n=1 in the same ring, is introduced between the emitting layer or the hole-blocking layer and the cathode.

2. The organic electroluminescent device according to claim 1, wherein the radical $R^2$ stands, identically or differently on each occurrence, for H, D, a straight-chain alkyl or alkoxy group having 1 to 10 C atoms or a branched or cyclic alkyl or alkoxy group having 3 to 10 C atoms, each of which is optionally substituted by one or more radicals $R^3$, where one or more H atoms is optionally replaced by D or F, or an aromatic or heteroaromatic ring system having 5 to 30 aromatic ring atoms, which may in each case be substituted by one or more radicals $R^3$, or a combination of these systems.

3. The organic electroluminescent device according to claim 1, wherein the radical $R^2$ stands, identically or differently on each occurrence, for H, D, a straight-chain alkyl or alkoxy group having 1 to 10 C atoms or a branched or cyclic alkyl or alkoxy group having 3 to 10 C atoms, each of which is optionally substituted by one or more radicals $R^3$, where one or more H atoms is optionally replaced by D or F, or an aromatic or heteroaromatic ring system having 5 to 25 aromatic ring atoms, which may in each case be substituted by one or more substitutents from the group of phenyl, naphthyl or ortho-, meta- or para-biphenyl, each of which is optionally substituted by one or more radicals $R^3$.

4. The organic electroluminescent device according to claim 1, wherein the compound of the formula (1) or (2) is selected from the compounds of the formulae (5) and (6):

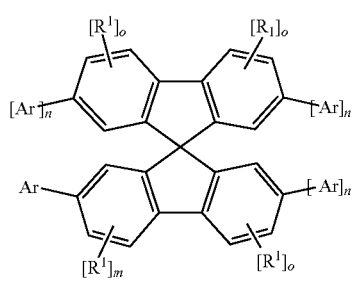

formula (5)

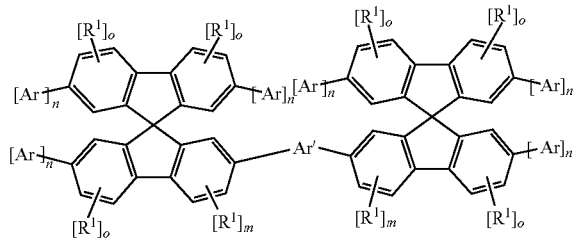

formula (6)

wherein
Ar is a group of the following formula (3):

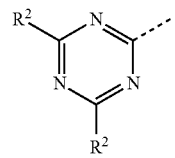

formula (3)

where the dashed bond indicates the bond to the spirobifluorene;
$Ar^1$ is a group of the following formula (4):

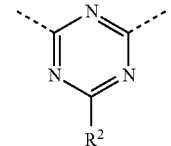

formula (4)

where the dashed bonds indicate the bonds to the spirobifluorene;

$R^1$ and $R^2$ are on each occurrence, identically or differently, H, D, F, Cl, Br, I, CHO, N(R$^3$)$_2$, N(Ar$^1$)$_2$, B(Ar$^1$)$_2$, C(=O)Ar$^1$, P(=O)(Ar$^1$)$_2$, S(=O)Ar$^1$, S(=O)$_2$Ar$^1$, CR$^3$=CR$^3$Ar$^1$, CN, NO$_2$, Si(R$^3$)$_3$, B(OR$^3$)$_2$, B(R$^3$)$_2$, B(N(R$^3$)$_2$)$_2$, OSO$_2$R$^3$, a straight-chain alkyl, alkenyl, alkynyl, alkoxy or thioalkoxy group having 1 to 40 C atoms or a branched or cyclic alkyl, alkenyl, alkynyl, alkoxy or thioalkoxy group having 3 to 40 C atoms, each of which is optionally substituted by one or more radicals $R^3$, where one or more non-adjacent CH$_2$ groups is optionally replaced by R$^3$C=CR$^3$, C=C, Si(R$^3$)$_2$, Ge(R$^3$)$_2$, Sn(R$^3$)$_2$, C=O, C=S, C=Se, C=NR$^3$, P(=O)(R$^3$), SO, SO$_2$, NR$^3$, O, S or CONR$^3$ and where one or more H atoms is optionally replaced by D, F, Cl, Br, I, CN or NO$_2$, or an aromatic or heteroaromatic ring system having 5 to 60 aromatic ring atoms, which may in each case be substituted by one or more radicals $R^3$, or an aryloxy or heteroaryloxy group having 5 to 60 aromatic ring atoms, which is optionally substituted by one or more radicals $R^3$, or a combination of these systems; two or more adjacent substituents $R^1$ here optionally forms a mono- or polycyclic, aliphatic or aromatic ring system with one another;

$Ar^1$ is on each occurrence, identically or differently, an aromatic or heteroaromatic ring system having 5 to 30 aromatic ring atoms, which is optionally substituted by one or more radicals $R^3$; two radicals $Ar^1$ here which are bonded to the same nitrogen, phosphorus or boron atom may also be linked to one another by a single bond or a bridge selected from $B(R^3)$, $C(R^3)_2$, $Si(R^3)_2$, $C=O$, $C=NR^3$, $C=C(R^3)_2$, O, S, S=O, $SO_2$, $N(R^3)$, $P(R^3)$ and $P(=O)R^3$;

$R^3$ is on each occurrence, identically or differently, H, D or an aliphatic, aromatic and/or heteroaromatic hydrocarbon radical having 1 to 20 C atoms, in which, in addition, H atoms is optionally replaced by D or F; two or more adjacent substituents $R^3$ here may also form a mono- or polycyclic, aliphatic or aromatic ring system with one another;

n is 0 or 1 and when n=0, a substituent $R^1$ may also be bonded in the corresponding position;

m is 0, 1, 2 or 3;

o is 0, 1, 2, 3 or 4 if n=0 in the same ring and is 0, 1, 2 or 3 if n=1 in the same ring.

5. The organic electroluminescent device according to claim 1, wherein the index m=0 and in that the sum of the indices n+o=0 or 1 on each benzene ring.

6. The organic electroluminescent device according to claim 1, wherein the compound of the formula (1) or formula (2) is selected from compounds of the formulae (7), (8), (9) and (10):

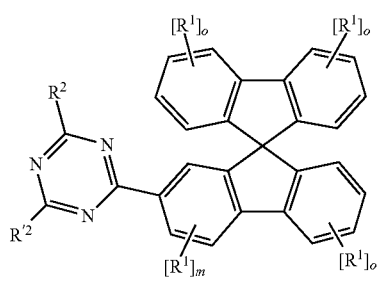

formula (7)

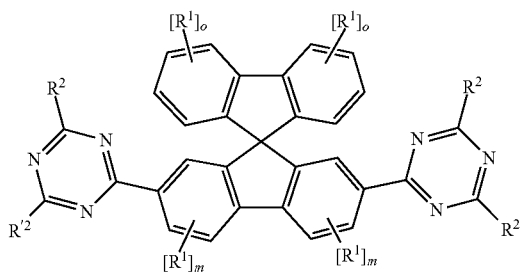

formula (8)

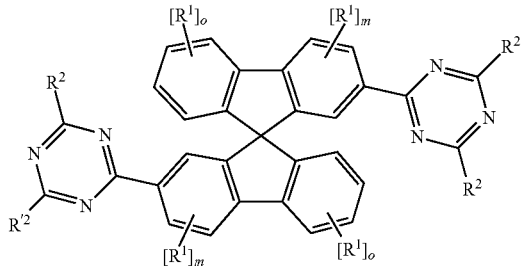

formula (9)

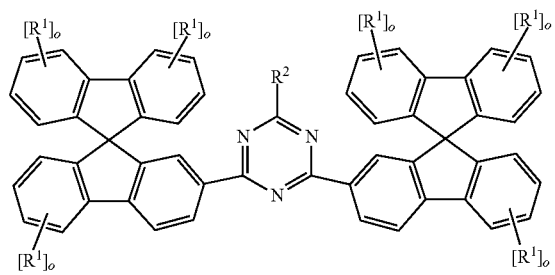

formula (10)

wherein $R^1$ and $R^2$ are on each occurrence, identically or differently, H, D, F, Cl, Br, I, CHO, $N(R^3)_2$, $N(Ar^1)_2$, $B(Ar^1)_2$, $C(=O)Ar^1$, $P(=O)(Ar^1)_2$, $S(=O)Ar^1$, $S(=O)_2Ar^1$, $CR^3=CR^3Ar^1$, CN, $NO_2$, $Si(R^3)_3$, $B(OR^3)_2$, $B(R^3)_2$, $B(N(R^3)_2)_2$, $OSO_2R^3$, a straight-chain alkyl, alkenyl, alkynyl, alkoxy or thioalkoxy group having 1 to 40 C atoms or a branched or cyclic alkyl, alkenyl, alkynyl, alkoxy or thioalkoxy group having 3 to 40 C atoms, each of which is optionally substituted by one or more radicals $R^3$, where one or more non-adjacent $CH_2$ groups is optionally replaced by $R^3C=CR^3$, $C\equiv C$, $Si(R^3)_2$, $Ge(R^3)_2$, $Sn(R^3)_2$, C=O, C=S, C=Se, $C=NR^3$, $P(=O)(R^3)$, SO, $SO_2$, $NR^3$, O, S or $CONR^3$ and where one or more H atoms is optionally replaced by D, F, Cl, Br, I, CN or $NO_2$, or an aromatic or heteroaromatic ring system having 5 to 60 aromatic ring atoms, which may in each case be substituted by one or more radicals $R^3$, or an aryloxy or heteroaryloxy group having 5 to 60 aromatic ring atoms, which is optionally substituted by one or more radicals $R^3$, or a combination of these systems; two or more adjacent substituents $R^1$ here optionally forms a mono- or polycyclic, aliphatic or aromatic ring system with one another;

$Ar^1$ is on each occurrence, identically or differently, an aromatic or heteroaromatic ring system having 5 to 30 aromatic ring atoms, which is optionally substituted by one or more radicals $R^3$; two radicals $Ar^1$ here which are bonded to the same nitrogen, phosphorus or boron atom may also be linked to one another by a single bond or a bridge selected from $B(R^3)$, $C(R^3)_2$, $Si(R^3)_2$, C=O, $C=NR^3$, $C=C(R^3)_2$, O, S, S=O, $SO_2$, $N(R^3)$, $P(R^3)$ and $P(=O)R^3$;

$R^3$ is on each occurrence, identically or differently, H, D or an aliphatic, aromatic and/or heteroaromatic hydrocarbon radical having 1 to 20 C atoms, in which, in addition, H atoms is optionally replaced by D or F;

two or more adjacent substituents $R^3$ here may also form a mono- or polycyclic, aliphatic or aromatic ring system with one another;

n is 0 or 1;

m is 0, 1, 2 or 3;

o stands, identically or differently on each occurrence, for 0 or 1.

7. A mixture comprising at least one compound of the formula (11) or (12) according to claim 6 and at least one organic alkali-metal compound.

8. An organic electroluminescent device comprising an anode, a cathode, at least one emitting layer and at least one electron-transport layer which is arranged between the emitting layer and the cathode, where the electron-transport layer comprises at least one compound of the formula (11) or (12):

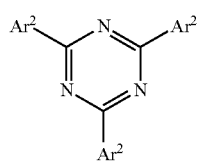

formula (11)

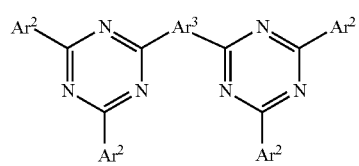

formula (12)

wherein

Ar² is, identically or differently on each occurrence, a monovalent aromatic or heteroaromatic ring system having 5 to 60 aromatic ring atoms, which may in each case be substituted by one or more radicals R¹;

R¹ is on each occurrence, identically or differently, H, D, F, Cl, Br, I, CHO, N(R³)₂, N(Ar¹)₂, B(Ar¹)₂, C(=O)Ar¹, P(=O)(Ar¹)₂, S(=O)Ar¹, S(=O)₂Ar¹, CR³=CR³Ar¹, CN, NO₂, Si(R³)₃, B(OR³)₂, B(R³)₂, B(N(R³)₂)₂, OSO₂R³, a straight-chain alkyl, alkenyl, alkynyl, alkoxy or thioalkoxy group having 1 to 40 C atoms or a branched or cyclic alkyl, alkenyl, alkynyl, alkoxy or thioalkoxy group having 3 to 40 C atoms, each of which is optionally substituted by one or more radicals R³, where one or more non-adjacent CH₂ groups is optionally replaced by R³C=CR³, C≡C, Si(R³)₂, Ge(R³)₂, Sn(R³)₂, C=O, C=S, C=Se, C=NR³, P(=O)(R³), SO, SO₂, NR³, O, S or CONR³ and where one or more H atoms is optionally replaced by D, F, Cl, Br, I, CN or NO₂, or an aromatic or heteroaromatic ring system having 5 to 60 aromatic ring atoms, which may in each case be substituted by one or more radicals R³, or an aryloxy or heteroaryloxy group having 5 to 60 aromatic ring atoms, which is optionally substituted by one or more radicals R³, or a combination of these systems; two or more adjacent substituents R¹ here optionally forms a mono- or polycyclic, aliphatic or aromatic ring system with one another;

Ar¹ is on each occurrence, identically or differently, an aromatic or heteroaromatic ring system having 5 to 30 aromatic ring atoms, which is optionally substituted by one or more radicals R³; two radicals Ar¹ here which are bonded to the same nitrogen, phosphorus or boron atom may also be linked to one another by a single bond or a bridge selected from B(R³), C(R³)₂, Si(R³)₂, C=O, C=NR³, C=C(R³)₂, O, S, S=O, SO₂, N(R³), P(R³) and P(=O)R³;

R³ is on each occurrence, identically or differently, H, D or an aliphatic, aromatic and/or heteroaromatic hydrocarbon radical having 1 to 20 C atoms, in which, in addition, H atoms is optionally replaced by D or F; two or more adjacent substituents R³ here may also form a mono- or polycyclic, aliphatic or aromatic ring system with one another;

Ar³ is selected from the groups of the following formulae (28) to (39):

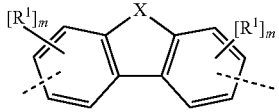

formula (28)

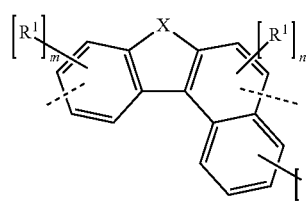

formula (29)

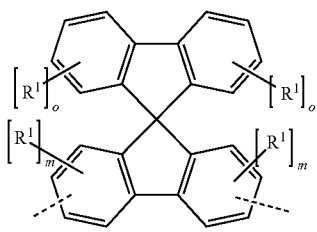

formula (30)

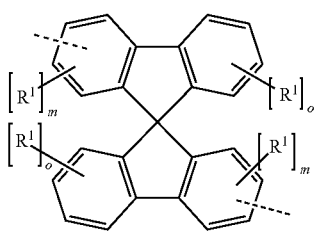

formula (31)

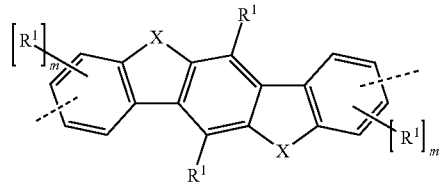

formula (32)

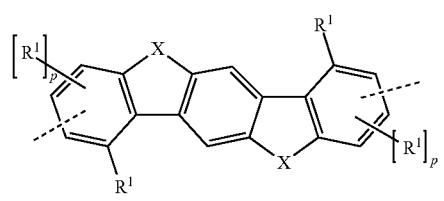

formula (33)

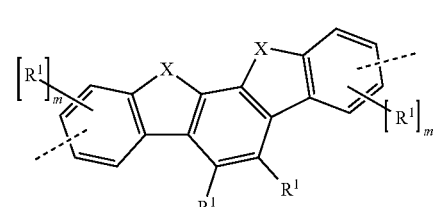

formula (34)

-continued

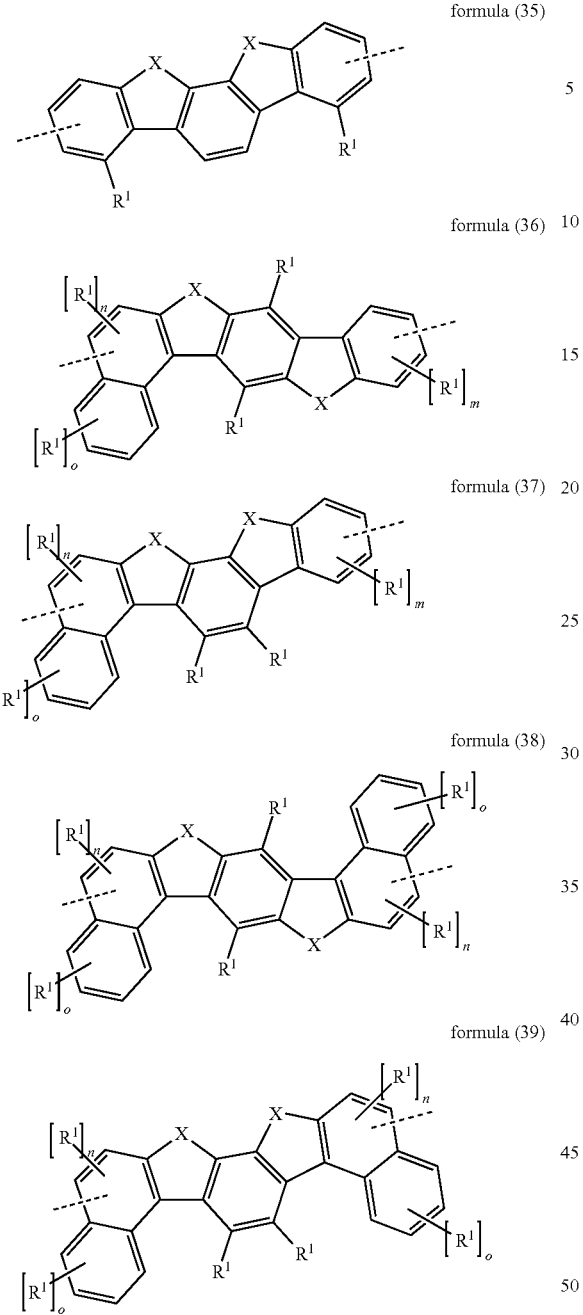

formula (35)

formula (36)

formula (37)

formula (38)

formula (39)

wherein

R¹ is on each occurrence, identically or differently, H, D, F, Cl, Br, I, CHO, N(R³)₂, N(Ar¹)₂, B(Ar¹)₂, C(=O)Ar¹, P(=O)(Ar¹)₂, S(=O)Ar¹, S(=O)₂Ar¹, CR³=CR³Ar¹, CN, NO₂, Si(R³)₃, B(OR³)₂, B(R³)₂, B(N(R³)₂)₂, OSO₂R³, a straight-chain alkyl, alkenyl, alkynyl, alkoxy or thioalkoxy group having 1 to 40 C atoms or a branched or cyclic alkyl, alkenyl, alkynyl, alkoxy or thioalkoxy group having 3 to 40 C atoms, each of which is optionally substituted by one or more radicals R³, where one or more non-adjacent CH₂ groups is optionally replaced by R³C=CR³, C≡C, Si(R³)₂, Ge(R³)₂, Sn(R³)₂, C=O, C=S, C=Se, C=NR³, P(=O)(R³), SO, SO₂, NR³, O, S or CONR³ and where one or more H atoms is optionally replaced by D, F, Cl, Br, I, CN or NO₂, or an aromatic or heteroaromatic ring system having 5 to 60 aromatic ring atoms, which may in each case be substituted by one or more radicals R³, or an aryloxy or heteroaryloxy group having 5 to 60 aromatic ring atoms, which is optionally substituted by one or more radicals R³, or a combination of these systems; two or more adjacent substituents R¹ here optionally forms a mono- or polycyclic, aliphatic or aromatic ring system with one another;

Ar¹ is on each occurrence, identically or differently, an aromatic or heteroaromatic ring system having 5 to 30 aromatic ring atoms, which is optionally substituted by one or more radicals R³; two radicals Ar¹ here which are bonded to the same nitrogen, phosphorus or boron atom may also be linked to one another by a single bond or a bridge selected from B(R³), C(R³)₂, Si(R³)₂, C=O, C=NR³, C=C(R³)₂, O, S, S=O, SO₂, N(R³), P(R³) and P(=O)R³;

R³ is on each occurrence, identically or differently, H, D or an aliphatic, aromatic and/or heteroaromatic hydrocarbon radical having 1 to 20 C atoms, in which, in addition, H atoms is optionally replaced by D or F; two or more adjacent substituents R³ here may also form a mono- or polycyclic, aliphatic or aromatic ring system with one another;

X is, identically or differently on each occurrence, a divalent bridge selected from the group consisting of B(R¹), C(R¹)₂, Si(R¹)₂, C=O, C=NR¹, C=C(R¹)₂, O, S, S=O, SO₂, N(R¹), P(R¹) and P(=O)R¹;

X¹ is, identically or differently on each occurrence, a divalent bridge selected from the group consisting of B(R¹), C=C(R¹)₂, Si(R¹)₂, C=O, C=NR¹, O, S, S=O, SO₂, N(R¹), P(R¹) and P(=O)R¹;

m is on each occurrence, identically or differently, 0, 1, 2 or 3;

n is 0 or 1;

o is on each occurrence, identically or differently, 0, 1, 2, 3 or 4;

p is, identically or differently on each occurrence, 0, 1 or 2;

and the dashed bond represents the link to the two triazine units, wherein the electron-transport layer is doped with an organic alkali-metal compound, in that a mixture of the compound of the formula (11) or (12) and an organic alkali-metal compound is thus present, or in that a further layer which comprises an organic alkali-metal compound is introduced between the electron-transport layer comprising the compound of the formula (11) or (12) and the cathode.

9. The organic electroluminescent device according to claim 8, wherein at least one group Ar² is selected from the groups of the following formulae (13) to (27):

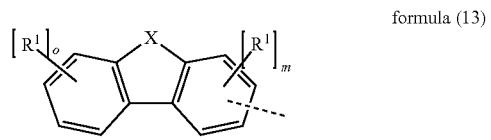

formula (13)

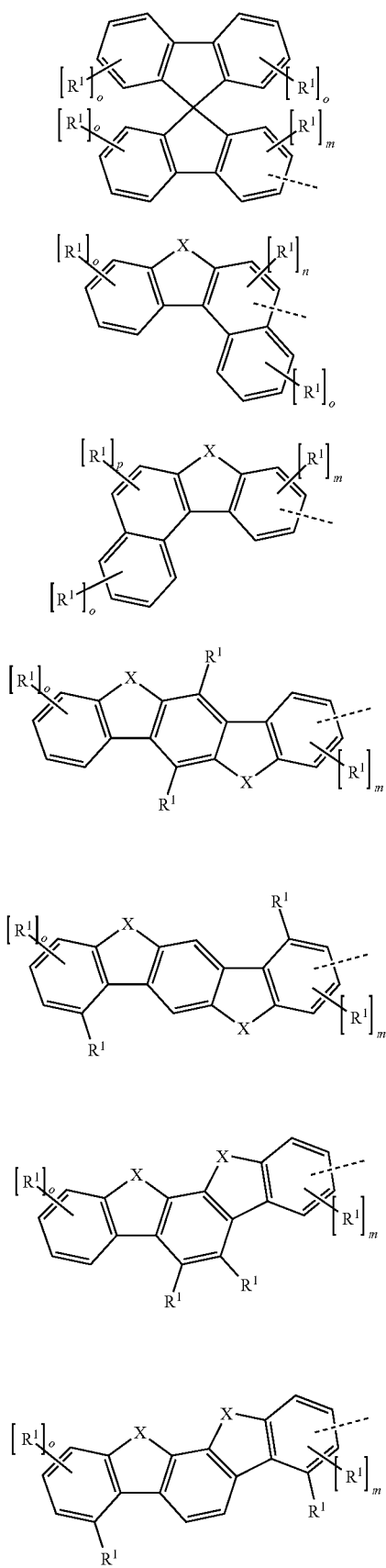
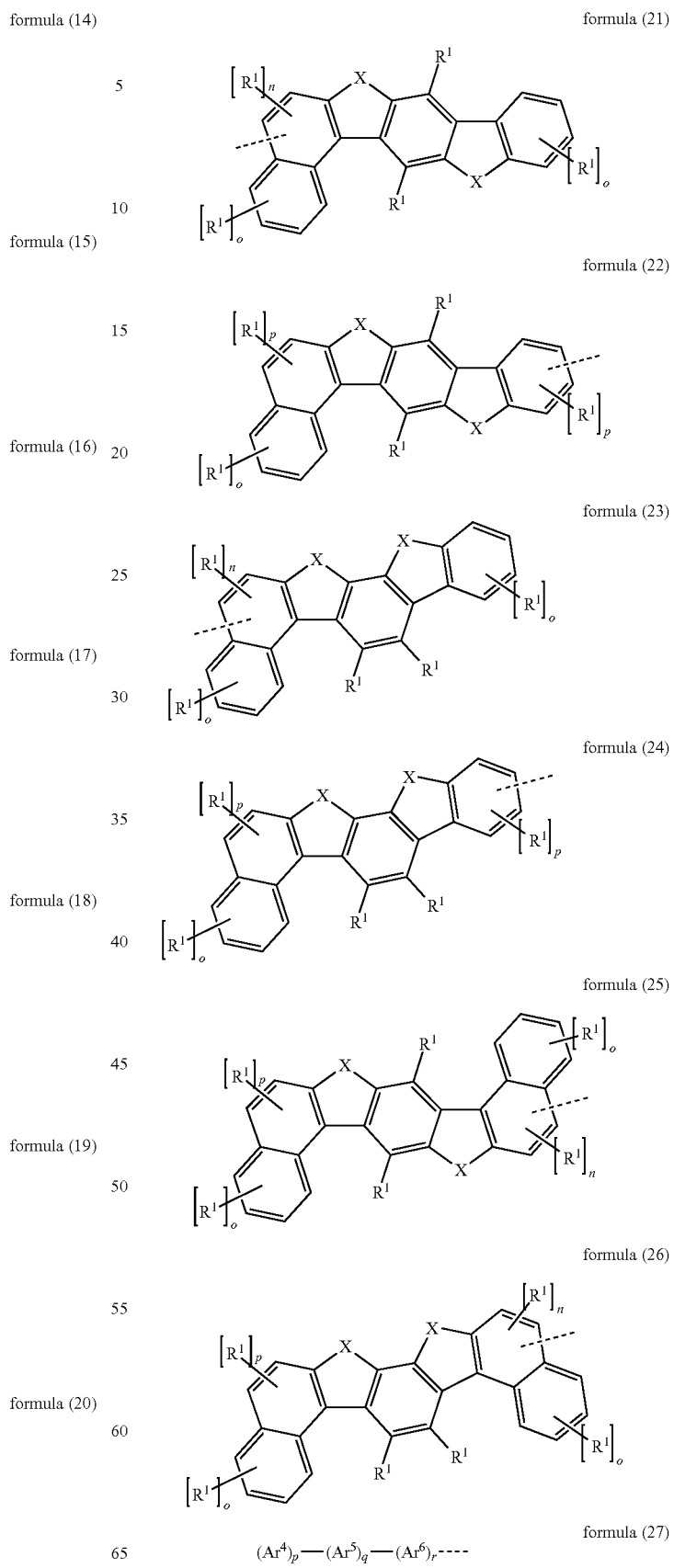

wherein

R¹ is on each occurrence, identically or differently, H, D, F, Cl, Br, I, CHO, N(R³)₂, N(Ar¹)₂, B(Ar¹)₂, C(=O)Ar¹, P(=O)(Ar¹)₂, S(=O)Ar¹, S(=O)₂Ar¹, CR³=CR³Ar¹, CN, NO₂, Si(R³)₃, B(OR³)₂, B(R³)₂, B(N(R³)₂)₂, OSO₂R³, a straight-chain alkyl, alkenyl, alkynyl, alkoxy or thioalkoxy group having 1 to 40 C atoms or a branched or cyclic alkyl, alkenyl, alkynyl, alkoxy or thioalkoxy group having 3 to 40 C atoms, each of which is optionally substituted by one or more radicals R³, where one or more non-adjacent CH₂ groups is optionally replaced by R³C=CR³, C≡C, Si(R³)₂, Ge(R³)₂, Sn(R³)₂, C=O, C=S, C=Se, C=NR³, P(=O)(R³), SO, SO₂, NR³, O, S or CONR³ and where one or more H atoms is optionally replaced by D, F, Cl, Br, I, CN or NO₂, or an aromatic or heteroaromatic ring system having 5 to 60 aromatic ring atoms, which may in each case be substituted by one or more radicals R³, or an aryloxy or heteroaryloxy group having 5 to 60 aromatic ring atoms, which is optionally substituted by one or more radicals R³, or a combination of these systems; two or more adjacent substituents R¹ here optionally forms a mono- or polycyclic, aliphatic or aromatic ring system with one another;

Ar¹ is on each occurrence, identically or differently, an aromatic or heteroaromatic ring system having 5 to 30 aromatic ring atoms, which is optionally substituted by one or more radicals R³; two radicals Ar¹ here which are bonded to the same nitrogen, phosphorus or boron atom may also be linked to one another by a single bond or a bridge selected from B(R³), C(R³)₂, Si(R³)₂, C=O, C=NR³, C=C(R³)₂, O, S, S=O, SO₂, N(R³), P(R³) and P(=O)R³;

R³ is on each occurrence, identically or differently, H, D or an aliphatic, aromatic and/or heteroaromatic hydrocarbon radical having 1 to 20 C atoms, in which, in addition, H atoms is optionally replaced by D or F; two or more adjacent substituents R³ here may also form a mono- or polycyclic, aliphatic or aromatic ring system with one another;

the dashed bond represents the link to the triazine unit,

X is, identically or differently on each occurrence, a divalent bridge selected from the group consisting of B(R¹), C(R¹)₂, Si(R¹)₂, C=O, C=NR¹, C=C(R¹)₂, O, S, S=O, SO₂, N(R¹), P(R¹) and P(=O)R¹;

m is on each occurrence, identically or differently, 0, 1, 2 or 3;

n is 0 or 1;

is on each occurrence, identically or differently, 0, 1, 2, 3 or 4;

Ar⁴ and Ar⁶ are, identically or differently on each occurrence, an aryl or heteroaryl group having 5 to 18 aromatic ring atoms, which is optionally substituted by one or more radicals R¹;

Ar⁵ is a condensed aryl or heteroaryl group having 10 to 18 aromatic ring atoms, which is optionally substituted by one or more radicals R¹;

p and r are, identically or differently on each occurrence, 0, 1 or 2; and q is 1 or 2.

10. The organic electroluminescent device according to claim 8, wherein at least one group Ar² is selected from the groups of the following formulae (13a) to (26a) and (27a) to (27d):

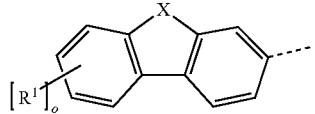

formula (13a)

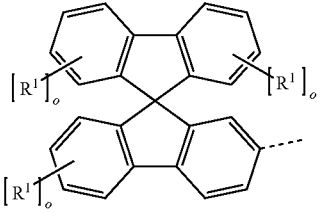

formula (14a)

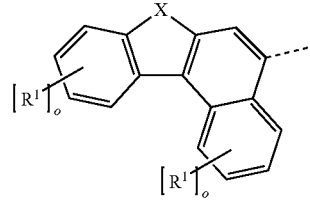

formula (15a)

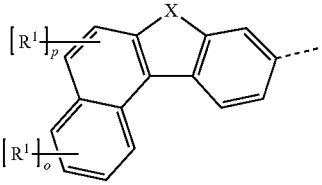

formula (16a)

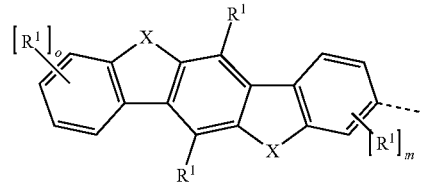

formula (17a)

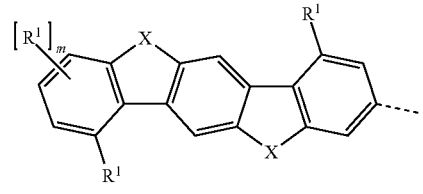

formula (18a)

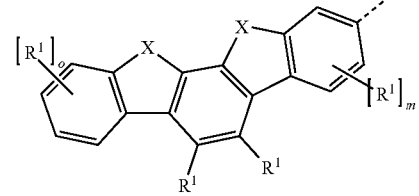

formula (19a)

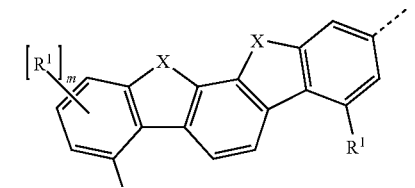

formula (20a)

formula (21a)

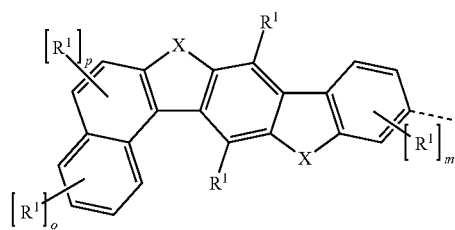

formula (22a)

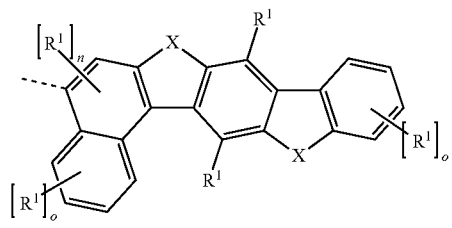

formula (23a)

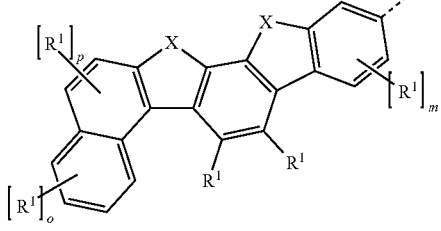

formula (24a)

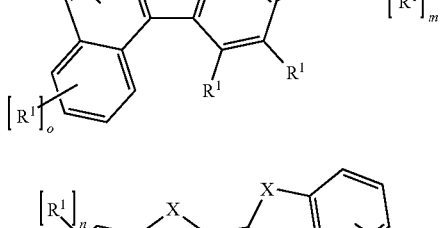

formula (25a)

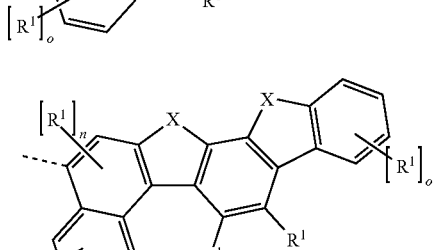

formula (26a)

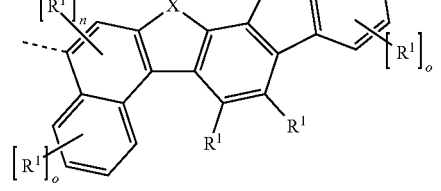

formula (27a)

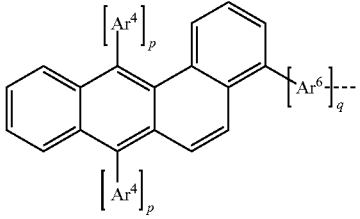

formula (27b)

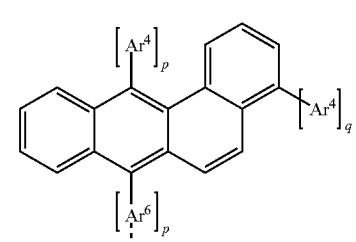

formula (27c)

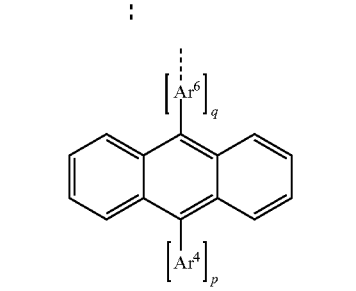

formula (27d)

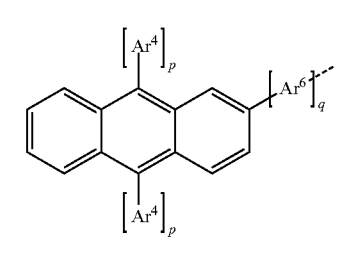

wherein $R^1$ is on each occurrence, identically or differently, H, D, F, Cl, Br, I, CHO, $N(R^3)_2$, $N(Ar^1)_2$, $B(Ar^1)_2$, $C(=O)Ar^1$, $P(=O)(Ar^1)_2$, $S(=O)Ar^1$, $S(=O)_2Ar^1$, $CR^3=CR^3Ar^1$, CN, $NO_2$, $Si(R^3)_3$, $B(OR^3)_2$, $B(R^3)_2$, $B(N(R^3)_2)_2$, $OSO_2R^3$, a straight-chain alkyl, alkenyl, alkynyl, alkoxy or thioalkoxy group having 1 to 40 C atoms or a branched or cyclic alkyl, alkenyl, alkynyl, alkoxy or thioalkoxy group having 3 to 40 C atoms, each of which is optionally substituted by one or more radicals $R^3$, where one or more non-adjacent $CH_2$ groups is optionally replaced by $R^3C=CR^3$, C≡C, $Si(R^3)_2$, $Ge(R^3)_2$, $Sn(R^3)_2$, C=O, C=S, C=Se, $C=NR^3$, $P(=O)(R^3)$, SO, $SO_2$, $NR^3$, O, S or $CONR^3$ and where one or more H atoms is optionally replaced by D, F, Cl, Br, I, CN or $NO_2$, or an aromatic or heteroaromatic ring system having 5 to 60 aromatic ring atoms, which may in each case be substituted by one or more radicals $R^3$, or an aryloxy or heteroaryloxy group having 5 to 60 aromatic ring atoms, which is optionally substituted by one or more radicals $R^3$, or a combination of these systems; two or more adjacent substituents $R^1$ here optionally forms a mono- or polycyclic, aliphatic or aromatic ring system with one another;

$Ar^1$ is on each occurrence, identically or differently, an aromatic or heteroaromatic ring system having 5 to 30 aromatic ring atoms, which is optionally substituted by one or more radicals $R^3$; two radicals $Ar^1$ here which are bonded to the same nitrogen, phosphorus or boron atom may also be linked to one another by a single bond or a bridge selected from $B(R^3)$, $C(R^3)_2$, $Si(R^3)_2$, C=O, C=NR$^3$, C=C(R$^3$)$_2$, O, S, S=O, SO$_2$, N(R$^3$), P(R$^3$) and P(=O)R$^3$;

$R^3$ is on each occurrence, identically or differently, H, D or an aliphatic, aromatic and/or heteroaromatic hydrocarbon radical having 1 to 20 C atoms, in which, in addition, H atoms is optionally replaced by D or F; two or more adjacent substituents $R^3$ here may also form a mono- or polycyclic, aliphatic or aromatic ring system with one another;

the dashed bond represents the link to the triazine unit, m is on each occurrence, identically or differently, 0, 1, 2 or 3;

n is 0 or 1;

o is on each occurrence, identically or differently, 0, 1, 2, 3 or 4;

$Ar^4$ and $Ar^6$ are, identically or differently on each occurrence, an aryl or heteroaryl group having 5 to 18 aromatic ring atoms, which is optionally substituted by one or more radicals $R^1$;

p is, identically or differently on each occurrence, 0, 1 or 2; and q is 1 or 2.

X is identically or differently, and is C(R$^1$)$_2$, N(R$^1$), O or S, and the groups of the formulae (27a) to (27d) here is optionally substituted by one or more radicals $R^1$, and the index p in formulae (27a) to (27d) stands for 0 or 1.

11. The organic electroluminescent device according to claim 8, wherein the organic alkali-metal compound is a compound of the formula (40) or (43):

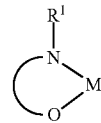

formula (40)

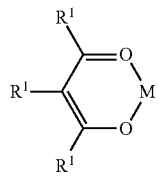

formula (43)

wherein $R^1$ is on each occurrence, identically or differently, H, D, F, Cl, Br, I, CHO, N(R$^3$)$_2$, N(Ar$^1$)$_2$, B(Ar$^1$)2, C(=O)Ar$^1$, P(=O)(Ar$^1$)$_2$, S(=O)Ar$^1$, S(=O)$_2$Ar$^1$, CR$^3$=CR$^3$Ar$^1$, CN, NO$_2$, Si(R$^3$)$_3$, B(OR$^3$)$_2$, B(R$^3$)$_2$, B(N(R$^3$)$_2$)$_2$, OSO$_2$R$^3$, a straight-chain alkyl, alkenyl, alkynyl, alkoxy or thioalkoxy group having 1 to 40 C atoms or a branched or cyclic alkyl, alkenyl, alkynyl, alkoxy or thioalkoxy group having 3 to 40 C atoms, each of which is optionally substituted by one or more radicals $R^3$, where one or more non-adjacent CH$_2$ groups is optionally replaced by R$^3$C=CR$^3$, C=C, Si(R$^3$)$_2$, Ge(R$^3$)$_2$, Sn(R$^3$)$_2$, C=O, C=S, C=Se, C=NR$^3$, P(=O)(R$^3$), SO, SO$_2$, NR$^3$, O, S or CONR$^3$ and where one or more H atoms is optionally replaced by D, F, Cl, Br, I, CN or NO$_2$, or an aromatic or heteroaromatic ring system having 5 to 60 aromatic ring atoms, which may in each case be substituted by one or more radicals $R^3$, or an aryloxy or heteroaryloxy group having 5 to 60 aromatic ring atoms, which is optionally substituted by one or more radicals $R^3$, or a combination of these systems; two or more adjacent substituents $R^1$ here optionally forms a mono- or polycyclic, aliphatic or aromatic ring system with one another;

$Ar^1$ is on each occurrence, identically or differently, an aromatic or heteroaromatic ring system having 5 to 30 aromatic ring atoms, which is optionally substituted by one or more radicals $R^3$; two radicals $Ar^1$ here which are bonded to the same nitrogen, phosphorus or boron atom may also be linked to one another by a single bond or a bridge selected from B(R$^3$), C(R$^3$)$_2$, Si(R$^3$)$_2$, C=O, C=NR$^3$, C=C(R$^3$)$_2$, O, S, S=O, SO$_2$, N(R$^3$), P(R$^3$) and P(=O)R$^3$;

$R^3$ is on each occurrence, identically or differently, H, D or an aliphatic, aromatic and/or heteroaromatic hydrocarbon radical having 1 to 20 C atoms, in which, in addition, H atoms is optionally replaced by D or F; two or more adjacent substituents $R^3$ here may also form a mono- or polycyclic, aliphatic or aromatic ring system with one another;

the curved line represents two or three atoms and bonds which are necessary to make up a 5- or 6-membered ring with M, where these atoms may also be substituted by one or more radicals $R^1$, and M represents an alkali metal selected from lithium, sodium, potassium, rubidium or caesium.

12. The organic electroluminescent device according to claim 11, wherein the ratio of the triazine compound of the formula (11) or (12) to the organic alkali-metal compound is 20:80 to 80:20.

13. The organic electroluminescent device according to claim 11, wherein the ratio of the triazine compound of the formula (11) or (12) to the organic alkali-metal compound is 30:70 to 45:55.

14. The organic electroluminescent device according to claim 10, wherein the group $Ar^3$ is selected from the groups of the formulae (28a) to (39a):

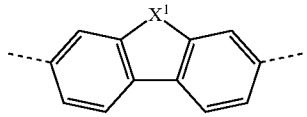

formula (28a)

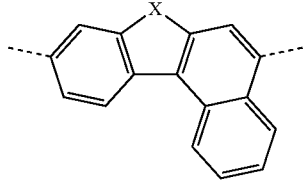

formula (29a)

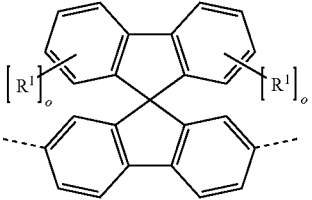

formula (30a)

-continued formula (31a)
formula (32a)
formula (33a)
formula (34a)
formula (35a)
formula (36a)
formula (37a)

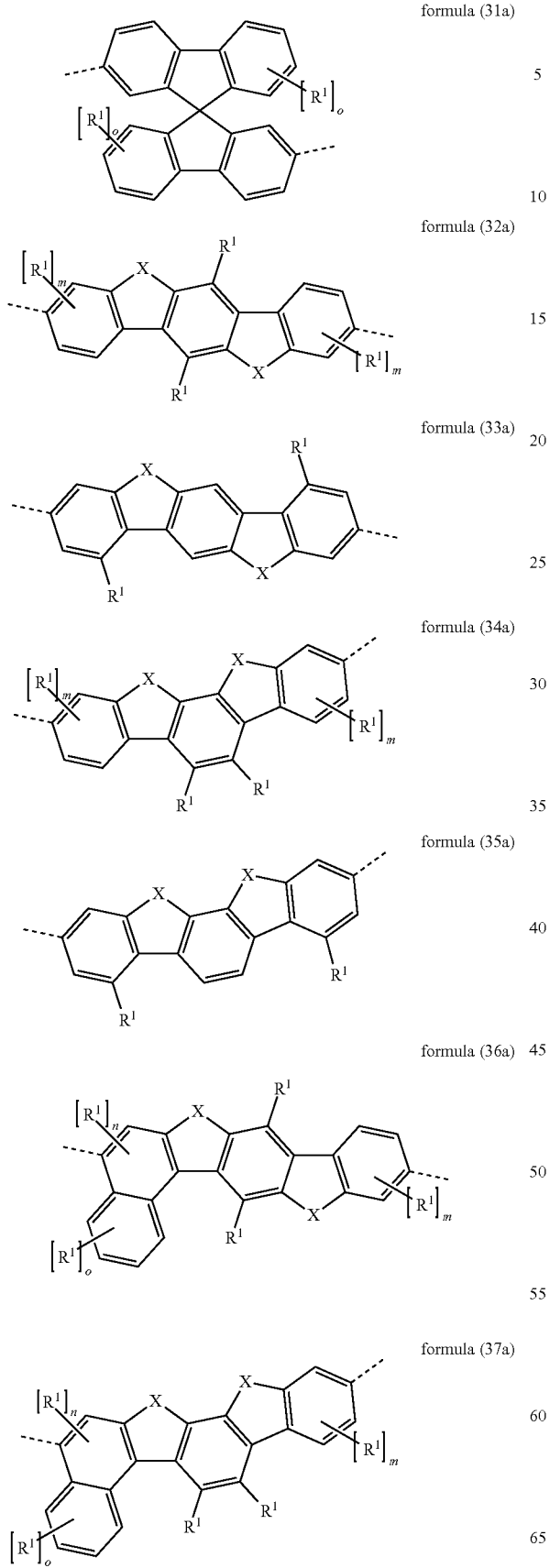

-continued formula (38a)
formula (39a)

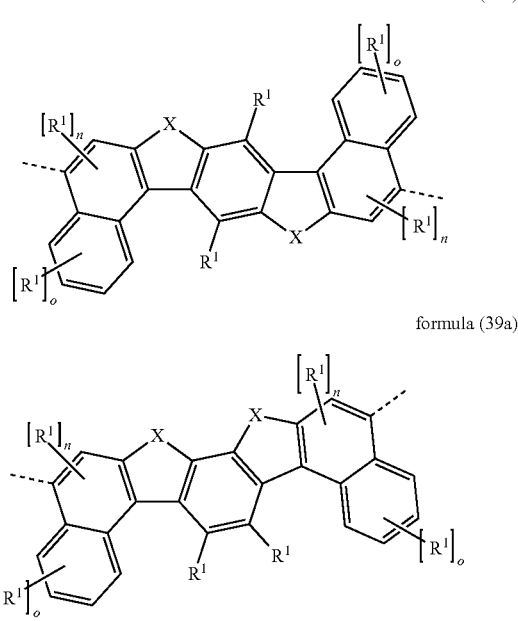

wherein $R^1$ is on each occurrence, identically or differently, H, D, F, Cl, Br, I, CHO, $N(R^3)_2$, $N(Ar^1)_2$, $B(Ar^1)_2$, $C(=O)Ar^1$, $P(=O)(Ar^1)_2$, $S(=O)Ar^1$, $S(=O)_2Ar^1$, $CR^3=CR^3Ar^1$, CN, $NO_2$, $Si(R^3)_3$, $B(OR^3)_2$, $B(R^3)_2$, $B(N(R^3)_2)_2$, $OSO_2R^3$, a straight-chain alkyl, alkenyl, alkynyl, alkoxy or thioalkoxy group having 1 to 40 C atoms or a branched or cyclic alkyl, alkenyl, alkynyl, alkoxy or thioalkoxy group having 3 to 40 C atoms, each of which is optionally substituted by one or more radicals $R^3$, where one or more non-adjacent $CH_2$ groups is optionally replaced by $R^3C=CR^3$, C≡C, $Si(R^3)_2$, $Ge(R^3)_2$, $Sn(R^3)_2$, C=O, C=S, C=Se, $C=NR^3$, $P(=O)(R^3)$, SO, $SO_2$, $NR^3$, O, S or $CONR^3$ and where one or more H atoms is optionally replaced by D, F, Cl, Br, I, CN or $NO_2$, or an aromatic or heteroaromatic ring system having 5 to 60 aromatic ring atoms, which may in each case be substituted by one or more radicals $R^3$, or an aryloxy or heteroaryloxy group having 5 to 60 aromatic ring atoms, which is optionally substituted by one or more radicals $R^3$, or a combination of these systems; two or more adjacent substituents $R^1$ here optionally forms a mono- or polycyclic, aliphatic or aromatic ring system with one another;

$Ar^1$ is on each occurrence, identically or differently, an aromatic or heteroaromatic ring system having 5 to 30 aromatic ring atoms, which is optionally substituted by one or more radicals $R^3$; two radicals $Ar^1$ here which are bonded to the same nitrogen, phosphorus or boron atom may also be linked to one another by a single bond or a bridge selected from $B(R^3)$, $C(R^3)_2$, $Si(R^3)_2$, C=O, $C=NR^3$, $C=C(R^3)_2$, O, S, S=O, $SO_2$, $N(R^3)$, $P(R^3)$ and $P(=O)R^3$;

$R^3$ is on each occurrence, identically or differently, H, D or an aliphatic, aromatic and/or heteroaromatic hydrocarbon radical having 1 to 20 C atoms, in which, in addition, H atoms is optionally replaced by D or F; two or more adjacent substituents $R^3$ here may also form a mono- or polycyclic, aliphatic or aromatic ring system with one another;

m is on each occurrence, identically or differently, 0, 1, 2 or 3;
n is 0 or 1;
o is on each occurrence, identically or differently, 0, 1, 2, 3 or 4;
the dashed bond represents the link to the triazine unit,
$X^1$ is selected, identically or differently, and is $N(R^1)$, O or S and
X is selected, identically or differently, and is $C(R^1)_2$, $N(R^1)$, O or S.

15. The organic electroluminescent device according to claim 14, wherein the organic alkali-metal compound is selected from compounds of the formulae (41) and (42):

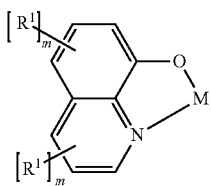

formula (41)

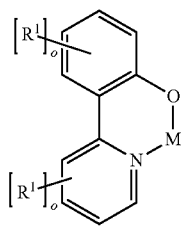

formula (42)

where the symbols and indices used have the meanings given in claim 19,
$R^1$ is on each occurrence, identically or differently, H, D, F, Cl, Br, I, CHO, $N(R^3)_2$, $N(Ar^1)_2$, $B(Ar^1)_2$, $C(=O)Ar^1$, $P(=O)(Ar^1)_2$, $S(=O)Ar^1$, $S(=O)_2Ar^1$, $CR^3=CR^3Ar^1$, CN, $NO_2$, $Si(R^3)_3$, $B(OR^3)_2$, $B(R^3)_2$, $B(N(R^3)_2)_2$, $OSO_2R^3$, a straight-chain alkyl, alkenyl, alkynyl, alkoxy or thioalkoxy group having 1 to 40 C atoms or a branched or cyclic alkyl, alkenyl, alkynyl, alkoxy or thioalkoxy group having 3 to 40 C atoms, each of which is optionally substituted by one or more radicals $R^3$, where one or more non-adjacent $CH_2$ groups is optionally replaced by $R^3C=CR^3$, C≡C, $Si(R^3)_2$, $Ge(R^3)_2$, $Sn(R^3)_2$, C=O, C=S, C=Se, C=$NR^3$, $P(=O)(R^3)$, SO, $SO_2$, $NR^3$, O, S or $CONR^3$ and where one or more H atoms is optionally replaced by D, F, Cl, Br, I, CN or $NO_2$, or an aromatic or heteroaromatic ring system having 5 to 60 aromatic ring atoms, which may in each case be substituted by one or more radicals $R^3$, or an aryloxy or heteroaryloxy group having 5 to 60 aromatic ring atoms, which is optionally substituted by one or more radicals $R^3$, or a combination of these systems; two or more adjacent substituents $R^1$ here optionally forms a mono- or polycyclic, aliphatic or aromatic ring system with one another;
$Ar^1$ is on each occurrence, identically or differently, an aromatic or heteroaromatic ring system having 5 to 30 aromatic ring atoms, which is optionally substituted by one or more radicals $R^3$; two radicals $Ar^1$ here which are bonded to the same nitrogen, phosphorus or boron atom may also be linked to one another by a single bond or a bridge selected from $B(R^3)$, $C(R^3)_2$, $Si(R^3)_2$, C=O, C=$NR^3$, C=$C(R^3)_2$, O, S, S=O, $SO_2$, $N(R^3)$, $P(R^3)$ and $P(=O)R^3$;

$R^3$ is on each occurrence, identically or differently, H, D or an aliphatic, aromatic and/or heteroaromatic hydrocarbon radical having 1 to 20 C atoms, in which, in addition, H atoms is optionally replaced by D or F; two or more adjacent substituents $R^3$ here may also form a mono- or polycyclic, aliphatic or aromatic ring system with one another;
m is on each occurrence, identically or differently, 0, 1, 2 or 3;
o is on each occurrence, identically or differently, 0, 1, 2, 3 or 4;
M represents an alkali metal selected from lithium, sodium, potassium, rubidium or cesium.

16. The organic electroluminescent device according to claim 15, wherein the alkali metal is lithium, sodium or potassium.

17. The organic electroluminescent device according to claim 15, wherein the alkali metal is lithium.

18. A process for the production of the organic electroluminescent device according to claim 1, which comprises applying one or more layers by means of a sublimation process and/or in that one or more layers are applied by means of the OVPD (organic vapour phase deposition) process or with the aid of carrier-gas sublimation and/or in that one or more layers are applied from solution or by means of a printing process.

19. A compound of the formula (11) or (12)

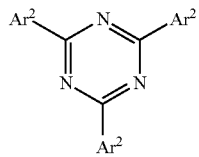

formula (11)

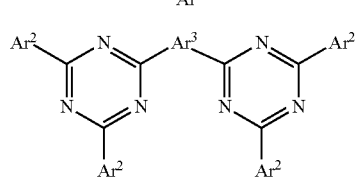

formula (12)

wherein
$Ar^2$ is selected from the groups of the following formulae (15a) to (26a) and (27a) to (27d):

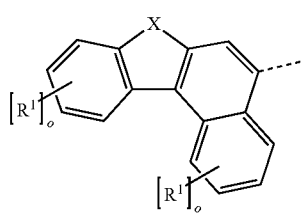

formula (15a)

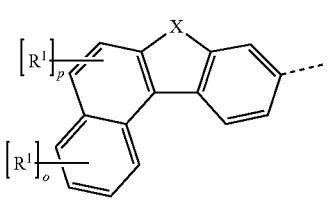

formula (16a)

formula (17a)
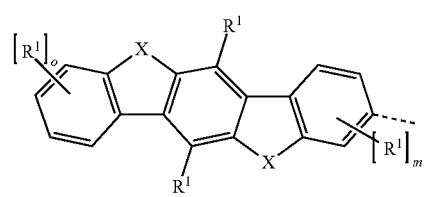
formula (18a)
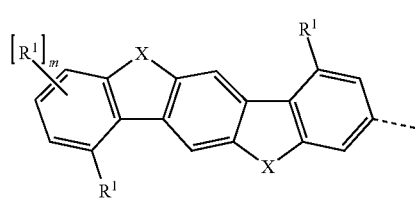
formula (19a)
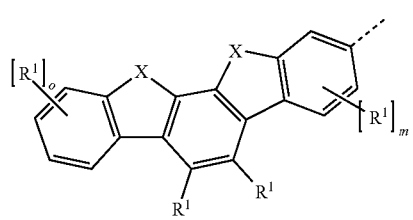
formula (20a)
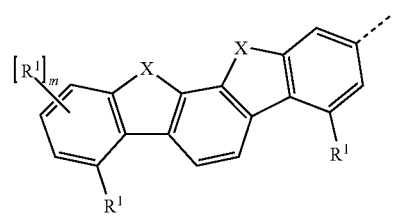
formula (21a)
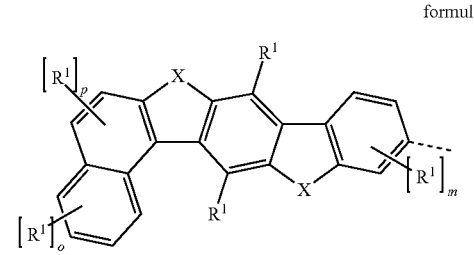
formula (22a)
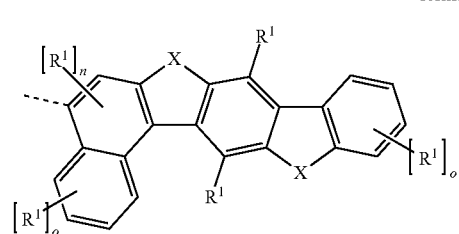
formula (23a)
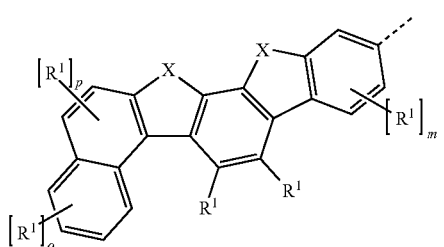
formula (24a)
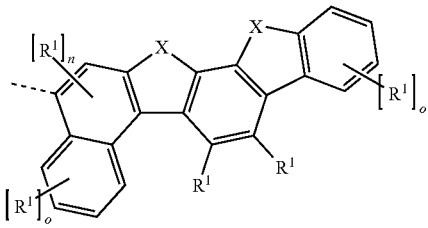
formula (25a)
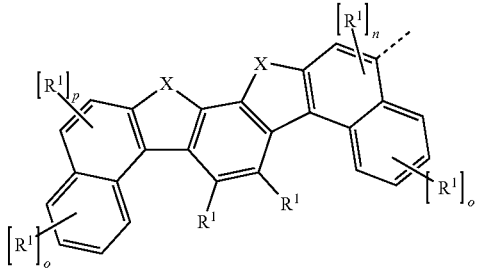
formula (26a)
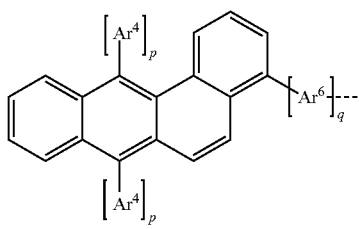
formula (27a)
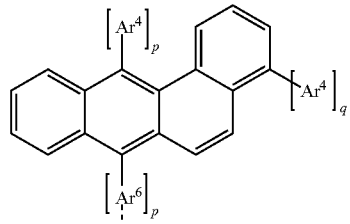
formula (27b)
formula (27c)
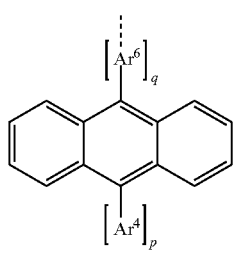

-continued

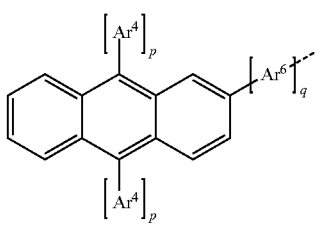

formula (27d)

wherein
R[1] is on each occurrence, identically or differently, H, D, F, Cl, Br, I, CHO, N(R[3])$_2$, N(Ar[1])$_2$, B(Ar[1])$_2$, C(=O)Ar[1], P(=O)(Ar[1])$_2$, S(=O)Ar[1], S(=O)$_2$Ar[1], CR[3]=CR[3]Ar[1], CN, NO$_2$, Si(R[3])$_3$, B(OR[3])$_2$, B(R[3])$_2$, B(N(R[3])$_2$)$_2$, OSO$_2$R[3], a straight-chain alkyl, alkenyl, alkynyl, alkoxy or thioalkoxy group having 1 to 40 C atoms or a branched or cyclic alkyl, alkenyl, alkynyl, alkoxy or thioalkoxy group having 3 to 40 C atoms, each of which is optionally substituted by one or more radicals R[3], where one or more non-adjacent CH$_2$ groups is optionally replaced by R[3]C=CR[3], C≡C, Si(R[3])$_2$, Ge(R[3])$_2$, Sn(R[3])$_2$, C=O, C=S, C=Se, C=NR[3], P(=O)(R[3]), SO, SO$_2$, NR[3], O, S or CONR[3] and where one or more H atoms is optionally replaced by D, F, Cl, Br, I, CN or NO$_2$, or an aromatic or heteroaromatic ring system having 5 to 60 aromatic ring atoms, which may in each case be substituted by one or more radicals R[3], or an aryloxy or heteroaryloxy group having 5 to 60 aromatic ring atoms, which is optionally substituted by one or more radicals R[3], or a combination of these systems; two or more adjacent substituents R[1] here optionally forms a mono- or polycyclic, aliphatic or aromatic ring system with one another;

Ar[1] is on each occurrence, identically or differently, an aromatic or heteroaromatic ring system having 5 to 30 aromatic ring atoms, which is optionally substituted by one or more radicals R[3]; two radicals Ar[1] here which are bonded to the same nitrogen, phosphorus or boron atom may also be linked to one another by a single bond or a bridge selected from B(R[3]), C(R[3])$_2$, Si(R[3])$_2$, C=O, C=NR[3], C=C(R[3])$_2$, O, S, S=O, SO$_2$, N(R[3]), P(R[3]) and P(=O)R[3];

R[3] is on each occurrence, identically or differently, H, D or an aliphatic, aromatic and/or heteroaromatic hydrocarbon radical having 1 to 20 C atoms, in which, in addition, H atoms is optionally replaced by D or F; two or more adjacent substituents R[3] here may also form a mono- or polycyclic, aliphatic or aromatic ring system with one another;

the dashed bond represents the link to the triazine unit,
m is on each occurrence, identically or differently, 0, 1, 2 or 3;
n is on each occurrence, identically or differently, 0, 1 or 2;
o is on each occurrence, identically or differently, 0, 1, 2, 3 or 4;
Ar[4] and Ar[6] are, identically or differently on each occurrence, an aryl or heteroaryl group having 5 to 18 aromatic ring atoms, which is optionally substituted by one or more radicals R[1];
p is, identically or differently on each occurrence, 0, 1 or 2; and
q is 1 or 2
X is identically or differently, from C(R[1])$_2$, N(R[1]), O and S, and the groups of the formulae (27a) to (27d) here is optionally substituted by one or more radicals R[1], and the index p in formulae (27a) to (27d) stands for 0 or 1;

Ar[3] is selected from the groups of the formulae (32a) to (39a):

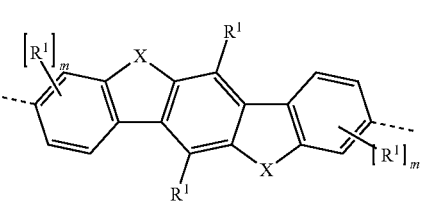

formula (32a)

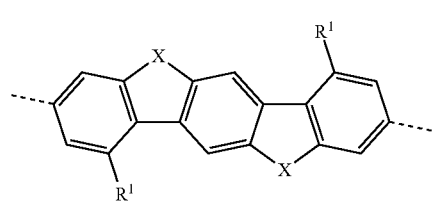

formula (33a)

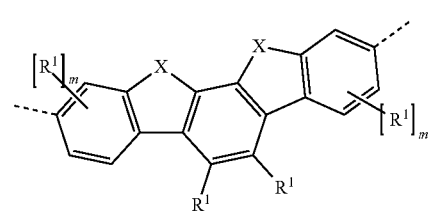

formula (34a)

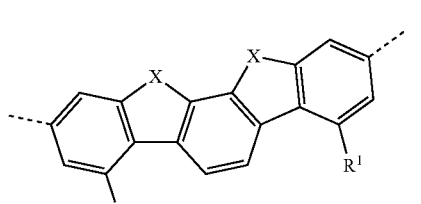

formula (35a)

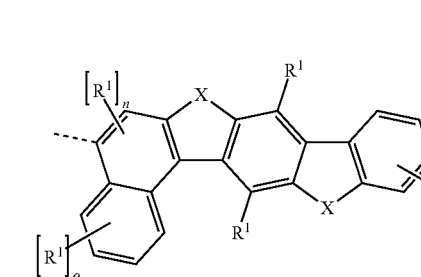

formula (36a)

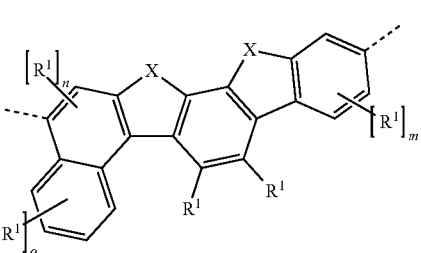

formula (37a)

-continued
formula (38a)
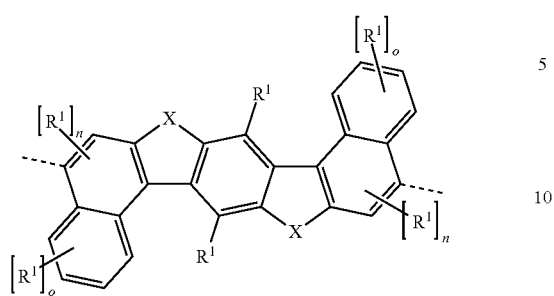
formula (39a)
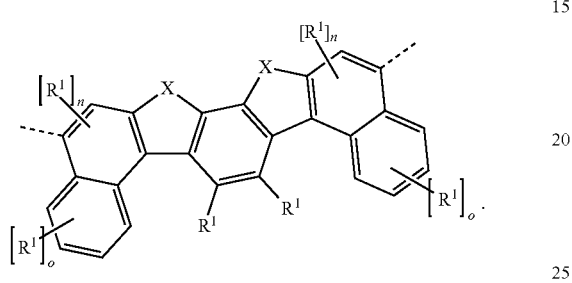
20. An organic electroluminescent device comprising one or more of the compounds according to claim 19.
* * * * *